(12) United States Patent
Lee et al.

(10) Patent No.: US 10,109,946 B2
(45) Date of Patent: Oct. 23, 2018

(54) SEALED CIRCUIT BOARD CONNECTORS AND ELECTRONIC DEVICE INCLUDING SAME

(71) Applicant: Samsung Electronics Co., Ltd., Gyeonggi-do (KR)

(72) Inventors: Yong-Seok Lee, Seoul (KR); Dae-Young Noh, Seoul (KR); Chan-Keun Song, Seoul (KR); Min-Sung Lee, Gyeonggi-do (KR); Min-Su Jung, Seoul (KR); Sung-Joo Cho, Gyeonggi-do (KR); Young-Sik Choi, Gyeonggi-do (KR); Jin-Young Park, Gyeonggi-do (KR); Min-Woo Yoo, Gyeonggi-do (KR); Byoung-Uk Yoon, Gyeonggi-do (KR); Jong-Chul Choi, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/608,044

(22) Filed: May 30, 2017

(65) Prior Publication Data
US 2017/0373431 A1     Dec. 28, 2017

(30) Foreign Application Priority Data
Jun. 22, 2016   (KR) ..................... 10-2016-0078244

(51) Int. Cl.
*H01R 13/52*     (2006.01)
*H01R 12/71*     (2011.01)
(Continued)

(52) U.S. Cl.
CPC ....... *H01R 13/5205* (2013.01); *H01R 12/585* (2013.01); *H01R 12/716* (2013.01);
(Continued)

(58) Field of Classification Search
CPC .............. H01R 23/725; H01R 13/5219; H01R 13/5221; H01R 13/52; H01R 13/5205;
(Continued)

(56) References Cited

U.S. PATENT DOCUMENTS

| | | | |
|---|---|---|---|
| 5,007,841 A * | 4/1991 | Smolley | G01R 1/07307 257/E23.172 |
| 5,806,181 A * | 9/1998 | Khandros | H01R 43/16 29/840 |

(Continued)

FOREIGN PATENT DOCUMENTS

KR          10-1590329 B1      2/2016

*Primary Examiner* — Gary Paumen
(74) *Attorney, Agent, or Firm* — Cha & Reiter, LLC

(57) ABSTRACT

An apparatus according to one embodiment of the present disclosure comprises a first circuit board; a first connector provided on one face of the first circuit board; a second circuit board disposed on the one face of the first circuit board, and electrically connected to the first circuit board; a second connector provided on one face of the second circuit board, and engaged with the first connector to electrically connect the second circuit board to the first circuit board; a sealing member disposed between the first circuit board and the second circuit board to seal a space between the first connector and the second connector; and a coupling member coupling the first circuit board and the second circuit board to each other.

25 Claims, 46 Drawing Sheets

(51) Int. Cl.
   *H01R 13/73*   (2006.01)
   *H01R 12/58*   (2011.01)
   *H05K 1/11*    (2006.01)
   *H05K 1/14*    (2006.01)
   *H05K 5/00*    (2006.01)

(52) U.S. Cl.
   CPC ....... *H01R 13/521* (2013.01); *H01R 13/5219* (2013.01); *H01R 13/73* (2013.01); *H05K 1/11* (2013.01); *H05K 1/14* (2013.01); *H05K 5/0095* (2013.01)

(58) Field of Classification Search
   CPC . H01R 13/5202; H01R 13/5227; H01R 9/096
   USPC ................... 439/591, 74, 271–276, 190, 205
   See application file for complete search history.

(56) References Cited

U.S. PATENT DOCUMENTS

| | | | | |
|---|---|---|---|---|
| 6,280,202 B1* | 8/2001 | Alden, 3rd | ............. | H05K 7/142 174/138 D |
| 6,431,879 B2* | 8/2002 | Brekosky | ............... | H05K 7/142 361/804 |
| 7,101,196 B1* | 9/2006 | McClelland | ....... | H01R 13/5213 439/521 |
| 7,654,829 B1* | 2/2010 | Chuang | ................. | H01R 12/79 439/67 |
| 7,686,644 B2* | 3/2010 | Chu | ................... | H01R 13/2442 439/271 |
| 8,821,177 B2* | 9/2014 | Kubo | ................. | H01R 13/5219 439/271 |
| 2002/0196615 A1* | 12/2002 | MacDonald, Jr. | ........ | G06F 1/18 361/803 |
| 2004/0082211 A1* | 4/2004 | Hsieh | ..................... | H01R 13/03 439/329 |
| 2009/0142944 A1* | 6/2009 | Zhu | ........................ | H01R 27/00 439/79 |
| 2011/0312213 A1* | 12/2011 | Arai | ....................... | H01R 12/62 439/492 |
| 2013/0210254 A1* | 8/2013 | Xie | .................... | H01R 12/7088 439/271 |
| 2014/0148030 A1 | 5/2014 | Makimura | | |
| 2015/0044887 A1* | 2/2015 | Tateishi | ............. | H01R 12/7017 439/65 |
| 2015/0194753 A1 | 7/2015 | Raff et al. | | |
| 2015/0270631 A1* | 9/2015 | Katano | ................ | H01R 12/774 439/329 |
| 2015/0295362 A1* | 10/2015 | Tzviskos | .......... | H01R 13/6581 439/607.01 |
| 2016/0064844 A1* | 3/2016 | Chen | ..................... | H01R 12/88 439/660 |
| 2016/0204532 A1* | 7/2016 | Ishida | .................... | H05K 1/117 439/61 |

* cited by examiner

SEALED CIRCUIT BOARD CONNECTORS AND ELECTRONIC DEVICE INCLUDING SAME

CLAIM OF PRIORITY

This application claims the priority under 35 U.S.C. § 119(a) to Korean Application Serial No. 10-2016-0078244, which was filed in the Korean Intellectual Property Office on Jun. 22, 2016, the entire content of which is hereby incorporated by reference.

TECHNICAL FIELD

Various embodiments of the present disclosure relate to sealing a gap between connectors when the connectors are connected to each other in an electronic device.

BACKGROUND

An electronic device may include various modules, and a plurality of circuit boards on which the modules are mounted may be disposed inside the electronic device. In addition, the plurality of circuit boards may be provided in such a manner that a main circuit board and sub circuit boards electrically connected to the main circuit board are electrically connected to each other, and the plurality of circuit boards on which the modules are mounted may be electrically connected to each other.

SUMMARY

Thus, an apparatus that includes electrically connecting circuit boards with a connector, such that a connector (also referred to as a "female connector" or "male connector") provided on one circuit board and another connector (also referred to as a "male connector" or "female connector") electrically connected to the another circuit board are electrically coupled to each other.

As described above, a connector, which electrically connects one circuit board to another circuit, does not require, and can be provided without a waterproofing member or a foreign matter inflow prevention member, or a sponge is attached between a connector stiffener and a circuit board so as to prevent or delay the inflow of foreign matter or water.

However, as described above, since a connectors, which electrically connect one circuit board to another circuit, do not require and might not be separately provided with a foreign matter inflow prevention member or are provided with a member having a limitation on the inflow of foreign matter, such as a sponge, a sealing function cannot be properly achieved, so that foreign matter may be introduced through a gap between the connectors or the infiltration may be somewhat delayed. Furthermore, in some cases, due to the inflow of dust or water, a failure may be caused in the electrical connection state, and in the condition of water immersion, water may be introduced into a gap between the connectors so that the electronic device may be electrically damaged to be unusable.

In addition, lifting may occur between the connectors due to a member, such as a sponge, provided between the connectors, which may cause a failure in fastening.

Accordingly, the present disclosure discloses electrically connecting one circuit board to another circuit board, in which the connectors is sealed in such a manner that foreign matter, such as dust and moisture, cannot be introduced into the connectors. For example, the present disclosure is to provide an apparatus that is capable of preventing or delaying the inflow of water into the connectors when an ordinary electronic device is immersed into water to cause the inflow of water, or is capable of preventing secondary water inflow from occurring in the connector when an electronic device having a waterproof function is immersed into water. Further, the present disclosure is to provide an electronic device including such the apparatus.

An apparatus according to one embodiment of the present disclosure comprises a first circuit board; a first connector provided on one face of the first circuit board; a second circuit board disposed on the one face of the first circuit board, and electrically connected to the first circuit board; a second connector provided on one face of the second circuit board, and engaged with the first connector to electrically connect the second circuit board to the first circuit board; a sealing member disposed between the first circuit board and the second circuit board to seal a space between the first connector and the second connector; and a coupling member coupling the first circuit board and the second circuit board to each other.

In addition an electronic device according to various embodiments of the present disclosure comprises a housing; at least one first circuit board mounted inside the housing; a second circuit board mounted inside the housing, disposed on one face of the first circuit board, and electrically connected to the first circuit board; a first connector provided on the one face of the first circuit board, a second connector provided on one face of the second circuit board, and engaged with the first connector to electrically connect the second circuit board to the first circuit board; a sealing member disposed between the first circuit board and the second circuit board to seal a space around the first connector and the second connector; and a coupling member coupling the first circuit board and the second circuit board to each other.

A apparatus according to various embodiments of the present disclosure includes a structure having both a sealing member and a fastening member between connectors that electrically connect two different circuit boards. Thus, it is possible to provide sealing between connectors, to prevent lifting between the connectors, and to ensure reliability in electrical coupling.

In addition to the sealing member and the fastening member provided to the apparatus, a guide opening is formed around the periphery of a circuit board on which the connectors are mounted, so that water is first introduced into the guide opening before the water is introduced into the connector as the electronic device is immersed in water. Thus, it is possible to suppress the water introduced into the inside of the electronic device from being immediately introduced into the apparatus and electronic device that includes the apparatus.

BRIEF DESCRIPTION OF THE DRAWINGS

The above and other aspects, features, and advantages of the present disclosure will be more apparent from the following detailed description taken in conjunction with the accompanying drawings. It shall be understood that reference to a first embodiment and a second embodiment is not intended as a statement of preference or relative advantage, but merely to distinguish one embodiment from another.

DETAILED DESCRIPTION

Figure 1A:
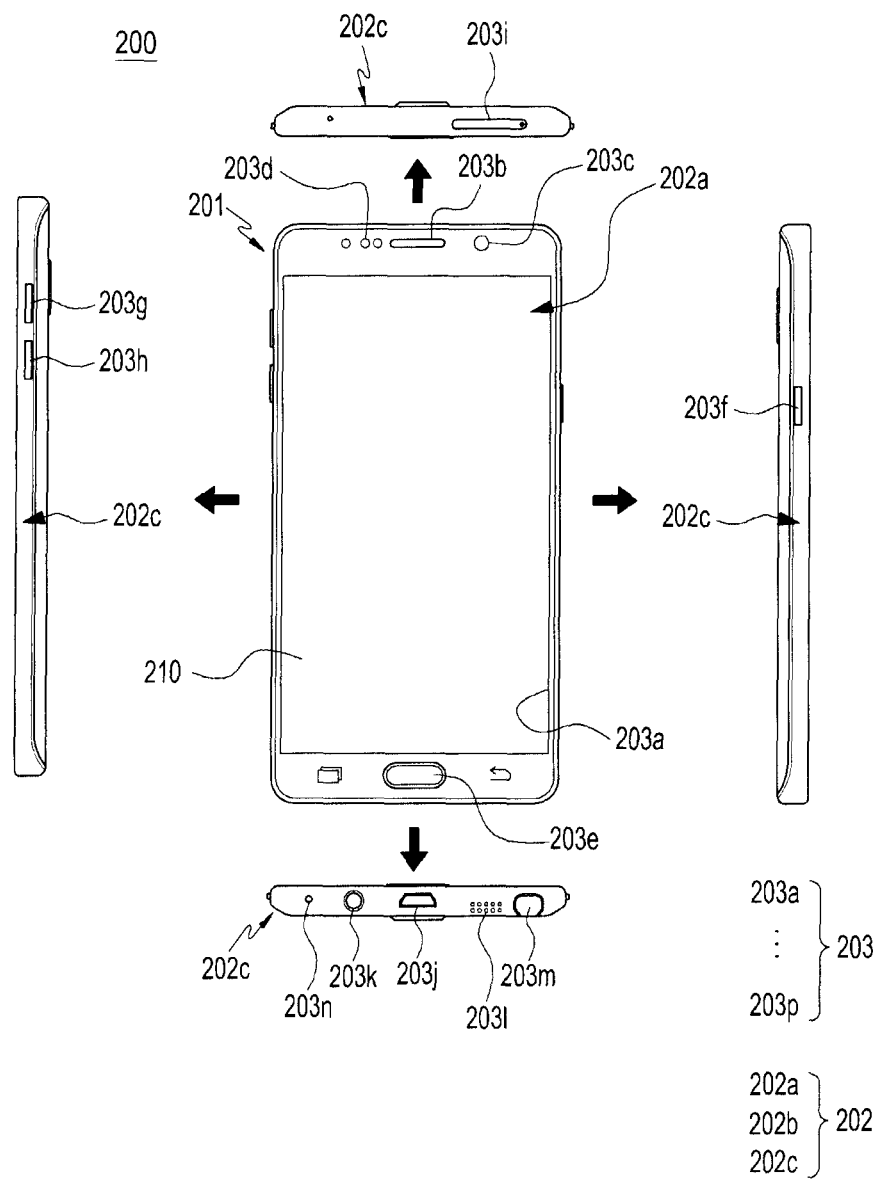
FIG. 1A is a view schematically illustrating a front face and four side faces of an electronic device according to various embodiments of the present disclosure.

Hereinafter, various embodiments of the present disclosure will be described with reference to the accompanying drawings. However, it should be understood that following description does not limit the present disclosure to the particular forms disclosed herein; rather, the present disclosure should be construed to cover various modifications, equivalents, and/or alternatives of embodiments of the present disclosure. In the description of the drawings, similar reference numerals may be used to designate similar elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure. Moreover, no temporal relationship should be inferred.

It should be understood that when an element (e.g., first element) is referred to as being (operatively or communicatively) "connected," or "coupled," to another element (e.g., second element), it may be directly connected or coupled directly to the other element or any other element (e.g., third element) that may be interposed between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™, a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may include a new electronic device according to the development of technology.

Figure 1B:
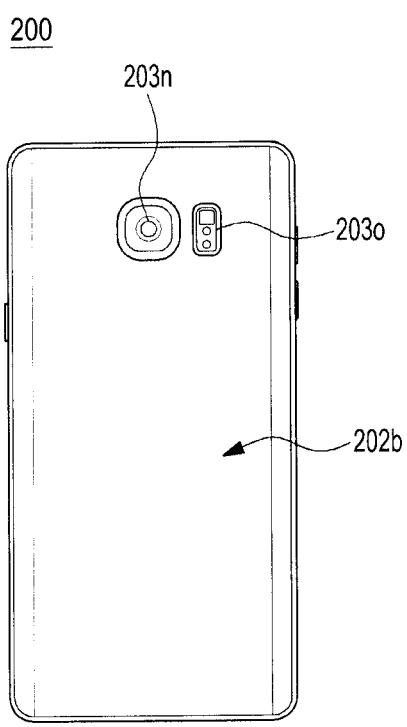
FIG. 1B is a view illustrating the rear face of the electronic device according to various embodiments of the present disclosure.
Figure 1C:
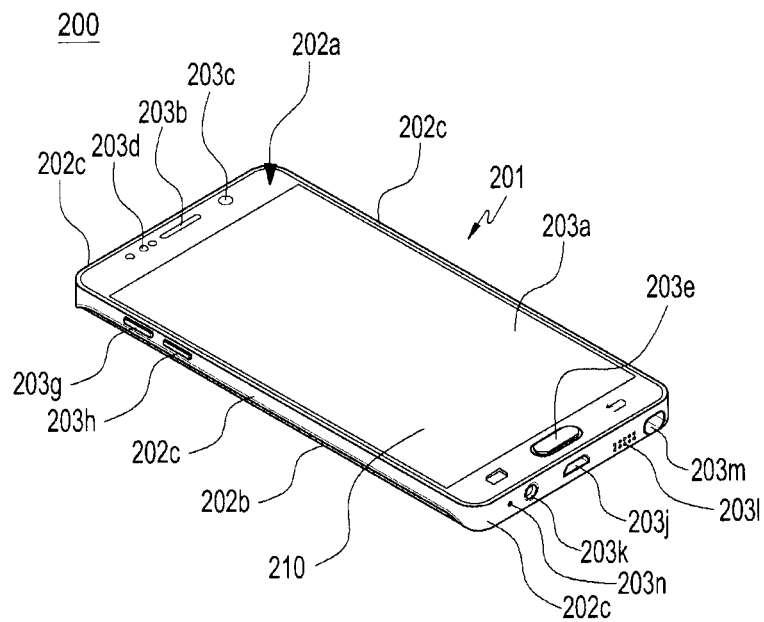
FIG. 1C is a perspective view illustrating the electronic device according to various embodiments of the present disclosure.
Figure 1D:
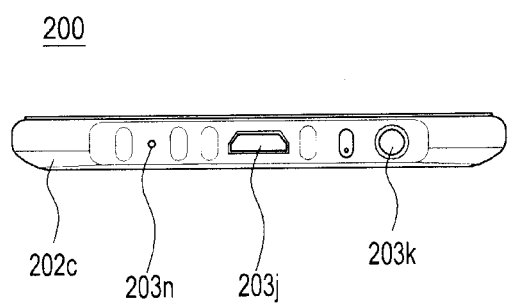
FIG. 1D is a view illustrating a configuration disposed on at least one side face of the electronic device according to various embodiments of the present disclosure.

FIG. 1A is a view schematically illustrating a front face and four side faces 202c of an electronic device 200 according to various embodiments of the present disclosure. FIG. 1B is a view illustrating the rear face of the electronic device 200 according to various embodiments of the present disclosure. FIG. 1C is a perspective view illustrating the electronic device 200 according to various embodiments of the present disclosure. FIG. 1D is a view illustrating a configuration that is provided on at least one side face 202c of the electronic device 200 according to various embodiments of the present disclosure.

Referring to FIGS. 1A to 1D, the electronic device 200 according to an embodiment includes a housing 201, a display 210, various types of input devices 203e, 203f, 203g, 203h, and 203m, a channel portion, a module, antenna modules 270 and 280, and a lamination member portion 10.

Figure 2:
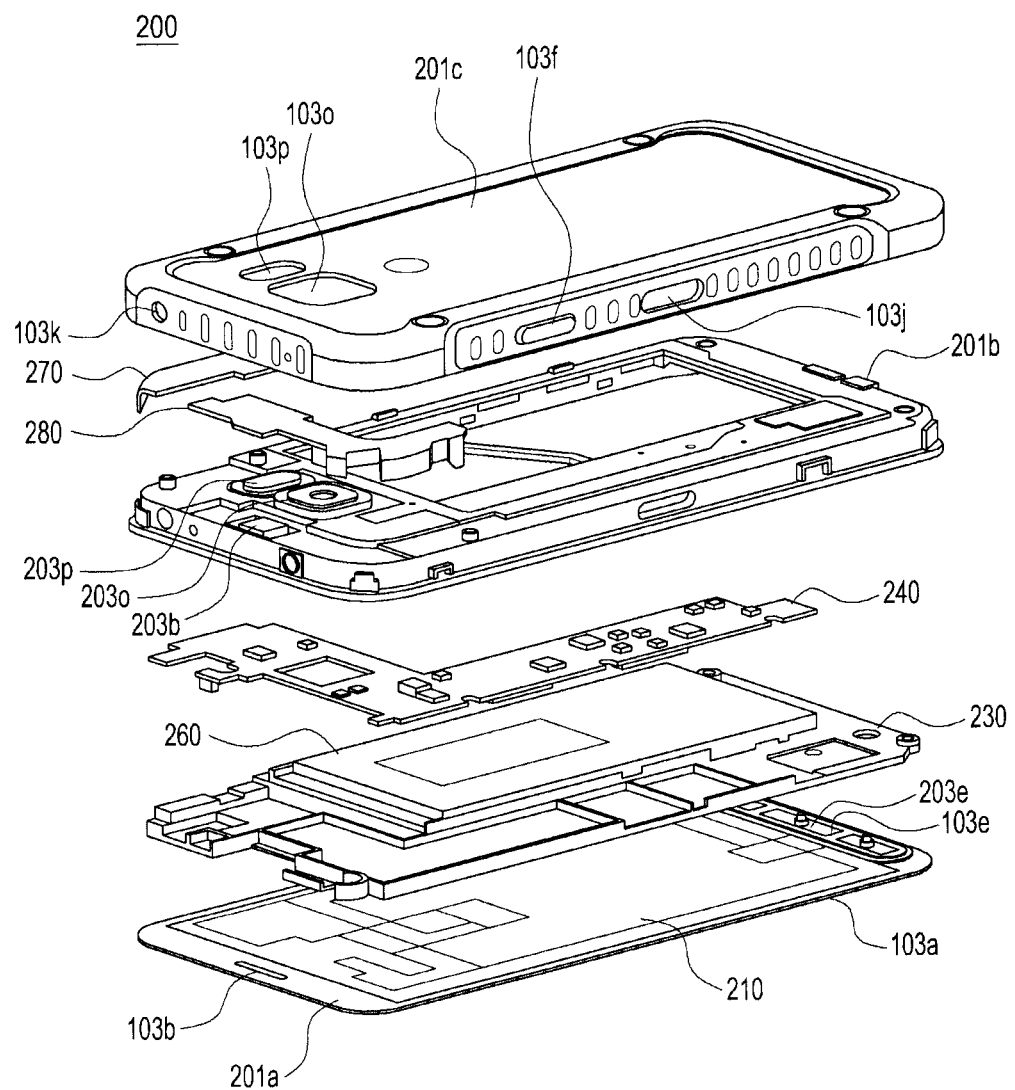
FIG. 2 is a schematic exploded perspective view illustrating the electronic device according to various embodiments of the present disclosure.

The housing 201 according to an embodiment may include outer housing members 201a and 201c and an inner housing member 201b, as will be shown in greater detail in FIG. 2. In some cases, in the housing 201, the outer housing members 201a and 201c and the inner housing member 201b may be integrally formed as a single member. Alternatively, the outer housing members 201a and 201c and the inner housing member 201b may be configured to be separably assembled to each other.

The outer housing member 201c (hereinafter, referred to as a "housing") may include a first face 202a, a second face 202b, and side faces 202c. In addition, the inner housing member 201b is mounted inside the outer housing member 201c to support a circuit board or modules disposed therein. The first face 202a of the outer housing member 201a or 201c is a face 201a facing in a first direction in the electronic device 200 and the second face 202b is a face 201c facing in a second direction opposite to the first direction in the electronic device 200. The side faces 202c may be provided to surround at least a portion of a space between the first face 202a and the second face 202b.

According to an embodiment, a display 210 may be provided on at least one of the first face 202a and the second face 202b of the outer housing member 201c. That is, the display 210 may be disposed on one face of the outer housing member 201a, e.g., the first face. The display 210 may be disposed over the first face of the outer housing member 201a, or only in a portion of the first face. In addition, on the opposite side to the face where the display is mounted, an outer housing member 201a or 201c may be provided above the and below inner housing member 201b, forming a space for mounting a battery that supplies power to the electronic device 200, covering the battery. Inside the first face 202a, the second face 202b and the side faces 202c of the outer housing member 201c, specifically, within the inner housing member 201b, various modules (e.g., a camera device 203c, a speaker device 203l, a light emitting device 203d, input devices 203e, 203f, 203g, 203h, and 203m) may be disposed, a connector may be provided so as to connect the electronic device 200 to an external device, and antenna modules 270 and 280, a battery, and the like may also be disposed inside the inner housing member 201b.

According to an exemplary embodiment of the present disclosure, the display 210 may be mounted on the front face of the outer housing member 201c. The display 210 may be provided to implement an input function according to a contact or proximity of an object, and may display an image according to a user environment. The display 210 may be configured by laminating, on a window glass as the outermost layer, a touch panel and a display panel that displays a screen on one side of the touch panel. In an embodiment of the present disclosure, the display 210 is described as being provided on the first face 202a of the outer housing member 201c, as an example. However, the display 210 may be variously changed or modified depending on the setting to the electronic device 200. For example, the display 210 may be provided on the second face 202b of the outer housing member 201c, or provided on each of the first face 202a and the second face 202b of the outer housing member 201c.

The display 210, which forms the first face of the outer housing member 201a or 201c or is disposed on the first face of the outer housings 201a or 201c, a touch panel, a display unit, or the like, may have a structure in which a touch panel and a display unit are laminated, and may enable inputting using an object having a charge, such as a hand, or a module, such as a digitizer pen or a stylus pen, or may display an output according to the inputting. According to various embodiments of the present disclosure, the display 210 may receive a continuous movement of one contact among one or more contacts as an input. In various embodiments of the present disclosure, the term "contact" is not limited to a direct contact of a user's body or a module, such a stylus pen, on the display 210 or an input device that implements a touch-type input, and may include a "non-contact" action (e.g., proximity). In addition, a detectable interval in the display 210 may vary depending on the performance or structure of the electronic device 200.

Figure 3:
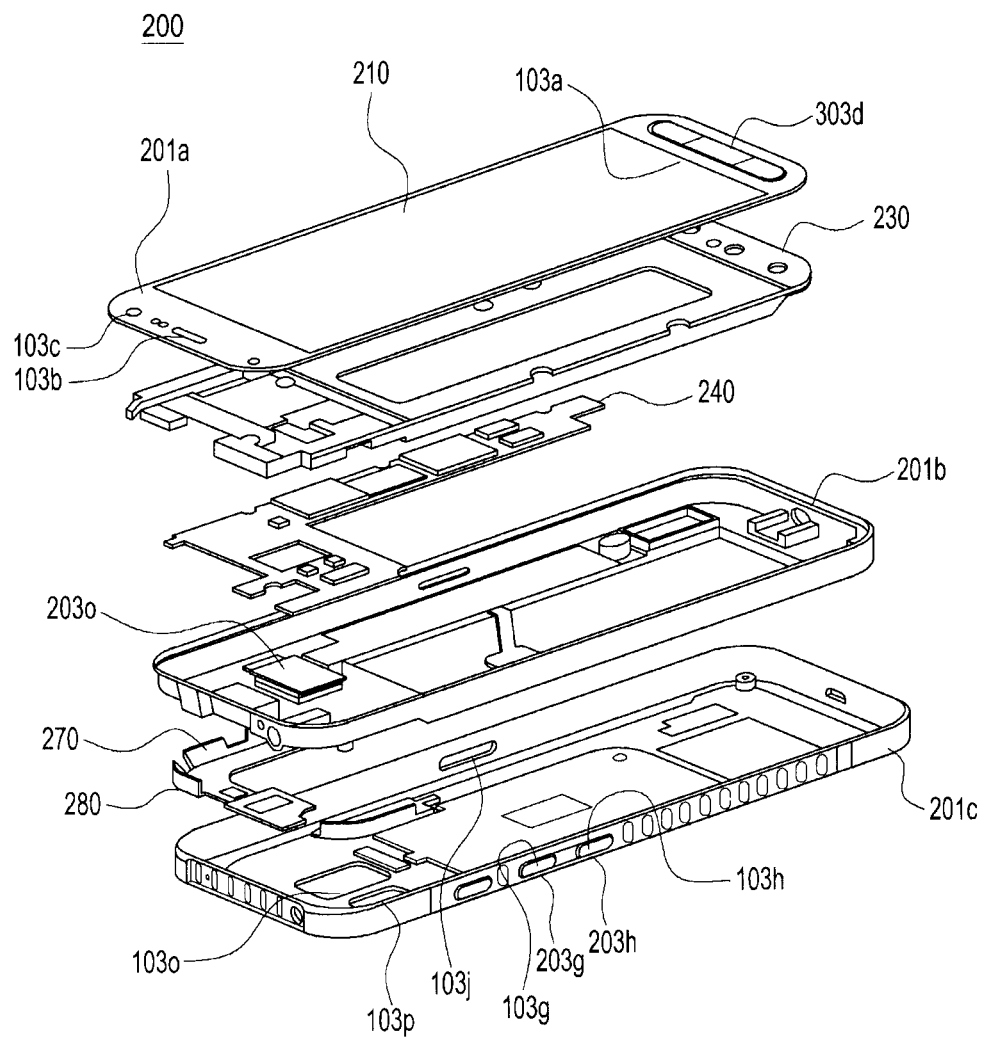
FIG. 3 is a schematic exploded perspective view illustrating the electronic device according to various embodiments of the present disclosure, which is viewed in another direction.

FIG. 2 is a schematic exploded perspective view illustrating the electronic device 200 according to various embodiments of the present disclosure. FIG. 3 is a schematic exploded perspective view illustrating the electronic device 200 according to various embodiments of the present disclosure, viewed in the opposite direction.

Referring to FIGS. 2 and 3, various modules may be mounted inside the electronic device 200 (e.g., the inner housing member 201b) according to an embodiment. For example, a bracket 230 for the display 210 may be mounted, and a circuit board 240 may be mounted. At least one of various types of antenna modules 270 and 280 for transmission and reception of the electronic device 200 may be mounted.

Further, modules (e.g., a camera, a speaker device 203l, a microphone device 203n, physical buttons 203e, 203f, 203g, 203h, a service light 203d, an ear jack device 203k, a connection device 203j, and an input member 203m, such as a stylus pen) may be mounted inside the housing 201 to be exposed to the outside of the housing 201. The modules may be mounted inside the housing 201, and provided to be exposed to the outside of the housing 201 or connected to the outside.

The modules according to an embodiment may include at least one of an acoustic device 203b, 203n, or 203l for acoustic communication, a camera device 203c, a connection device 203j to facilitate connection to an external device, button devices 203e, 203f, 203g, or 203h, and a light emitting device 203d that emits light.

According to an embodiment, openings 103 (103a-103p) may be formed on the first face 202a, the second face 202b, or the side surfaces 202c of the outer housing member 201c so as to allow modules disposed inside the inner housing member 201b or between the inner housing member 201b and the outer housing member 201c to be recognized from the outside or to be exposed to the outside (see FIGS. 1A to 1D). The openings 103 (103a-103p) may be formed on at least one of the first face 202a, the second face 202b, and the side face 202c of the outer housing member 201c to correspond to the positions of the modules. The openings 103 (103a-103p) may be provided with a separate cover to cover the openings 103 (103a-103p) or the modules exposed through the openings 103 (103a-103p).

For example, when the display 210 is provided on the first face 202a of the outer housing member 201c, the front camera device 203c, the service light 203d, the speaker device 203l, a microphone device 203n, and a main button device 203e may be provided on the front face of the display unit 210. For this purpose, the first face 202a of the outer housing member 201c may be provided with a openings 103c that can expose a front camera (corresponding to the camera device 203c) and an opening 103d that can expose the service light 203d (corresponding to the light emitting device 203d). Various openings 103 (103a-103p) that can expose a speaker device 203l (corresponding to the acoustic devices 203b, 203n, and 203l) an opening 103 (103a-103p) that can expose a microphone device 203n (corresponding to the acoustic device 203b, 203n, and 203l), an opening 103 (103a-103p) that can expose a main button (corresponding to an input member)) may be formed in the outer housing member 201c.

In addition, a rear camera device 203n, a light device 203o, and an additional button unit (not illustrated) may be provided on the second face 202b of the outer housing member 201c. For this purpose, the second face 202b of the outer housing member 201c may be formed with an opening 103o that can expose the rear camera (corresponding to the camera device 203c), an opening 103p that can expose a light (corresponding to the light emitting device 203d), and an opening that can expose the additional button unit (not illustrated).

In addition, the side faces 202c of the outer housing member 201c may be provided with: a power button device 203f; up/down button devices 203g and 203h; a connection device 203i to be connected to an external input terminal; an ear jack device 203k to be connected to a jack, such as an earphone; and an input member 203m, such as a stylus fan. For this purpose, the side surface 202c of the outer housing member 201c may be formed with an opening 103f in which the power button device 203f is provided, openings 103g and 103h in which the up/down devices 203g and 203h (corresponding to the input devices 203e, 203f, 203g, 203h, 203m) are mounted, an opening 103j for the connection device 203j, an opening 103k for the ear jack device 203k, an opening 103 for mounting and dismounting the input member 203m, and openings 103 (103a-103p) for interconnecting the inside and the outside of the outer housing 103c.

Figure 4:
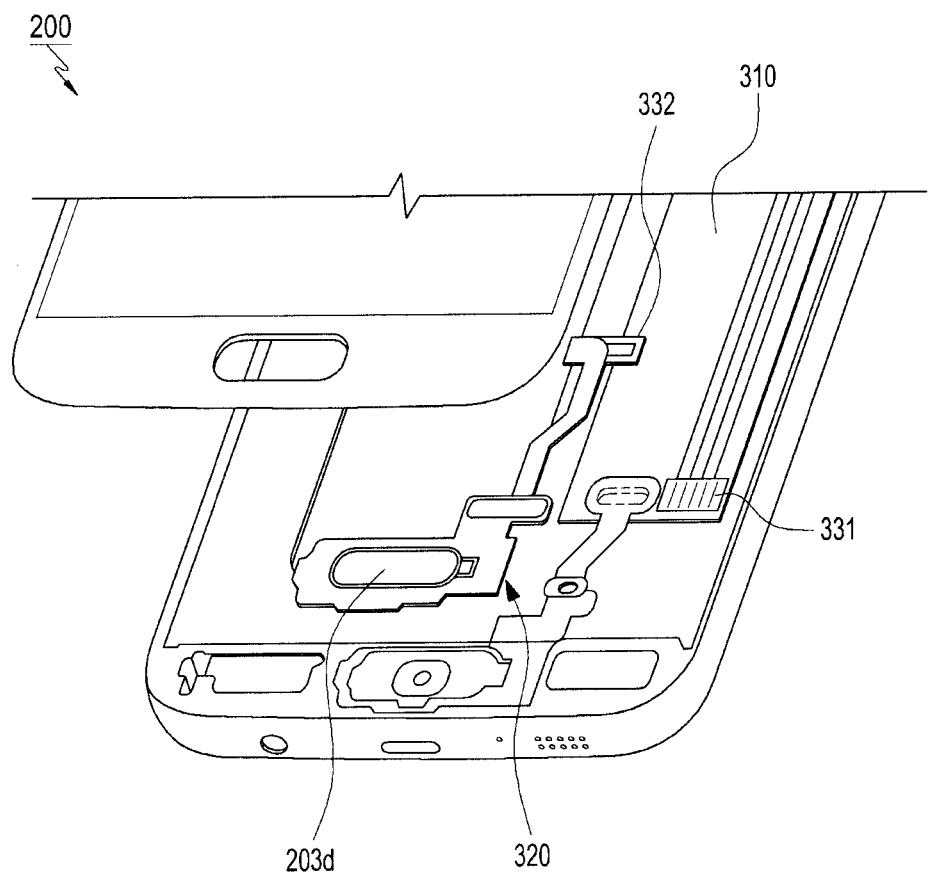
FIG. 4 is a perspective view illustrating an apparatus with a module and an internal circuit board connected to each other in the electronic device according to various embodiments of the present disclosure.
Figure 5:
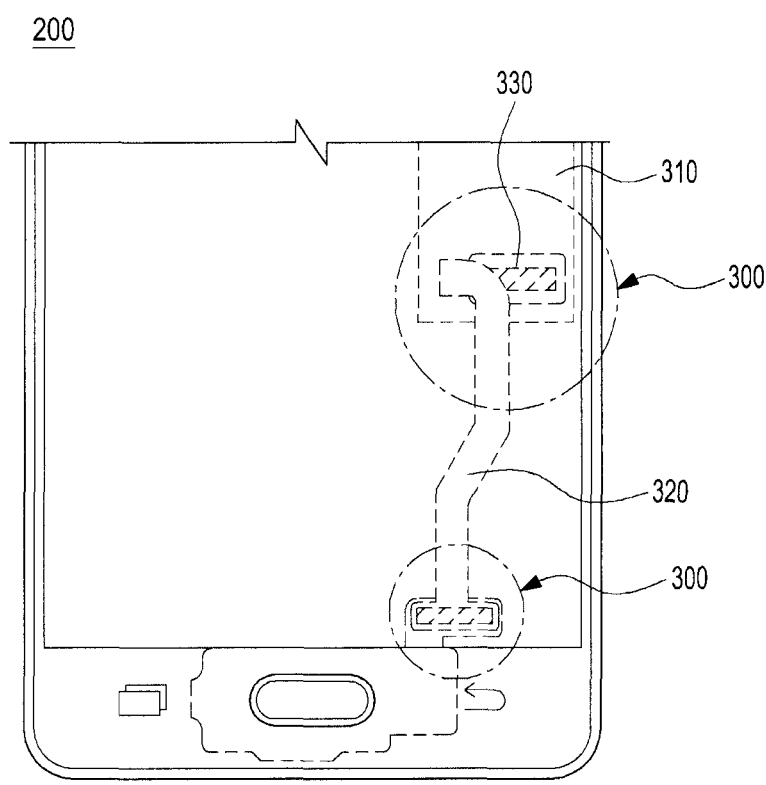
FIG. 5 is a perspective view illustrating an apparatus including a module and an internal circuit board connected to each other in the electronic device according to various embodiments of the present disclosure.

FIG. 4 is a perspective view illustrating an apparatus 300 wherein a module is connected to an internal circuit board in the electronic device 200 according to various embodiments of the present disclosure. FIG. 5 is a perspective view illustrating the apparatus 300 wherein the module is connected to the internal circuit board in the electronic device 200 according to various embodiments of the present disclosure.

Referring to FIGS. 4 and 5, the electronic device 200 of the present disclosure may be provided with various modules described above. Hereinafter, descriptions may be made with reference to a case in which a button 203d, which is one of the various modules provided in the electronic device 200, is connected to a circuit board (which may correspond to the circuit board 240 of FIG. 2 or FIG. 3), as an example. In the various embodiments of the present disclosure, for example, the button 203d is provided as just one example of a component that can be electrically connected to a circuit board However, a wide variety of modules or components (including, but not limited to any of the aforementioned input devices or modules) can be can be electrically connected to the circuit board. In addition, according to various embodiments of the present disclosure, the apparatus 300 can comprise two different boards electrically connected to each other within an electronic device, and the shape, structure, or type thereof and are not limited to the depictions herein and can be changed or modified in a wide variety of ways.

As described above with reference to FIGS. 1 to 3, the electronic device 200 may be equipped with modules for providing various functions. For example, the electronic device 200 may be provided with various modules (e.g., the battery, the antenna modules 270 and 280, the camera device 203c, the speaker device 203l, the light emitting device 203d, the input devices 203e, 203f, 203g, 203h, and 203m, and a connector that is capable of connecting the electronic device 200 to an external device), as well as the display that includes a display panel or a touch panel.

In addition, the electronic device 200 may include one or more circuit boards 310 and 320 (which may include the circuit board 240 in FIGS. 2 and 3) therein, and the above-mentioned modules may be electrically connected to the circuit boards 310 and 320. For example, circuit board first circuit board 310 may be inside the housing 201 and a second circuit board 320 electrically connected to the first circuit board 310. In various embodiments of the present disclosure, the first circuit board 310 may be described as a main circuit board (which may correspond to the circuit board 240 in FIGS. 2 and 3) as an example, and the second circuit board 320 may be described as a connection board for connecting the above-mentioned modules to the main circuit board as an example.

The modules may be provided to be electrically connected to the main circuit board provided inside the housing 201 to receive power or to execute a particular function. In one embodiment, a module can be connected to the main circuit board, and the embodiment may have various connection structures, such as a structure in which the module is directly mounted on the main circuit board 310, a structure in which the module and the main circuit board 310 are connected through a connection board 320, wherein the connection board 320 is a flexible circuit board, and a structure in which a circuit board 310 (hereinafter, referred to as a "sub circuit board") having the module mounted thereon and the sub circuit board and the main circuit board are connected to each other directly or via a connection board (e.g., a flexible circuit board). In various embodiments of the present disclosure, descriptions may be made with reference to a configuration in which a module (i.e., a main button 203d) is connected to the main circuit board via a connection board, as an example. However, the configuration is merely an example for describing an electric connection between circuit boards, and may be changed or modified in a variety of ways. A configuration for connecting circuit boards to each other may be modified or changed in a variety of ways. For example, the electronic device 200 may be provided with a plurality of main circuit boards such that the main circuit boards can be electrically connected to each other. Alternatively, different modules may be provided to be connected to each other through respective flexible circuit boards.

A connector 330 may be provided to electrically connect two different circuit boards provided in the electronic device 200. According to various embodiments of the present disclosure, the connector 330 is a component provided to electrically interconnect circuit boards. For example, the connector 330 may be provided to electrically connect a hard circuit board to another hard circuit board, to electrically connect a hard circuit board to a flexible circuit board, or to electrically connect a flexible circuit board and another flexible circuit board. A connector 330 can include, but is not limited to, a plug (male connector), and socket (female connector). According to various embodiments of the present disclosure, the connector 330 is a component provided to electrically connect circuit boards. In various embodiments, the connector 330 may be described with reference to a case in which the connector 330 is provided to electrically interconnect a first circuit board 310 of a hard main circuit board and a second circuit board 320 of a flexible connection board of a module, as an example.

The connector 330 may include a first connector 331 and a second connector 332, and the second connector 332 may be coupled to the first connector 331 to be electrically connected thereto. The first connector 331 may be provided on one face of the first circuit board 310 (the face of the first circuit board 310, which faces the second circuit board 320), and the second connector 332 may be provided on one face of the second circuit board 320, which faces the first circuit board 310. For example, the first connector 331 may be mounted on one face of the main circuit board at a position adjacent to the button 203d. In addition, the second connector 332 may be provided on one face of a flexible connection board extending from the main button 203d to the main circuit board side.

The first connector 331 and the second connector 332 may be provided as a pair of a female connector and a male connector that are coupled to each other so that the first connector 331 and the second connector 332 can be engaged with and electrically connected to each other. For example, when the first connector 331 is provided as a female connector, the second connector 332 may be provided as a male connector to be coupled to the female connector. Alternatively, when the first connector 331 is provided as a male connector, the second connector 332 may be provided as a female connector to be coupled to the male connector.

When the male connector is inserted into the female connector, a plurality of terminals formed in the male connector are connected and electrically coupled to a plurality of terminals formed on the female connector. As the female connector is configured to be connected to the male connector while enclosing the male connector, the outer peripheral surface of the female connector can be provided to be larger than the outer peripheral surface of the female connector.

Thus, a sealing member to be described below may be provided to seal between the first circuit board 310 and the second circuit board 320 along the connector 330 while enclosing the outer peripheral surface of the male connector.

As will be described below, between the first circuit board 310 and the second circuit board 320 with reference to the connector 330 as a center, a sealing member 340 and a coupling member 350 may be provided so as to maintain the coupled state of the first connector 331 and the second connector 332 while sealing a gap between the first connector 331 and the second connector 332. The second circuit board 320 is superposed on a predetermined position of the first circuit board 310 so that the first connector 331 and the second connector 332 are engaged with each other. The sealing member 340 may be disposed around the connector 330 so as to seal a gap between the first and second connectors 331 and 332.

In addition, lifting may occur in the coupling between the first connector 331 and the second connector 332 by the sealing member 340, which may cause an error in the connector 330. The coupling member 350 may be provided to press and couple the first connector 331 and the second connector 332 to each other so that the second circuit board 320 can be brought into closed contact with the first circuit board 310.

In addition, when at least one of the first circuit board 310 and the second circuit board 320 is provided as a flexible board, the main circuit board may be provided as a hard board, and a connection board connecting the main button 203d to the main circuit board may be provided as a flexible board, for example, as in the various embodiments of the present disclosure. The first connector 331 may be mounted on a hard main circuit board to maintain its mounted state, but the connection board on which the second connector 332 is provided may be a flexible circuit board. Thus, a stiffener 360 supporting the second connector 332 mounted on the second circuit board 320. For example, the second connector 332 may be mounted on one face of the second circuit board 320, and a stiffener may be mounted on the other face of the second circuit board 320, that is, on the opposite face to the face where the second connector 332 is mounted, in order to reinforce the rigidity of the connection board.

In various embodiments of the present disclosure the second circuit board 320 is a flexible board. A reinforcing member 360 is provided on the other face of the second circuit board 320 from the second connector 332. However, various changes or modifications may be made. For example, when the second circuit board 320 is made of a hard material, the reinforcing member 360 may not be provided, and when both the first circuit board 310 and the second circuit board 320 are provided as flexible boards, the reinforcing member 360 may be provided on each of the first circuit board 310 and the second circuit board 320.

In addition, a coupling member may be provided to maintain the engaged state of the first circuit board and the second circuit board. The structure and configuration of the coupling member is described in detail in the following description.

In certain embodiments, the structure of the coupling member of the present disclosure may have two types of structures, as an example. One type is that the coupling member is provided separately from the connector so as to couple the first circuit board and the second circuit board to each other, and the other type is a structure in which the coupling member is provided as a single body with the connector so as to couple the first circuit board and the second circuit board to each other. However, the coupling member is not limited to such a structure, and may be changed or modified in a variety of ways. For example, a double-sided tape or silicon having a thickness of a space between the first circuit board and the second circuit board may be provided around the sealing member to couple the first circuit board and the second circuit board to each other.

As will be described below, when the coupling member is provided separately from the connector, the coupling member may include a coupling protrusion formed with a coupling opening, a coupling hole, and a fastening member. The coupling protrusion may be provided on one of the first circuit board and the second circuit board, the coupling hole may be provided in the other one of the first circuit board and the second circuit board, and the crews may be provided as a structure to be fastened to the coupling protrusion through the coupling hole.

Further, according to various embodiments of the present disclosure, the circuit board provided with the coupling opening may further include an auxiliary fastening opening connected to the coupling opening. Therefore, the fastening member may have a structure to be coupled to the coupling opening and the auxiliary fastening opening through the coupling hole.

In addition, as will be described below, when the coupling member is provided as a single body with the connector, the coupling protrusion having the coupling opening may be provided together with a connector body having the connector, and the coupling hole may be provided in a circuit board that faces the circuit board on which the connector body having the coupling protrusion is mounted. The fastening member may be provided to be fastened with the coupling protrusion through the coupling hole. A fastening member can comprise include, but is not limited to a screw or a rivet. Further, an auxiliary fastening opening to be connected to the coupling opening may be formed in the circuit board on which the connector body having the coupling opening is mounted.

The coupling member can be applied to each of the embodiments, and in the following descriptions of respective embodiments, coupling is performed through one of the above-describe two types of coupling members.

A first embodiment of the apparatus 300 for electric connection between circuit boards within the electronic device 200 will be described with reference to FIGS. 6 to 11.

Figure 6:
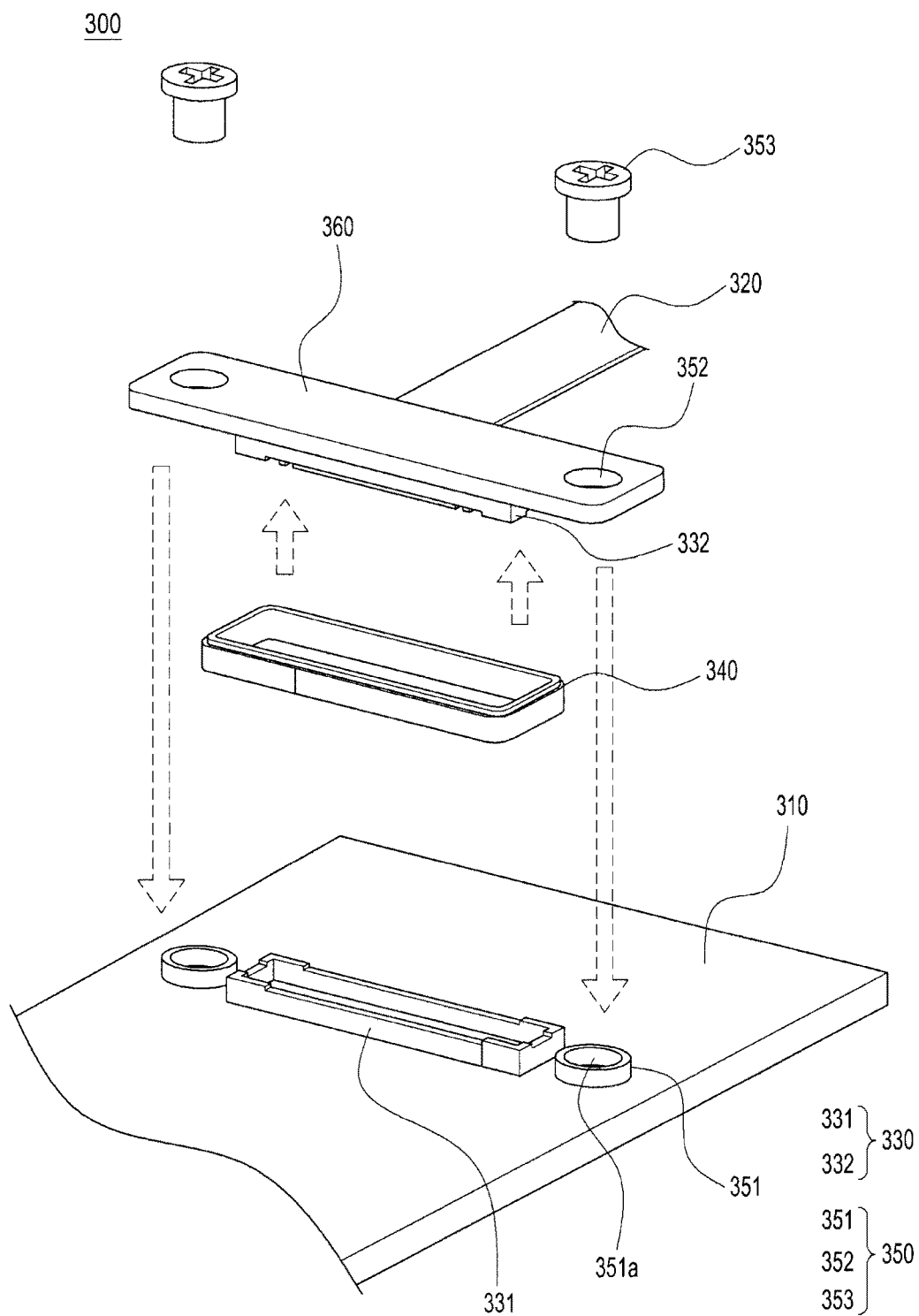
FIG. 6 is an exploded perspective view illustrating an apparatus according to a first embodiment, in the electronic device according to various embodiments of the present disclosure.
Figure 7A:
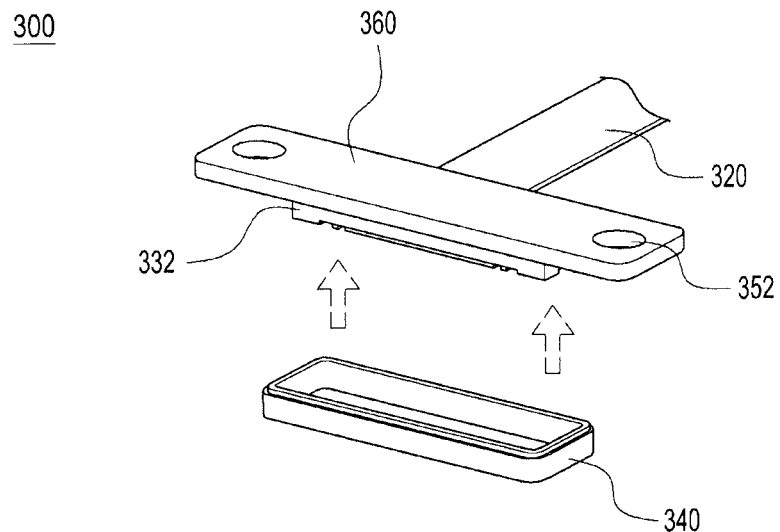
FIG. 7A and FIG. 7B are views illustrating an assembly process of the apparatus according to a first embodiment, in the electronic device according to various embodiments of the present disclosure.
Figure 7B:
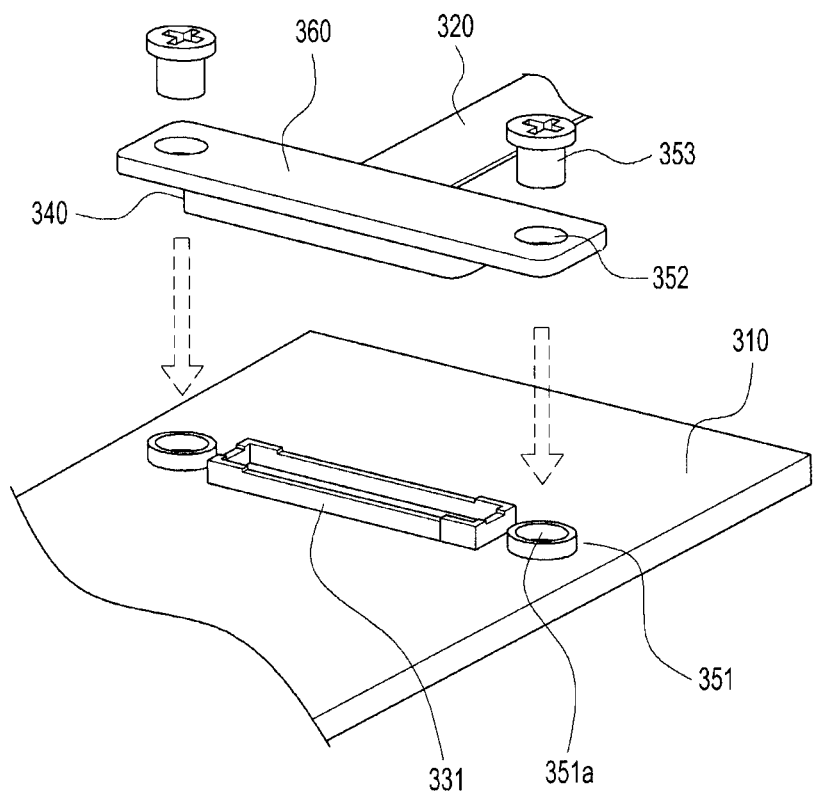
Figure 8:
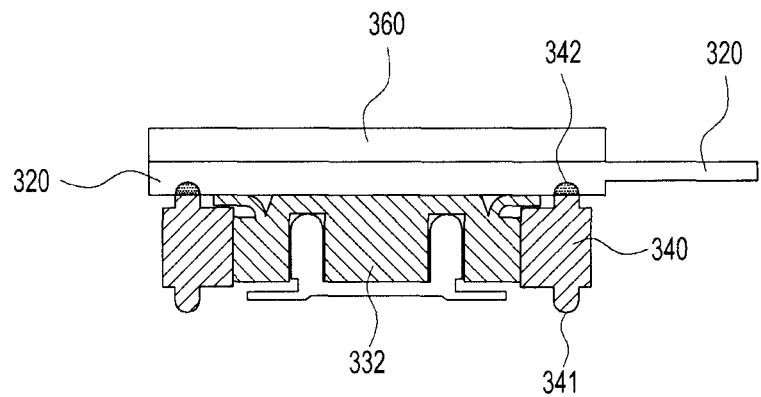
FIG. 8 is a cross-sectional view illustrating a state in which a sealing member of the apparatus according to the first embodiment is mounted on a second board unit, in the electronic device according to various embodiments of the present disclosure.
Figure 9:
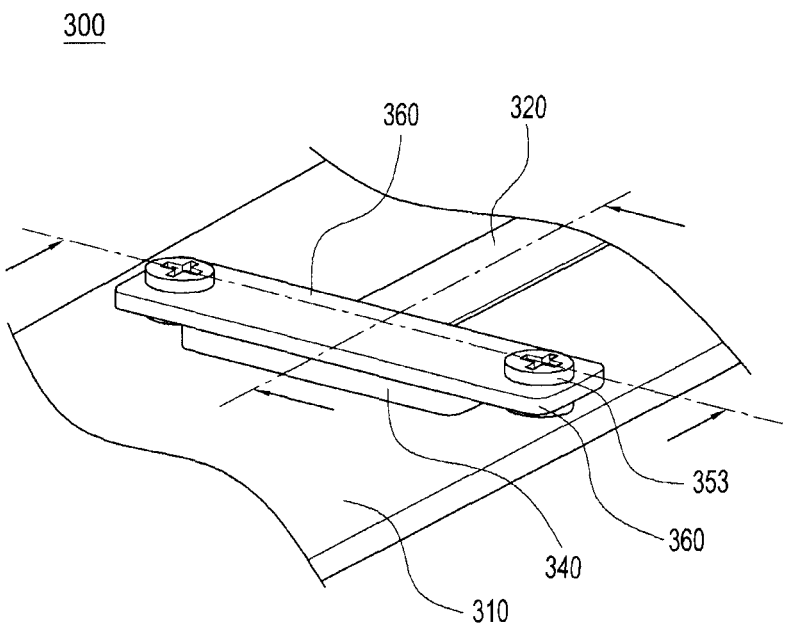
FIG. 9 is a view illustrating the apparatus according to the first embodiment in the assembled state, in the electronic device according to various embodiments of the present disclosure.
Figure 10A:
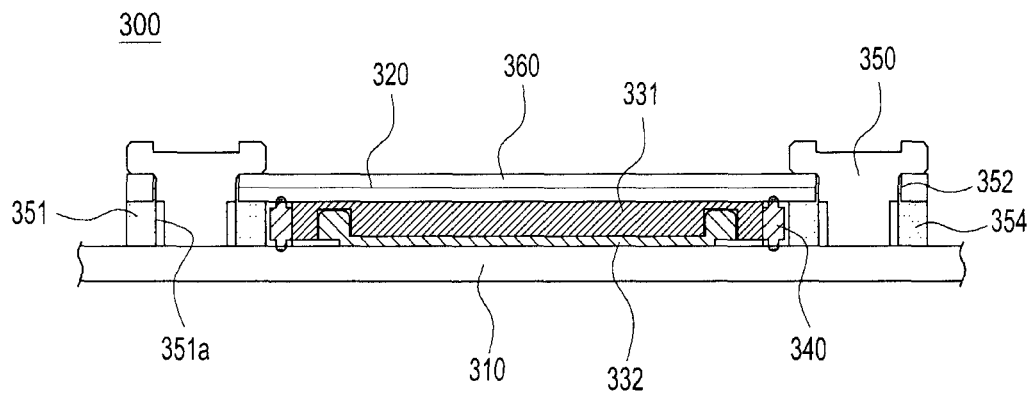
FIG. 10A and FIG. 10B are cross-sectional views illustrating the apparatus according to the first embodiment, when viewed in a first direction, in the electronic device according to various embodiments of the present disclosure.
Figure 10B:
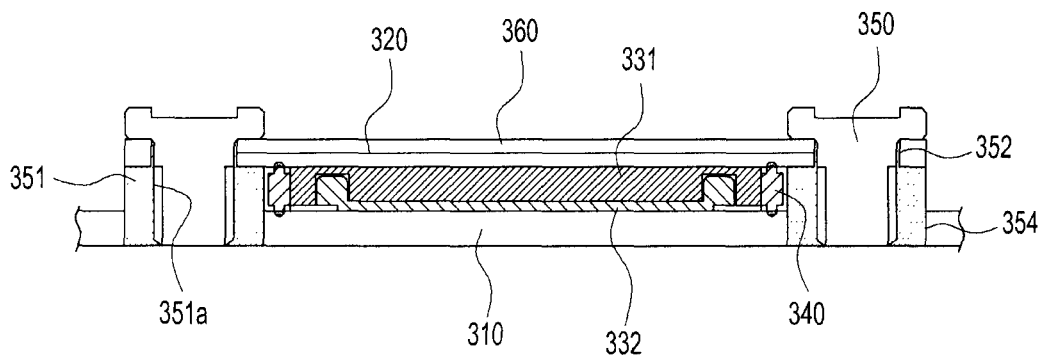
Figure 11:
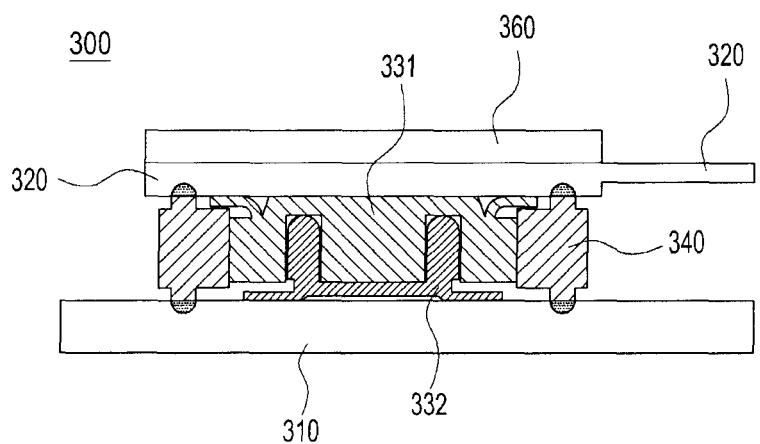
FIG. 11 is a cross-sectional view illustrating the apparatus according to the first embodiment, when viewed in a second direction, in the electronic device according to various embodiments of the present disclosure.

FIG. 6 is an exploded perspective view illustrating an apparatus 300 according to a first embodiment in the electronic device 200 according to various embodiments of the present disclosure. FIGS. 7A and 7B are views illustrating an assembly process of the apparatus 300 according to a first embodiment in the electronic device 200 according to various embodiments of the present disclosure. FIG. 8 is a cross-sectional view illustrating a state in which the sealing member 340 of the apparatus 300 according to the first embodiment is mounted on the second circuit board 320 in the electronic device 200 according to various embodiments of the present disclosure. FIG. 9 is a view illustrating the apparatus 300 according to the first embodiment in the coupled state in the electronic device 200 according to various embodiments of the present disclosure. FIGS. 10A and 10B are cross-sectional views illustrating the apparatus 300 according to the first embodiment, when viewed in the first direction, in the electronic device 200 according to various embodiments of the present disclosure. FIG. 11 is a cross-sectional view illustrating the apparatus 300 according to the first embodiment, when viewed in the second direction, in the electronic device 200 according to various embodiments of the present disclosure.

Referring to FIGS. 6 to 11, first embodiment of apparatus 300 may include the first circuit board 310 including the first connector 331, the second circuit board 320 including the second connector 332, the sealing member 340, the coupling member 350, and the reinforcing member 360, may be connected as described above. On one face of the first circuit board 310 according to an embodiment of the present disclosure, the first connector 331 configured as a female connector may be provided, and some components of the coupling member 350 (e.g., a coupling projection 351 formed on the coupling member 350) may be provided to be spaced apart from the opposite ends of the first connector 331 to couple the first circuit board 310 and the second circuit board 320 to each other. The coupling protrusion 351 is one of the components of the coupling member 350. The coupling protrusion 351 may protrude from one face of the first circuit board 310, and may be provided with a coupling opening 351a. A fastening member 353 of the coupling member 350 may be coupled to and engaged in the coupling opening 351a.

In an embodiment of the present disclosure for example, that the first connector 331 provided on one face of the first circuit board 310 is configured as a female connector, and the second connector 332 provided on one face of the second circuit board 320 is configured as a male connector such that the second connector 332 can be engaged with the first connector 331 provided as the female connector in a pair. In addition, the second circuit board 320 according to an embodiment of the present disclosure may be a flexible board, and as a result, the reinforcing member 360 may be provided on the other face of the second circuit board 320 (the opposite face to the face on which the second connector 332 is mounted (hereinafter, the opposite face will be referred to as a "second face")) to support the second flexible circuit board 320 and to maintain the connected state of the second connector 332 to the first connector 332. In addition, at the opposite ends of the second circuit board 320 provided with the reinforcing member 360, coupling holes 352 may be formed to penetrate the reinforcing member 360 and the second circuit board 320 to be connected to the coupling openings 351a, respectively.

The reinforcing member 360 according to the first embodiment of the present disclosure may be provided only at a position where the second connector 332 is provided and may be formed to be larger than the size of the second connector 332.

The sealing member 340 may be provided along the periphery of the second connector 330 between the first circuit board 310 and the second circuit board 320. According to one embodiment of the present disclosure, the second connector 332 configured as a male type connector is seated in and connected to the first connector 331 configured a female type connector, the sealing member 340 may be provided such that the sealing member 340 is mounted on the outer face of the second connector 332 configured as the male connector when the first circuit board 310 and the second circuit board 320 are assembled to each other.

The sealing member 340 may be formed in a closed curve shape along the outer periphery of the connector 330. In addition, the sealing member 340 may be formed with a pressing protrusion protruding to the first circuit board 310 side and the second circuit board 320 side. The pressing protrusion according to the first embodiment of the present disclosure may include a first pressing protrusion 341 protruding to the first circuit board 310 side and a second pressing protrusion 342 protruding to the second circuit board 320 side. The pressing protrusion may be provided in various shapes, such as a semicircular shape or a triangular shape. Upon being engaged with the first and second circuit boards 310 and 320 at the time of being coupled to each other, the first and second connectors 331 and 332 may be pressed against the first circuit board 310 and the one face of the second circuit board 320 while being in closed contact with the one face of the first circuit board 310 and the one face of the second circuit board 320, respectively. As illustrated in FIGS. 10A and 10B, the coupling member 350 may be provided in a structure including the coupling protrusion 351, the coupling hole 352, and the coupling member 353 as described above. For example, the coupling protrusion 351 each having the coupling opening 351a may be disposed to protrude at the opposite sides of the first connector 331 on one face of the first circuit board 310. The coupling holes 352 may be formed to penetrate the opposite faces of the second circuit board 320 to correspond to the positions of the coupling protrusion 351. Fastening members 353 may be fastened to the coupling openings 351a of the coupling protrusion 351 through the coupling holes 352 of the second circuit board 320, respectively.

Here, FIG. 10A illustrates a state in which the coupling protrusions 351 are provided with coupling openings 351a, respectively. The fastening members 353 are configured to be seated in the coupling openings 351a through the coupling holes 352, respectively. In the case of FIG. 10B, auxiliary fastening openings 354 may be further formed in the first circuit board 310 to be connected to the coupling opening 351a of the coupling protrusion 351. Thus, in the case where the coupling structure of FIG. 10B is provided, when the first circuit board 310 and the second circuit board 320 face each other in the state where the first connector 331 and the second connector 332 are connected to each other, the auxiliary fastening opening 354, the coupling opening 351a, and the coupling hole 352 may be connected to each other, and the fastening member 350 may be introduced and coupled to the coupling opening 351a and the auxiliary fastening opening 354 via the coupling hole 352.

The auxiliary fastening opening 354 may have a protrusion shape protruding as an opening is formed inward to extend from one face of the first circuit board 310 to the second circuit board 320 side. The auxiliary fastening opening 354 may protrude from one face of the first circuit board 310 and may be provided on the first circuit board 310 as a single body or separately. For example, the auxiliary fastening opening 354 may be provided in a form where a protrusion protrudes to the periphery of the opening formed in the first circuit board 310. Alternatively, the auxiliary fastening opening 354 may be provided to be seated separately from the openings formed in the first circuit board 310 and may be formed such that the peripheral portion thereof protrudes from one face of the first circuit board 310.

The fastening members 353 can be fastened to the coupling openings 351a through the coupling holes 352, respectively, and as a result can be fastened such that the second circuit board 320 can be somewhat pressed against the first circuit board 310.

As a result, a force is applied in a direction where the first circuit board and the second circuit board are biased away from each other due to the elastic force of the sealing member 340. The second circuit board 320 can maintain the state of being coupled to the first circuit board 310 by the coupling member 350, and the first connector 331 and the second connector 332 can maintain the connected state thereof.

That is, in the state where the coupling member 350 is not fastened, the second connector 332 may be lifted from the first connector 331 by the elastic force of the sealing member 340. However, as the second circuit board 320 is pressed against the first circuit board 310 according to the fastening of the coupling members 350, the second connector 332 and the first connector 331 can be maintained in the connected state where the first and second connectors 331 and 332 are electrically connected to each other.

Referring to the assembling order, of the apparatus 300 according to the first embodiment of the present disclosure, the sealing member 340 may be disposed to be in closed contact with the outer surface of the second connector 332 provided as a male connector. For example, the inner face of the sealing member 340 is provided to be in closed contact with the outer face of the second connector 332, and one face of the sealing member 340 (e.g., the second pressing protrusion 342) may be provided to be in closed contact with one face of the second circuit board 320. That is, when the sealing member 340 is provided on the outer face of the second connector 332, the second pressing protrusion 342 of the sealing member 340 may be in contact with one face of the second circuit board 320 along the periphery of the second connector 332. When the second circuit board 320 on which the sealing member 340 and the second connector 332 are mounted is superposed on the first circuit board 310 on which the first connector 331 is mounted, the second connector 332 may be electrically connected to the first connector 331 while enclosing the first connector 331. In addition, as the sealing member 340 may be disposed along the periphery of the connector 330, the sealing member 340 may be closely contacted between one face of the first circuit board 310 and one face of the second circuit board 320. At this time, the second pressing protrusion 342 of the sealing member 340 may be in closed contact with one face of the second circuit board 320, and the first pressing protrusion 341 of the sealing member 340 may be in closed contact with the one face of the first circuit board 310.

In this state, when the fastening members 353 are fastened to the coupling openings 351a through the coupling holes 352, the second circuit board 320 may be pressed against the first circuit board 310 by a predetermined pressure, and the sealing member 340 may be more closely contacted between the first circuit board 310 and the second board 320.

Hereinafter, second embodiment of the apparatus 300 for electric coupling between circuit boards will be described with reference to FIGS. 12 to 17.

In the apparatus 300 according to the second embodiment of the present disclosure, the mounting position of the sealing member 340 is on circuit board 331. Therefore, the description of the first embodiment may be applied to the configuration and structure of the second embodiment, which are the same as those of the above-described first embodiment.

Figure 12:
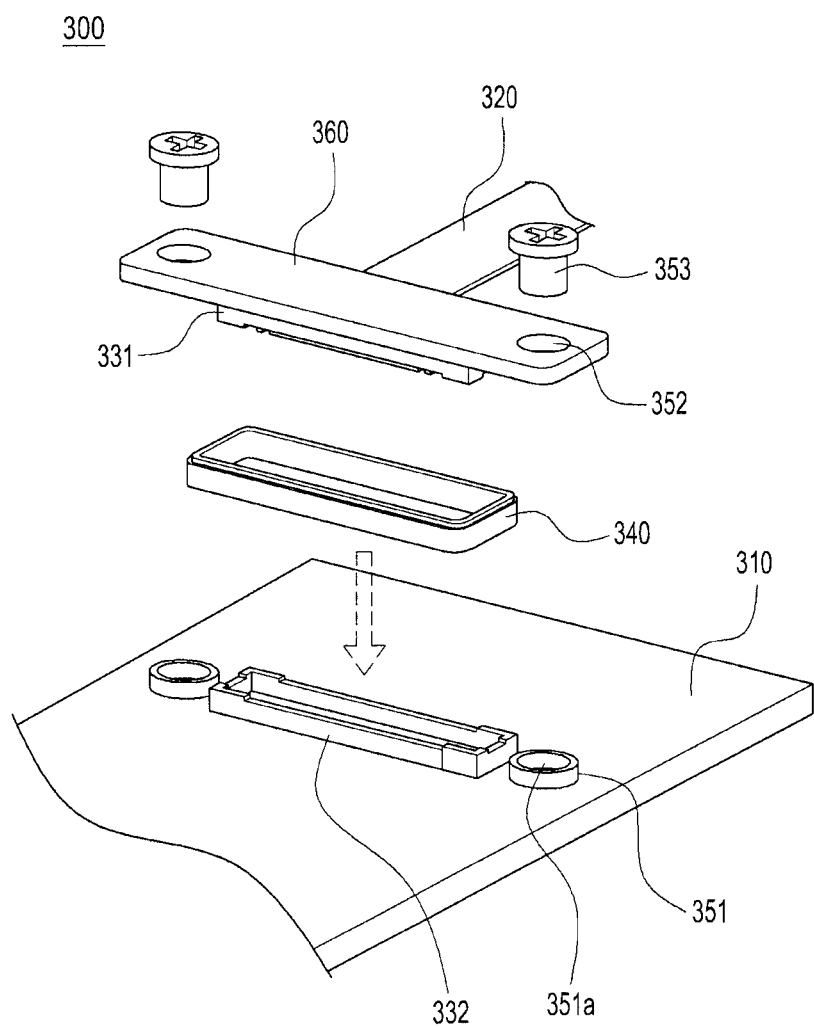
FIG. 12 is an exploded perspective view illustrating a apparatus according to a second embodiment, in the electronic device according to various embodiments of the present disclosure.
Figure 13A:
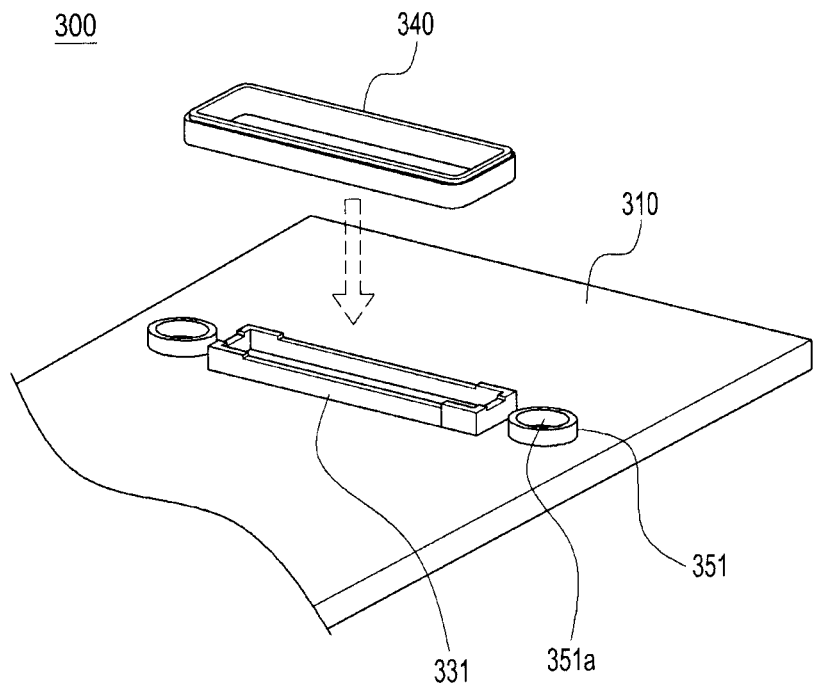
FIG. 13A and FIG. 13B are exploded perspective views illustrating an assembly process of a sealing member in the apparatus according to the second embodiment, in the electronic device according to various embodiments of the present disclosure.
Figure 13B:
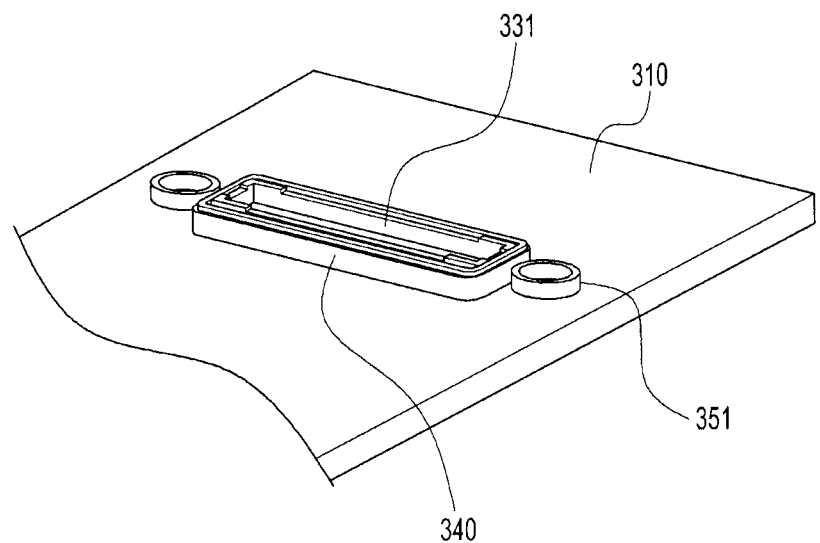
Figure 14:
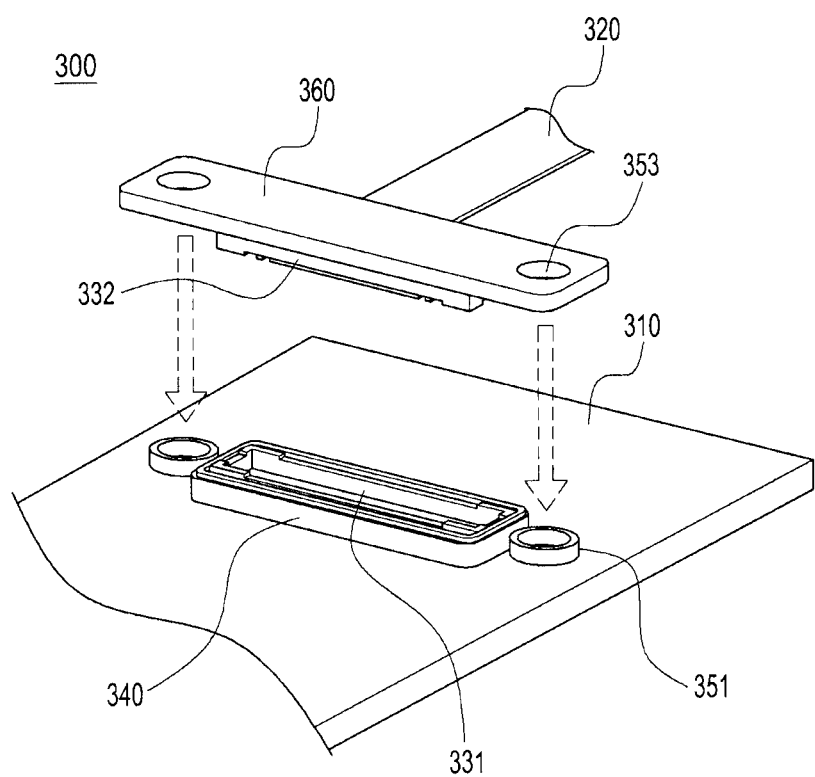
FIG. 14 is a view illustrating an assembly process of the apparatus according to the second embodiment, in the electronic device according to various embodiments of the present disclosure.
Figure 15:
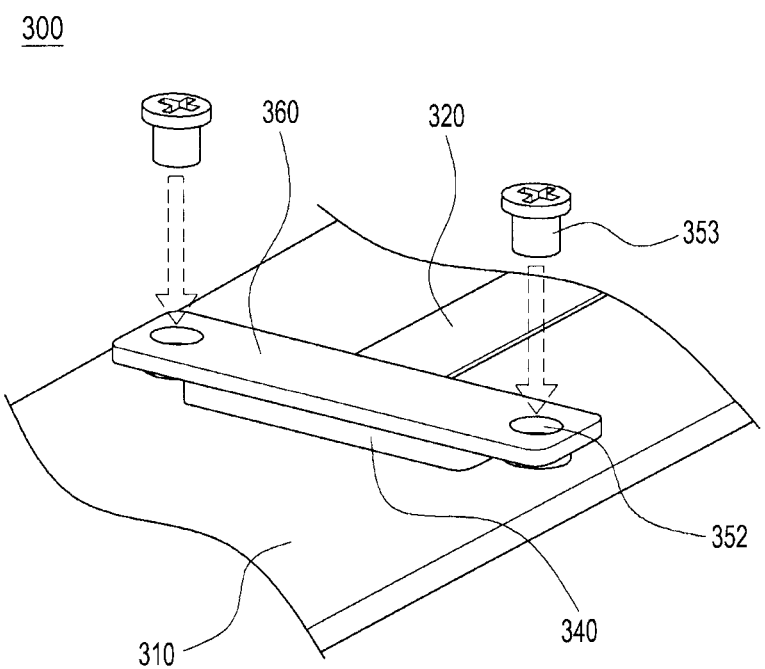
FIG. 15 is a view illustrating the apparatus according to the second embodiment in the assembled state, in the electronic device according to various embodiments of the present disclosure.
Figure 16:
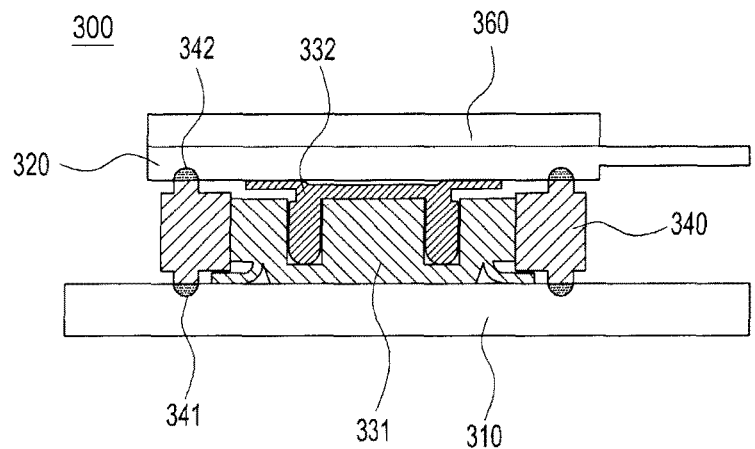
FIG. 16 is a cross-sectional view illustrating the apparatus according to the second embodiment, when viewed in a first direction, in the electronic device according to various embodiments of the present disclosure.
Figure 17A:
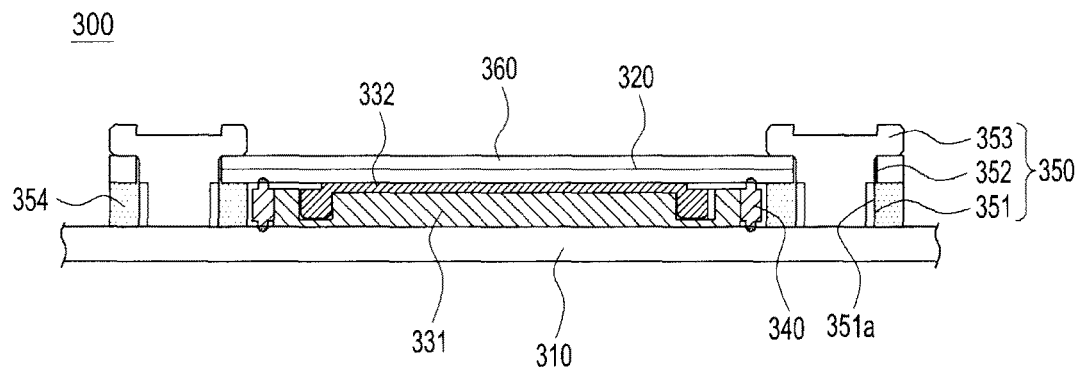
FIG. 17A and FIG. 17B are cross-sectional views illustrating the apparatus according to the second embodiment, when viewed in a second direction, in the electronic device according to various embodiments of the present disclosure.
Figure 17B:
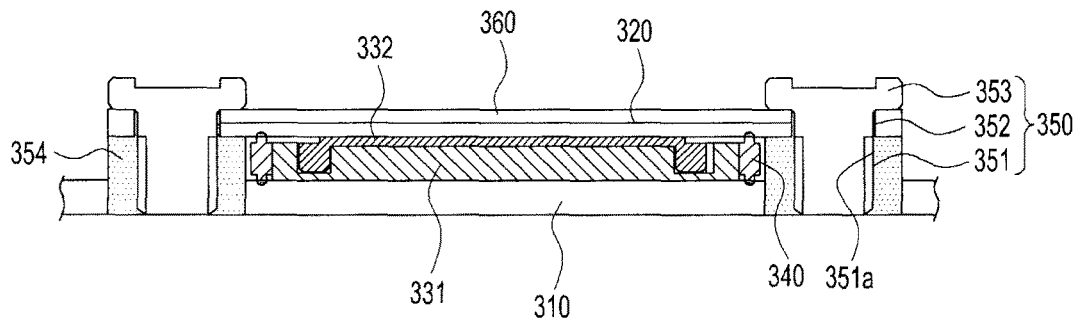

FIG. 12 is an exploded perspective view illustrating a apparatus 300 according to the second embodiment in the electronic device 200 according to various embodiments of the present disclosure. FIGS. 13A and 13B are views illustrating an assembly process of a sealing member 340 in the apparatus 300 according to the second embodiment in the electronic device 200 according to various embodiments of the present disclosure. FIG. 14 is a view illustrating an assembly process of the apparatus 300 according to the second embodiment in the electronic device 200 according to various embodiments of the present disclosure. FIG. 15 is a view illustrating the apparatus 300 according to the second embodiment in the coupled state in the electronic device 200 according to various embodiments of the present disclosure. FIG. 16 is a cross-sectional view illustrating the apparatus 300 according to the second embodiment, when viewed in the first direction, in the electronic device 200 according to various embodiments of the present disclosure. FIGS. 17A and 17B are cross-sectional views illustrating the apparatus 300 according to the second embodiment, when viewed in the second direction, in the electronic device 200 according to various embodiments of the present disclosure.

Referring to FIG. 12 to FIGS. 17A and 17B, the apparatus 300 of second embodiment of the present disclosure may include the first circuit board 310 including the first connector 331, the second circuit board 320 including the second connector 332, the sealing member 340, the coupling member 350, and the reinforcing member 360, as described above. On one face of the first connector 331 according to an embodiment of the present disclosure, the first connector 331 configured as a male connector may be provided, and some components of the coupling member 350 may be provided to be spaced apart from the opposite ends of the first connector 331 to couple the first circuit board 310 and the second circuit board 320 to each other. For example, coupling protrusions 351 each having a coupling opening 351a may be provided in the configuration of the coupling member 350. Since the configuration of the coupling member 350 is the same as that of the first embodiment described above, the description of the preceding embodiment can be applied to the configuration of the coupling member of the present embodiment.

In an embodiment of the present disclosure, the first connector 331 provided on one face of the first circuit board 310 is configured as a male connector, and the second connector 332 provided on one face of the second circuit board 320 is configured as a female connector such that the second connector 332 can be engaged with the first connector 331. In addition, the second circuit board 320 according to an embodiment of the present disclosure may be provided as a flexible board, and the reinforcing member 360 may be provided on the other face of the second circuit board 320 so as to support the second flexible circuit board 320 and to primarily maintain the connected state of the second connector 332 to the first connector 331. At the opposite ends of the second circuit board 320 provided with the reinforcing member 360, coupling holes 352 may be provided to be connected to the coupling openings 351a through the reinforcing member 360 and the second circuit board 320.

The sealing member 340 may be provided along the periphery of the apparatus 300 between the first circuit board 310 and the second circuit board 320. As the apparatus 300 according to the second embodiment of the present disclosure is configured such that, as the first connector 331 configured as a female type connector is seated in and connected to the second connector 332 configured as a female type connector, the sealing member 340 may be provided such that the sealing member 340 is mounted on the outer face of the first connector 331 configured as the male connector when the first circuit board 310 and the second circuit board 320 are assembled to each other.

The sealing member 340 may be formed in a closed curve shape along the outer periphery of the connector 330. The sealing member 340 according to an embodiment of the present disclosure may have a structure similar to that of the first embodiment, except only for the sealing member and the mounting position before assembly in the above-described first embodiment. For example, the sealing member 340 according to an embodiment of the present disclosure may also be formed with a pressing protrusion protruding to the first circuit board 310 side and the second circuit board 320 side. Since the shape of the pressing projection may have the same structure as that of the first embodiment described above, the above description can be applied to the present embodiment.

In addition, the apparatus 300 according to the embodiment of the present disclosure may also be provided with a coupling member 350. As described in the first embodiment described above, the structure of the coupling member 350 may be provided in a structure including a coupling protrusion 351, a coupling hole 352, and a fastening member 353. Therefore, the above description of the prior embodiment may also be applied to the coupling member 350 according to the embodiment of the present disclosure.

As in the case of FIG. 17A, in the coupling member according to the second embodiment, the coupling protrusion 351 is provided with a coupling opening 351a, and the fastening member 353 is configured to be seated in the coupling opening 351a through the coupling hole 352, and in the case of FIG. 17B, a fastening coupling opening 354 may be further formed in the first circuit board 310 to be connected to the coupling opening 351a of the coupling protrusion 351. When the first circuit board 310 and the second circuit board 320 face each other in the state where the first connector 331 and the second connector 332 are connected to each other, the auxiliary fastening opening 354, the coupling opening 351a, and the coupling hole 352 may be connected to each other, and the fastening member 350 may be introduced into and coupled to the coupling opening 351a and the auxiliary fastening opening 354 through the coupling hole 352.

Referring to the assembling order of the apparatus 300 according to the second embodiment of the present disclosure, the sealing member 340 may be disposed to be in closed contact with the outer surface of the first connector 331 provided as a male connector. For example, the inner face of the sealing member 340 is provided to be in closed contact with the outer face of the first connector 331, and one face of the sealing member 340 (e.g., the first pressing protrusion 341) may be provided to be in closed contact with one face of the first circuit board 310. That is, when the sealing member 340 is provided on the outer face of the first connector 331, the first pressing protrusion 341 of the sealing member 340 may be in contact with one face of the first circuit board 310 along the periphery of the first connector 331. When the second connector 332 is superposed on the first circuit board 310 on which the sealing member 300 and the first connector 332 are mounted, the first connector 331 may be electrically connected to the second connector 332 while enclosing the second connector 332. In addition, as the sealing member 340 may be disposed along the periphery of the connector 330, the sealing member 340 may be closely contacted between one face of the first circuit board 310 and one face of the second circuit board 320. At this time, the first pressing protrusion 341 of the sealing member 340 may be in closed contact with one face of the first circuit board 310, and the second pressing protrusion 342 of the sealing member 340 may be in closed contact with the one face of the second circuit board 320.

In this state, when the fastening members 353 are fastened to the coupling openings 351a through the coupling holes 352, the second circuit board 320 may be pressed against the first circuit board 310 by a predetermined pressure, and the sealing member 340 may be more closely contacted between the first circuit board 310 and the second board 320.

Hereinafter, a third embodiment of the apparatus 300 for including electrically coupled circuit boards within the electronic device 200 will be described with reference to FIGS. 18 to 24.

The apparatus 300 according to the third embodiment of the present disclosure in which the coupling member 350 is formed in the form of a single body on the connector 330, thereby forming structure 380, and hence in terms of the configuration in which the sealing member 340 is disposed outside the connector 330 including the coupling member 350 as a single body. Accordingly, the descriptions of the first and second embodiments can be applied to the configuration and structure of the third embodiment, which are the same as those of the above-described first and second embodiments.

Figure 18:
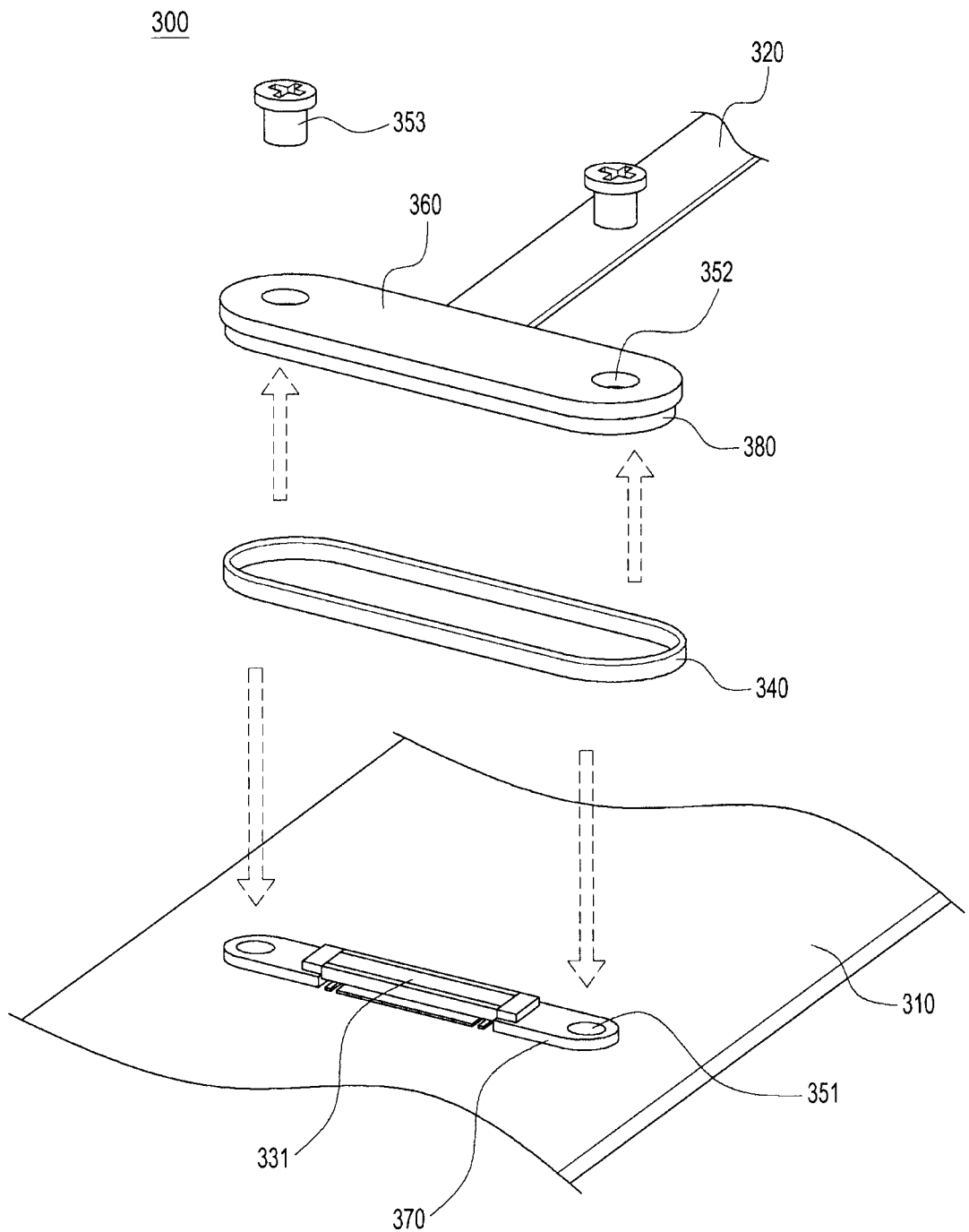
FIG. 18 is an exploded perspective view illustrating a apparatus according to a third embodiment, in the electronic device according to various embodiments of the present disclosure.
Figure 19:
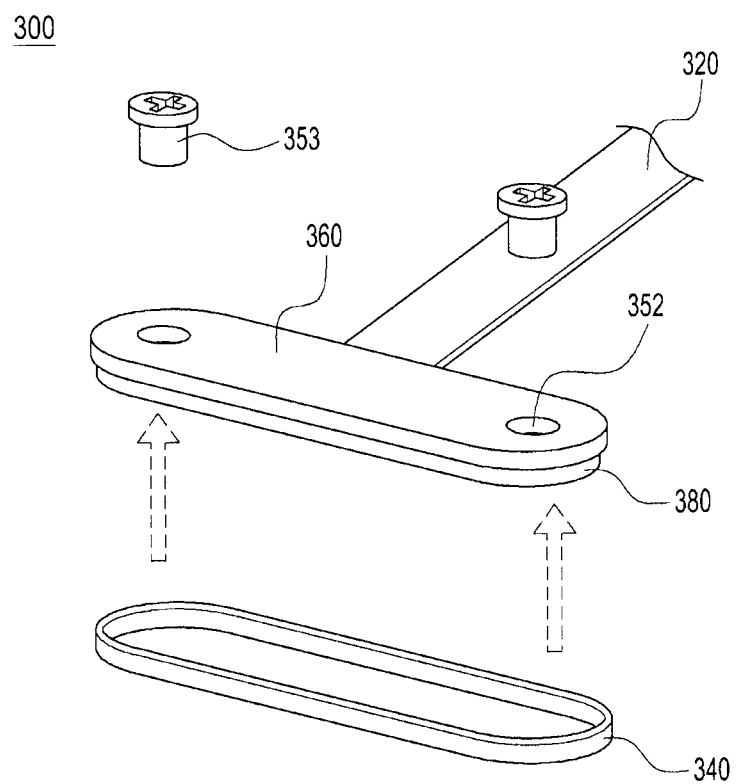
FIG. 19 is an exploded perspective view illustrating an assembly process of a sealing member in the apparatus according to the third embodiment, in the electronic device according to various embodiments of the present disclosure.
Figure 20:
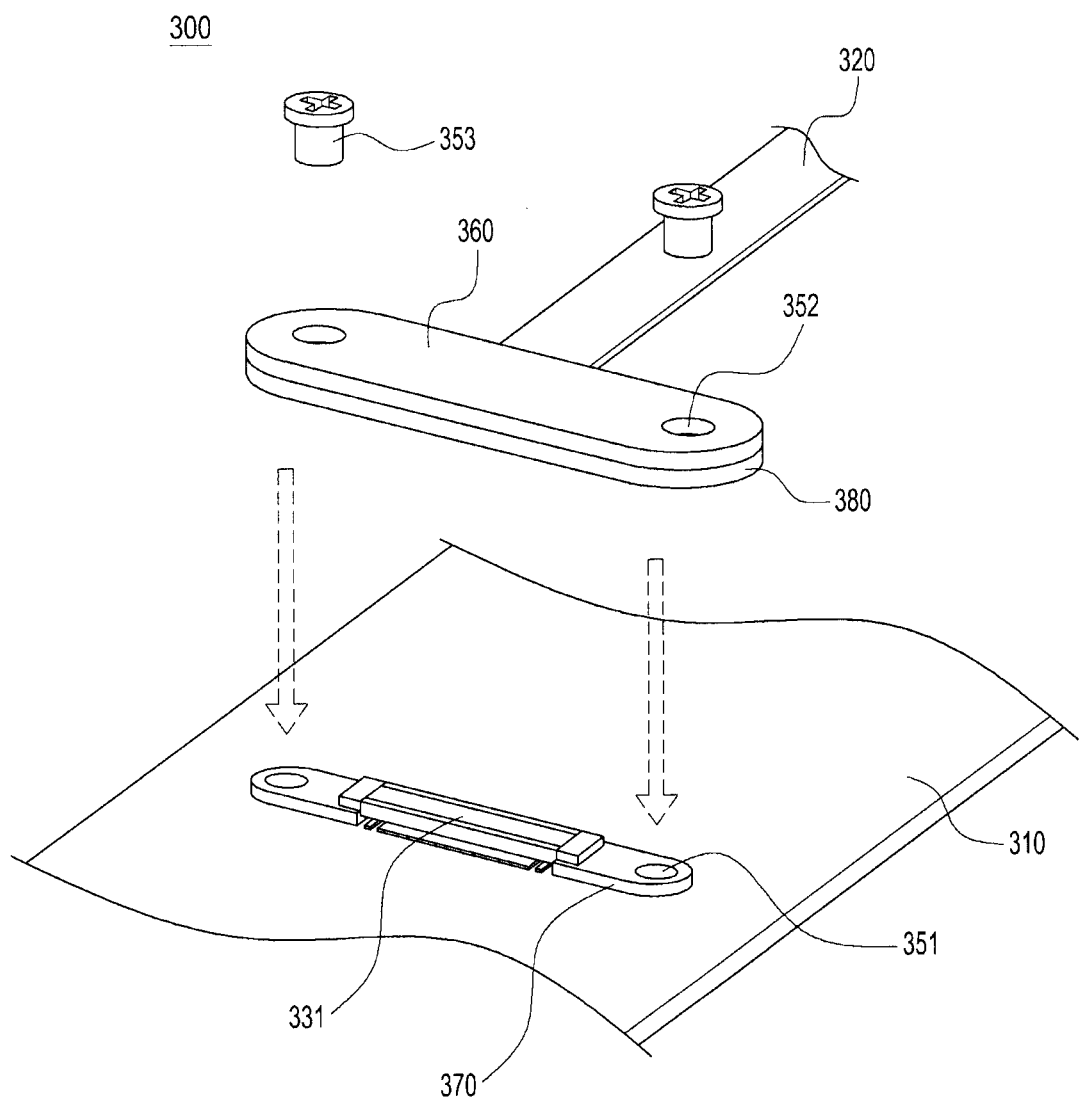
FIG. 20 is a view illustrating an assembly process of the apparatus according to the third embodiment, in the electronic device according to various embodiments of the present disclosure.
Figure 21:
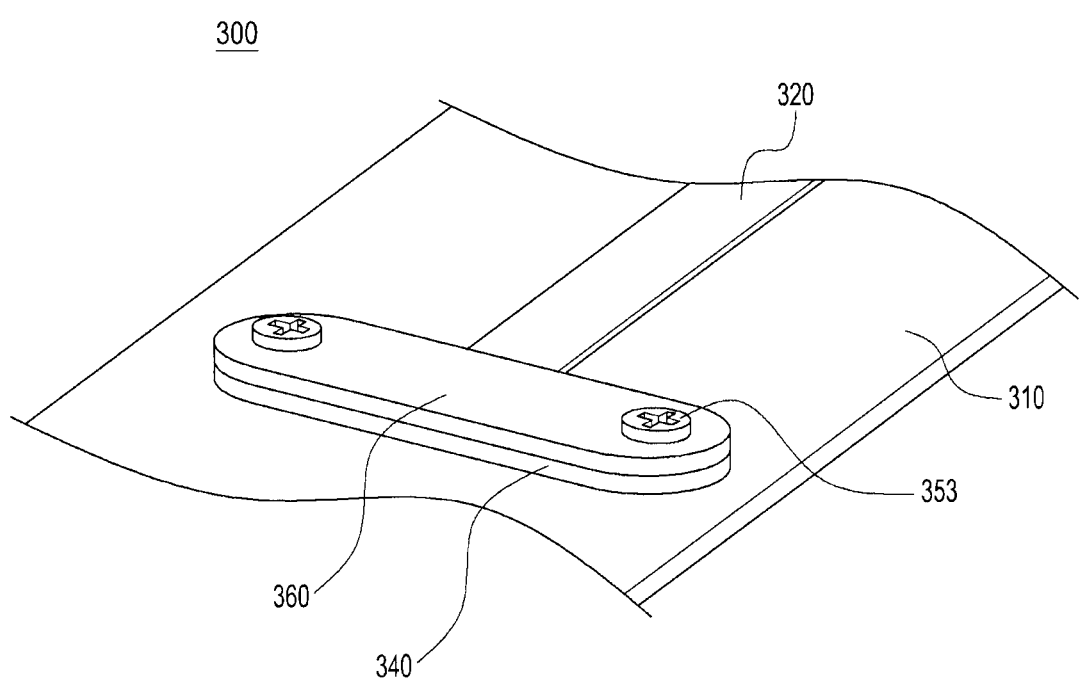
FIG. 21 is a view illustrating a apparatus according to a third embodiment in the assembled state, in the electronic device according to various embodiments of the present disclosure.
Figure 22A:
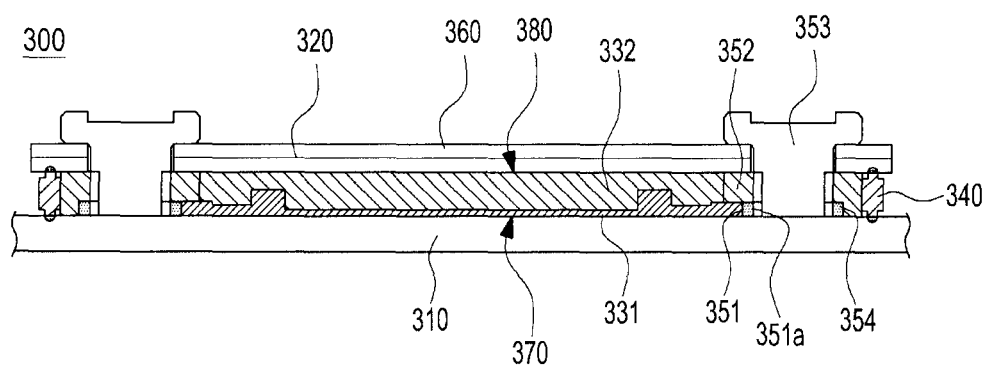
FIG. 22A and FIG. 22B are cross-sectional views illustrating the apparatus according to the third embodiment, when viewed in a first direction, in the electronic device according to various embodiments of the present disclosure.
Figure 22B:
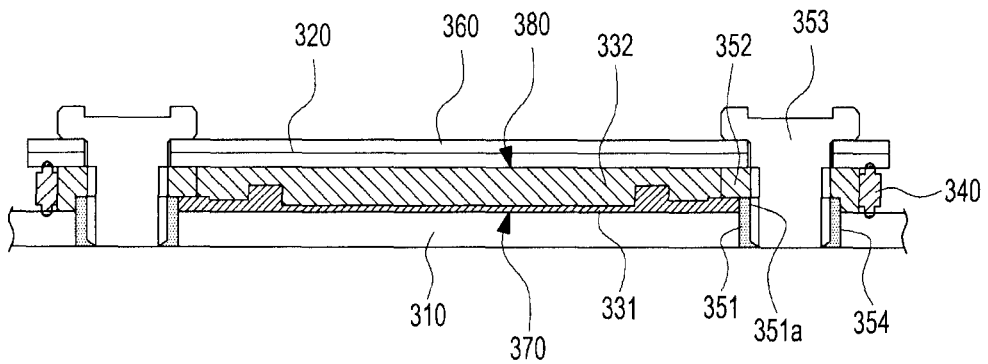
Figure 23:
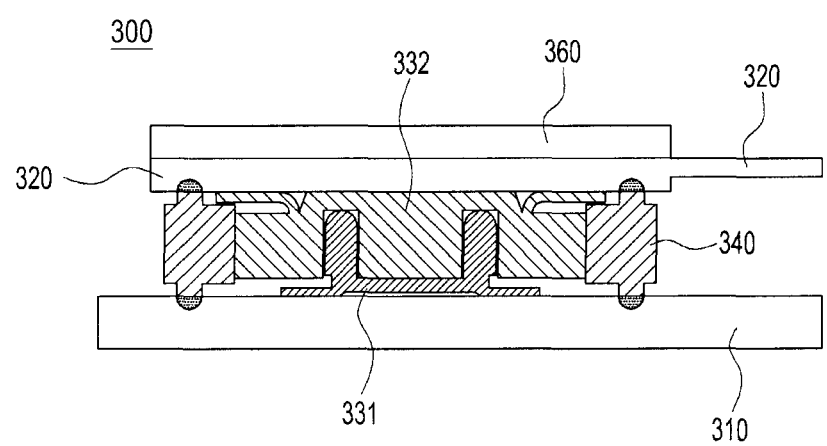
FIG. 23 is a cross-sectional view illustrating the apparatus according to the third embodiment, when viewed in a second direction, in the electronic device according to various embodiments of the present disclosure.
Figure 24A:
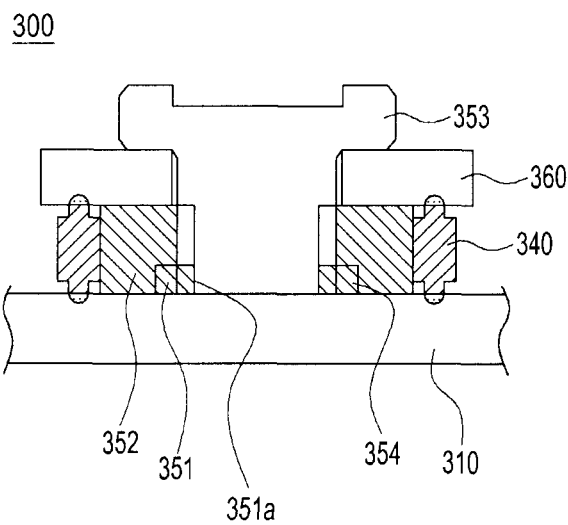
FIG. 24A and FIG. 24B are cross-sectional views illustrating the apparatus according to the third embodiment at the position of a coupling member, in the electronic device according to various embodiments of the present disclosure.
Figure 24B:
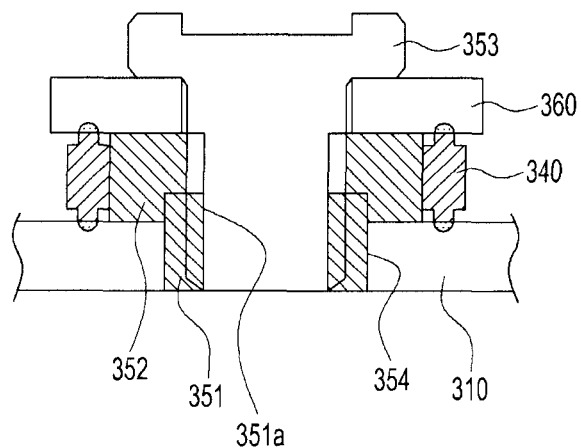

FIG. 18 is an exploded perspective view illustrating a apparatus 300 according to another embodiment in the electronic device 200 according to various embodiments of the present disclosure. FIG. 19 is a view illustrating an assembly process of a sealing member 340 in the apparatus 300 according to another embodiment in the electronic device 200 according to various embodiments of the present disclosure. FIG. 20 is a view illustrating an assembly process of the apparatus 300 according to another embodiment in the electronic device 200 according to various embodiments of the present disclosure. FIG. 21 is a view illustrating the apparatus 300 according to another embodiment in the coupled state in the electronic device 200 according to various embodiments of the present disclosure. FIGS. 22A and 22B are cross-sectional views illustrating the apparatus 300 according to another embodiment, when viewed in the first direction, in the electronic device 200 according to various embodiments of the present disclosure. FIG. 23 is a cross-sectional view illustrating the apparatus 300 according to another embodiment, when viewed in the second direction, in the electronic device 200 according to various embodiments of the present disclosure. FIGS. 24A and 24B are cross-sectional views at the position of the coupling member of the apparatus 300 according to the third embodiment in the electronic device 200 according to various embodiments of the present disclosure.

Referring to FIG. 18 to FIG. 24B, the apparatus 300 of the third embodiment of the present disclosure may include the first circuit board 310 including the first connector body 370, the second circuit board 320 including the second connector body 380, the sealing member 340, and the reinforcing member 360, as described above.

As a configuration mounted on the first circuit board 310, the above-described first connector 331 and one of the configurations of the coupling member 350 (e.g., the coupling protrusion 351 including the coupling opening 351a) may be formed as a single body on the first connector body 370. The above-described second connector 332 and one of the configurations of the coupling member 350 (e.g., the connection hole 355 connected to the coupling hole 352 connected to the coupling opening 351a) may be formed as a single body on the second connector body 380.

The first connector body 370 according to the third embodiment of the present disclosure is configured to be mounted on one face of the first circuit board 310, and the first connector body 370 may include coupling openings 351a provided in the opposite side portions thereof and a first connector 331 provided between the coupling openings 351a. That is, the first connector 331 and the coupling openings 351a may be provided together in the first connector body 370 so that the first connector body 370 may be configured to be mounted on one face of the first circuit board 310. In addition, the second connector body 380 is configured to be mounted on one face of the second circuit board 320, and the second connector body 380 may include, at the opposite side portions thereof, coupling openings 351a and 351b and connection holes 355 connected to the coupling holes 352 of the second circuit board 320, and may include, between the connection holes 355, a second connector 332 to be engaged with the first connector 331. That is, the second connector 332 and the connection hole 355 may be provided together in the second connector body 380 so that the second connector 332 may be configured to be mounted on one face of the second circuit board 320.

Here, when the first connector 331 is formed as a male connector, the second connector 332 may be formed as a female connector to be engaged with the male connector, and when the first connector 331 is formed as a female connector, the second connector 332 may be formed as a male connector. In addition, it may be described, as an example, that the first connector body 370 according to the embodiment of the present disclosure may be configured to be inserted into the inside of the second connector body 380. On the contrary, the second connector body 380 may be configured to be inserted into the first connector body 370.

In the third embodiment of the present disclosure, since the first connector body 370 is configured to be inserted into the second connector body 380, the sealing member 340 may be positioned along the outer peripheral face of the second connector body 380. However, when the second connector body 380 is configured to be inserted into the first connector body 370, it is natural that the sealing member 340 is configured to be positioned along the outer peripheral face of the first connector body 370.

The sealing member 340 may be formed in a closed curve shape along the periphery of the apparatus 300 (e.g., the second connector body 380), and a pressing protrusion may be formed on the sealing member 340 to protrude toward the first circuit board 310 side and the second circuit board 320. When the second connector 332 is fitted to the connector 330 of the first connector 331, the first pressing protrusion 341 may come in closed contact with the first circuit board 310, and the second pressing protrusion 342 may come in closed contact with the second circuit board 320.

When the second circuit board 320 provided with the reinforcing member 360 is superposed on one face of the first circuit board 310 so that the first connector 331 is seated in and connected to the second connector 332, the sealing member 340 may be configured to seal the inside and the outside of the apparatus 300, to be positioned along the outer peripheral face of the second connector body 380, and to seal both the coupling member 350 and the connector 330 between the first circuit board 310 and the second circuit board 320.

When the first connector body 370 is inserted into the second connector body 380, the first connector 331 and the second connector 332 may be coupled to be electrically connected to each other, the coupling openings 351a of the first connector body 370 and the connection holes 355 and the coupling holes 352 of the second connector body 380 may be connected to each other, and the fastening members 353 may be fastened to the connection holes 355 and the coupling openings 351a through the coupling holes 352 so that the second circuit board 320 can be fastened to the first circuit board 310 while being somewhat pressed against the first circuit board 310.

Thus, the second circuit board 320 can maintain the state being coupled to the first circuit board 310, and the second connector 332 can maintain the connected state in the state of being seated in the first connector 331.

That is, in the state where the coupling member 350 is not fastened, the second connector 332 may be lifted from the first connector 331 by the elastic force of the sealing member 340. However, as the second circuit board 320 is pressed against the first circuit board 310 according to the fastening of the coupling members 350, the second connector 332 and the first connector 331 can be maintained in the connected state where the first and second connectors 331 and 332 are electrically connected to each other.

In addition, FIG. 22A (see FIG. 24A as well) illustrates the state in which the first connector body 370 is provided with the coupling openings 351a. The fastening members 353 are configured to be seated in the coupling openings 351a through the coupling holes 352, respectively. In the case of FIG. 22B (see FIG. 24B as well), auxiliary fastening openings 354 may be further formed in the first circuit board 310 to be connected to the coupling openings 351a of the connector body 370, respectively. When the first circuit board 310 and the second circuit board 320 face each other in the state where the first connector 331 and the second connector 332 are connected to each other, the auxiliary fastening opening 354, the coupling opening 351a, and the coupling hole 352 may be connected to each other, and the fastening member 350 may be introduced into and coupled to the connection hole 355, the coupling opening 351a and the auxiliary fastening opening 354 through the coupling hole 352.

The auxiliary fastening opening 354 may have a protrusion shape protruding as an opening is formed inward to extend from one face of the first circuit board 310 to the second circuit board 320 side. The auxiliary fastening opening 354 may protrude from one face of the first circuit board 310 and may be provided on the first circuit board 310 as a single body or separately. For example, the auxiliary fastening opening 354 may be provided in a form where a protrusion protrudes to the periphery of the opening formed in the first circuit board 310. Alternatively, the auxiliary fastening opening 354 may be provided to be seated separately from the openings formed in the first circuit board 310 and may be formed such that the peripheral portion thereof protrudes from one face of the first circuit board 310.

Referring to the assembling order of the apparatus 300 according to the third embodiment of the present disclosure, the sealing member 340 may be provided on one face of the second circuit board 320 to be disposed around the periphery of the second connector body 380. That is, when the sealing member 340 is mounted on the second circuit board 320, the second pressing protrusion 342 of the sealing member 340 may be in contact with one face of the second circuit board 320 along the periphery of the second connector body 380. When the second circuit board 320 on which the sealing member 340 and the second connector body 380 are mounted is superposed on the first connector body 370, the second connector body 380 may enclose the first connector body 370, the first connector 331 and the second connector 332 may be connected to each other, the coupling opening 351a may be connected to the connection hole 355 and the coupling hole 352, and the sealing member 340 may be positioned around the outer periphery of the second connector body 380 that encloses the first connector body 370. In addition, the sealing member 340 may be closely contacted between one face of the first circuit board 310 and one face of the second circuit board 320, in which the first pressing protrusion 341 of the sealing member 340 may be in closed contact with one face of the first circuit board 310, and the second pressing protrusion 342 of the sealing member 340 may be in contact with the one face of the second board 320.

In this state, when the fastening members 353 are fastened to the connection holes 355 and the coupling openings 351a through the coupling holes 352, the second circuit board 320 may be pressed against the first circuit board 310 by a predetermined pressure, and the sealing member 340 may be more closely contacted between the first circuit board 310 and the second circuit board 320.

Hereinafter, a fourth embodiment of the apparatus 300 for electric coupling between circuit boards within the electronic device 200 will be described with reference to FIGS. 25 to 28.

The apparatus 300 according to the fourth embodiment of the present disclosure includes a single coupling member 350. Certain portions of the description of the third embodiment can be applied to the configuration and structure of the fourth embodiment. In general, coupling opening 351a, coupling hole 352, and fastening member 353 are centered with respect to the first connector body 370 and second connector body 380.

Figure 25:
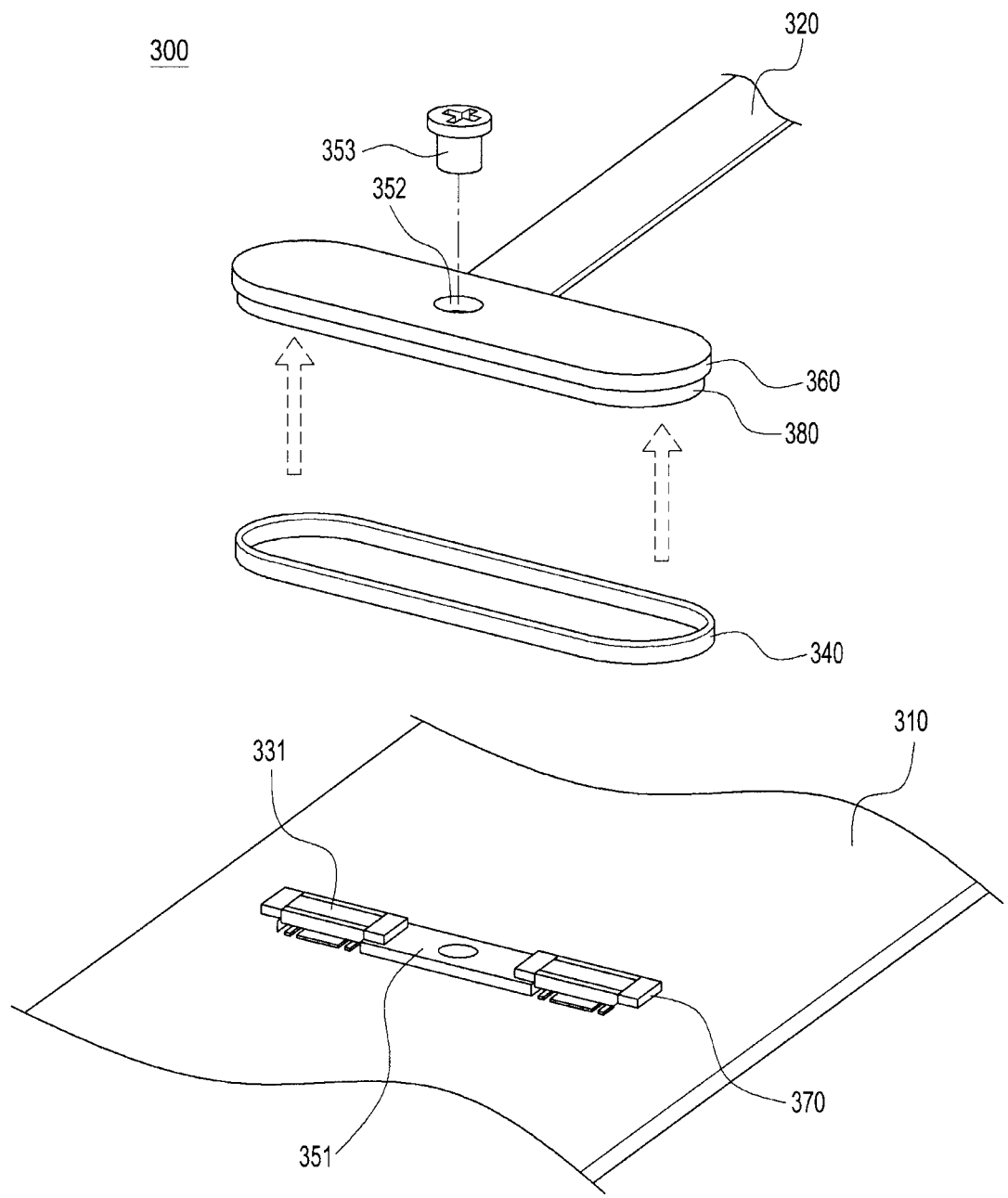
FIG. 25 is an exploded perspective view illustrating an apparatus according to a fourth embodiment, in the electronic device according to various embodiments of the present disclosure.
Figure 26:
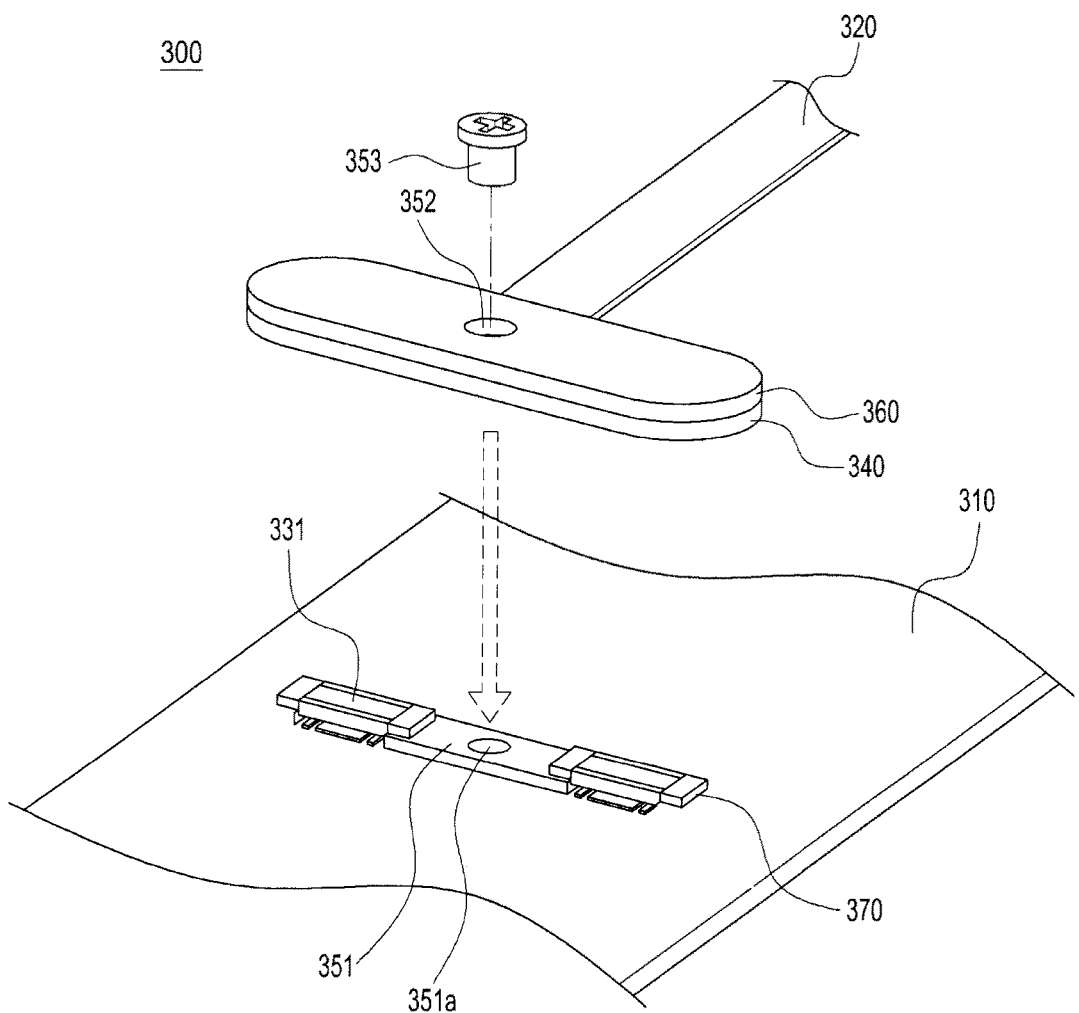
FIG. 26 is a perspective view illustrating the apparatus according to the fourth embodiment, in the electronic device according to various embodiments of the present disclosure before assembly.
Figure 27:
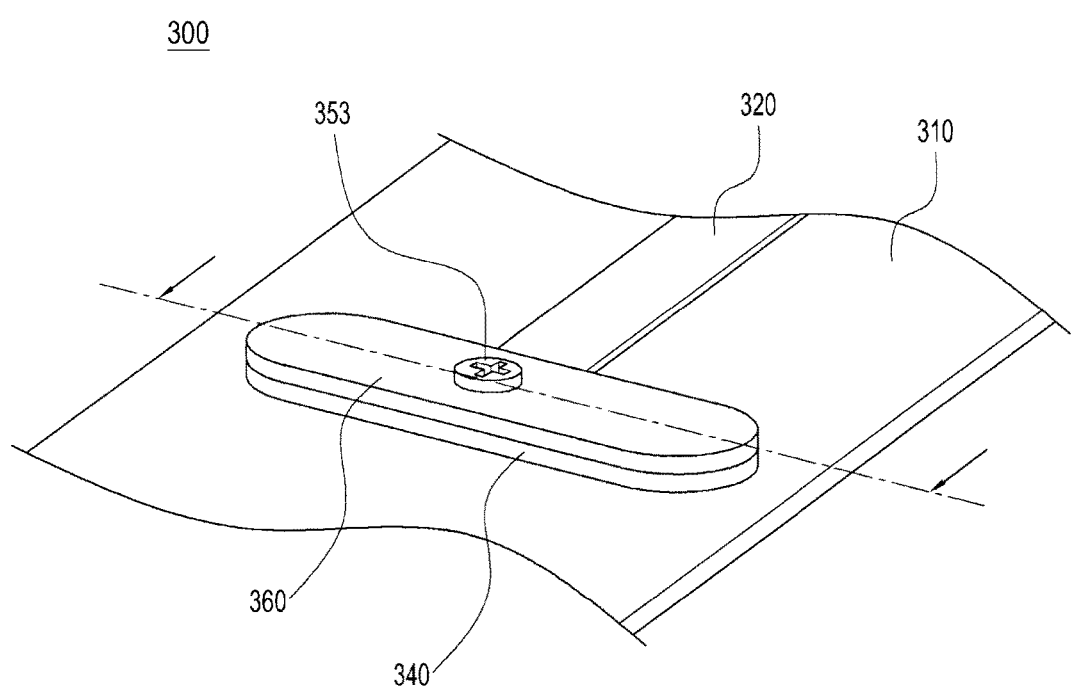
FIG. 27 is a view illustrating the apparatus according to the fourth embodiment in the assembled state, in the electronic device according to various embodiments of the present disclosure.

FIG. 25 is an exploded perspective view illustrating a apparatus 300 according to the fourth embodiment in the electronic device 200 according to various embodiments of the present disclosure. FIG. 26 is a perspective view illustrating the apparatus 300 according to the fourth embodiment prior to coupling, in the electronic device 200 according to various embodiments of the present disclosure. FIG. 27 is a view illustrating the apparatus 300 according to the fourth embodiment in the coupled state in the electronic device 200 according to various embodiments of the present disclosure. FIG. 28 is a cross-sectional view illustrating the apparatus 300 according to the fourth embodiment, when viewed in the first direction, in the electronic device 200 according to various embodiments of the present disclosure.

Referring to FIG. 25 to FIG. 28B, the apparatus 300 of the third embodiment of the present disclosure may include the first circuit board 310 including the first connector body 370, the second circuit board 320 including the second connector body 380, the sealing member 340, and the reinforcing member 360, as described above.

The first connector body 370 is configured to be mounted on the first substrate unit 310, and the above-described first connector 331 and coupling opening 351a may be formed together in the first connector body 370. The second connector body 380 is configured to be mounted on the second substrate unit 320, and the above-described second connector 332 and coupling hole 352 connected to the connection hole 355 may be formed as a single body in the second connector body 380.

The coupling opening 351a according to the fourth embodiment of the present disclosure may be provided at the center portion of the first connector body 370, and first connectors 331 may be respectively provided on the opposite sides of the coupling opening 351a with reference to the coupling opening 351a as a center. That is, the first connectors 331 and the coupling opening 351a may be provided together in the first connector body 370.

In addition, the second connector body 380 may include, at the center thereof, a connection hole 355 to be aligned with the coupling hole 352 when the second connector body 380 is mounted on the second circuit board 320 and a second connector body 380, and may include second connectors 332 provided on the opposite sides of the connection hole 355 with reference to the connection hole 355 as a center. Thus, the coupling openings 351a may be provided at the positions where they are engaged with the coupling holes 352, and the first connectors 331 and the second connectors 332 may be disposed at positions where they are engaged with each other, on the opposite sides of the coupling member 350.

When the first connectors 331 provided on the first connector body 370 are formed as male connectors, the second connectors 332 provided on the second connector body 380 may be formed as female connectors to be engaged with the male connectors, and when the first connectors 331 provided on the first connector body 370 are formed as female connectors, the second connectors 332 provided on the second connector body 380 may be formed as male connectors. In addition, it may be described, as an example, that the first connector body 370 according to the fourth embodiment of the present disclosure may be configured to be inserted into the inside of the second connector body 380. On the contrary, the second connector body 380 may be configured to be inserted into the first connector body 370.

In the fourth embodiment of the present disclosure, since the first connector body 370 is configured to be inserted into the second connector body 380, the sealing member 340 may be positioned along the outer peripheral face of the second connector body 380. However, when the second connector body 380 is configured to be inserted into the first connector body 370, it is natural that the sealing member 340 is configured to be positioned along the outer peripheral face of the first connector body 370.

The sealing member 340 may be formed in a closed curve shape along the periphery of the apparatus 300 (e.g., the second connector body 380), and a pressing protrusion may be formed on the sealing member 340 to protrude toward the first circuit board 310 side and the second circuit board 320. When the connector 330 of the second connector 332 is fitted to the connector 330 of the first connector 331, the first pressing protrusion 341 may come in closed contact with the first circuit board 310, and the second pressing protrusion 342 may come in closed contact with the second circuit board 320.

When the second circuit board 320 provided with the reinforcing member 360 is superposed on one face of the first circuit board 310 so that the first connector 331 is seated in and connected to the second connector 332, the sealing member 340 may be configured to seal the inside and the outside of the apparatus 300, to be positioned along the outer peripheral face of the second connector body 380, and to seal both the coupling member 350 and the connector 330 between the first circuit board 310 and the second circuit board 320.

When the first connector body 370 is inserted into the second connector body 380, the first connector 331 and the second connector 332 may be coupled to be electrically connected to each other, the coupling openings 351a of the first connector body 370 and the coupling holes 352 of the second connector body 380 may be connected to each other, and the fastening members 353 may be fastened to the coupling openings 351a through the coupling holes 352 so that the second circuit board 320 can be fastened to the first circuit board 310 while being somewhat pressed against the first circuit board 310.

Thus, the second circuit board 320 can maintain the state being coupled to the first circuit board 310, and the second connector 332 can maintain the connected state in the state of being seated in the first connector 331.

That is, in the state where the coupling member 350 is not fastened, the second connector 332 may be lifted from the first connector 331 by the elastic force of the sealing member 340. However, as the second circuit board 320 is pressed against the first circuit board 310 according to the fastening of the coupling members 350, the second connector 332 and the first connector 331 can be maintained in the connected state where the first and second connectors 331 and 332 are electrically connected to each other.

Because the assembly order of the apparatus 300 according to the fourth embodiment of the present disclosure are similar to that of the apparatus 300 according to the third embodiment, the foregoing description can be applied thereto.

Figure 28A:
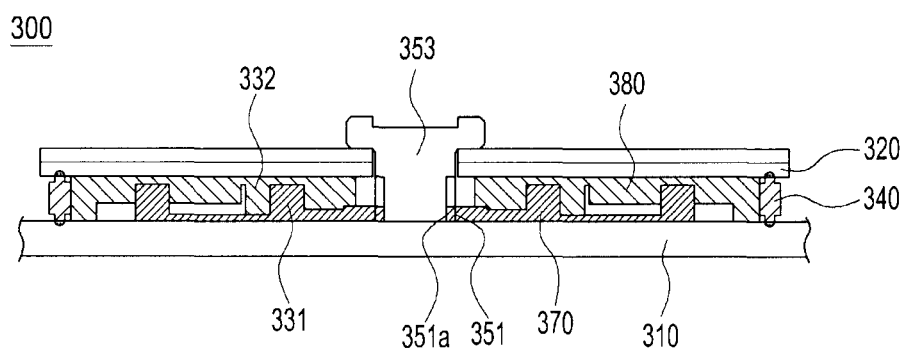
FIG. 28A and FIG. 28B are cross-sectional views illustrating the apparatus according to the fourth embodiment, when viewed in a first direction, in the electronic device according to various embodiments of the present disclosure.
Figure 28B:
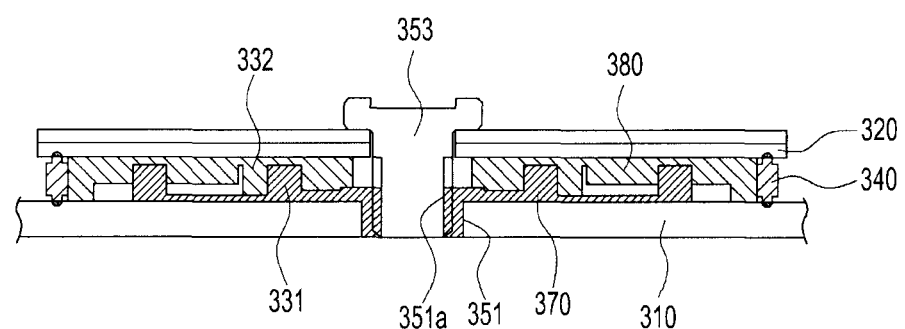

In addition, FIG. 28A illustrates the state where the first connector body 370 is provided with the coupling openings 351a. The fastening member 353 is configured to be seated in the coupling opening 351a through the coupling hole 352. In the case of FIG. 28B, an auxiliary fastening opening 354 may be further formed in the first circuit board 310 to be connected to the coupling opening 351a of the first connector body 370. When the first circuit board 310 and the second circuit board 320 face each other in the state where the first connector 331 and the second connector 332 are connected to each other, the auxiliary fastening opening 354, the coupling opening 351a, and the coupling hole 352 are aligned to each other, and the fastening member 350 may be introduced into and coupled to the connection hole 355, the coupling opening 351a and the auxiliary fastening opening 354 through the coupling hole 352.

The auxiliary fastening opening 354 may have a protrusion shape protruding as an opening is formed inward to extend from one face of the first circuit board 310 to the second circuit board 320 side. The auxiliary fastening opening 354 may protrude from one face of the first circuit board 310 and may be provided on the first circuit board 310 as a single body or separately. For example, the auxiliary fastening opening 354 may be provided in a form where a protrusion protrudes to the periphery of the opening formed in the first circuit board 310. Alternatively, the auxiliary fastening opening 354 may be provided to be seated separately from the openings formed in the first circuit board 310 and may be formed such that the peripheral portion thereof protrudes from one face of the first circuit board 310.

Hereinafter, a fifth embodiment of the apparatus 300 for electric coupling between circuit boards according to various embodiments of the present disclosure will be described with reference to FIGS. 29 to 35B.

The apparatus 300 according to the fifth embodiment of the present disclosure includes a fixing member 390, sealing member 340 on one circuit board 331 or 332 and a contact member 345 connected to the other one of circuit board 331 or 332. In describing the fifth embodiment of the present disclosure below, the descriptions of the first embodiment can be applied to the structure and configuration that are the same as those of the first embodiment.

Figure 29:
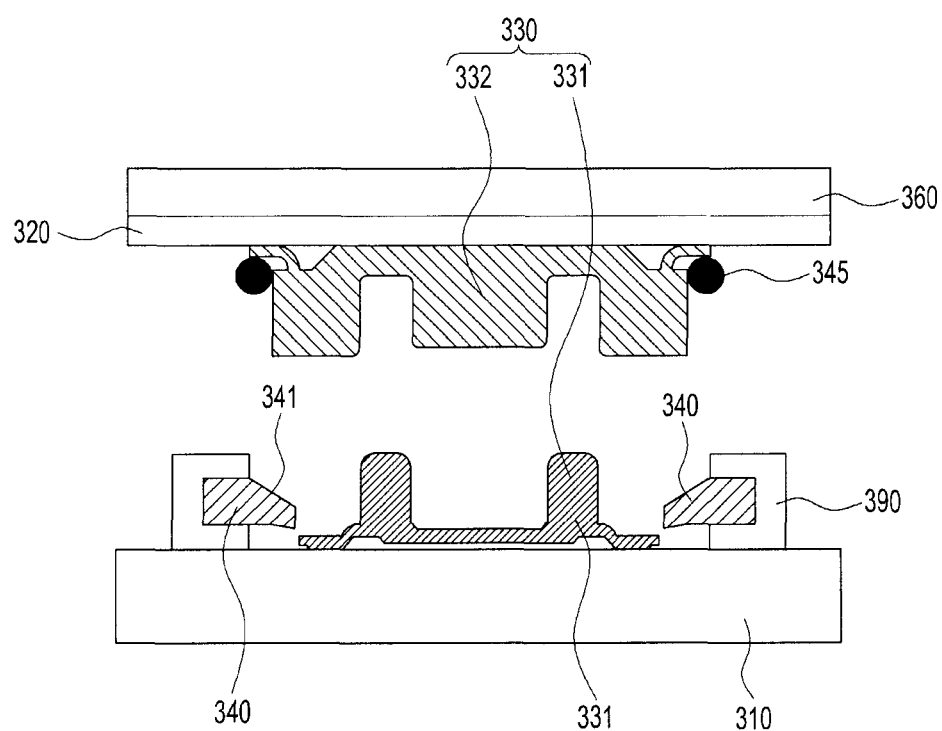
FIG. 29 is a view illustrating a apparatus according to a fifth embodiment in the disassembled state, in the electronic device according to various embodiments of the present disclosure.
Figure 30:
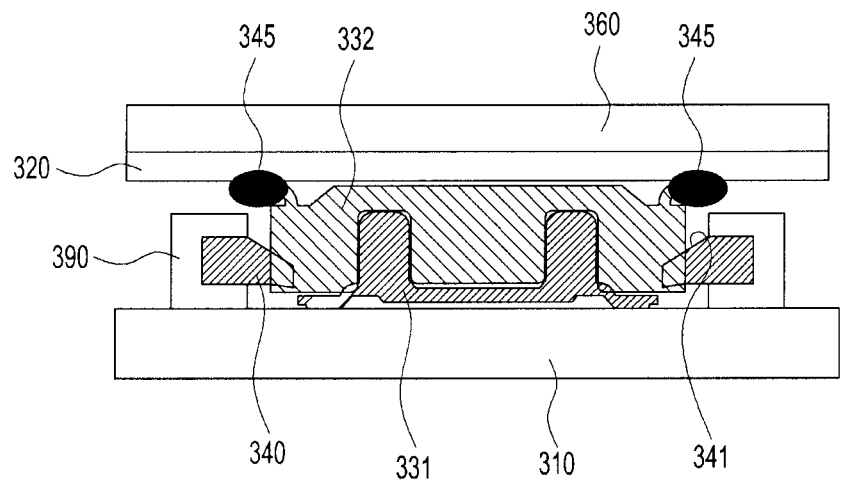
FIG. 30 is a view illustrating the apparatus according to the fifth embodiment in the assembled state, in the electronic device according to various embodiments of the present disclosure.
Figure 31:
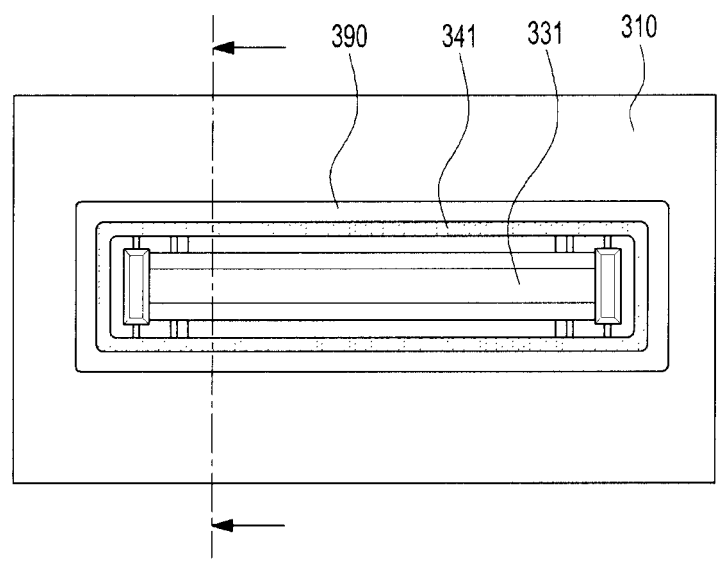
FIG. 31 is a plan view illustrating a state in which a sealing member of the apparatus according to the fifth embodiment is fixed to a first board unit, in the electronic device according to various embodiments of the present disclosure.
Figure 32:
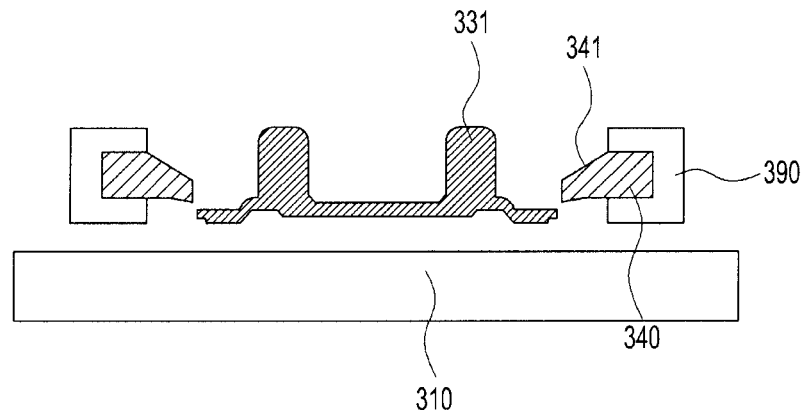
FIG. 32 is a cross-sectional view in a first direction in FIG. 31.
Figure 33:
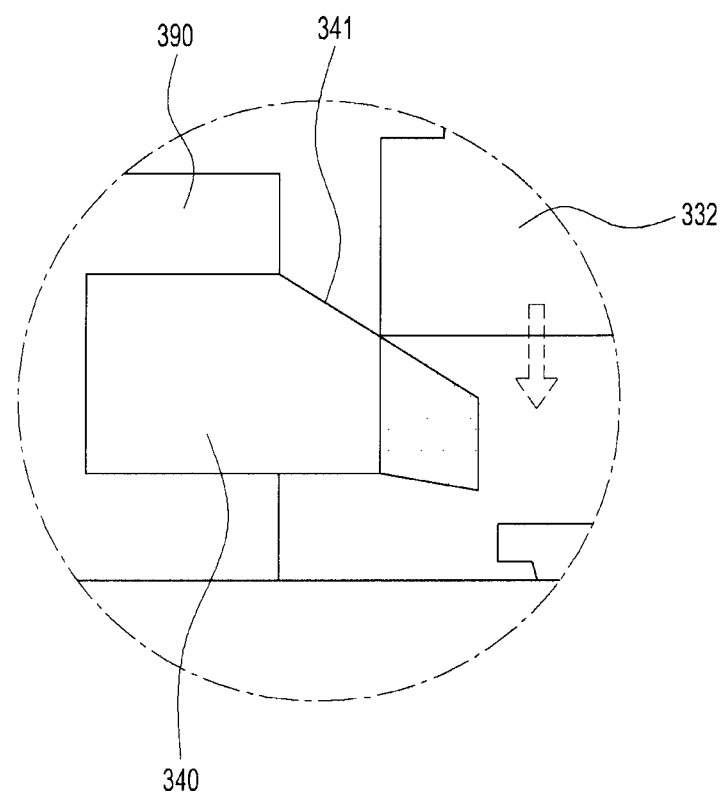
FIG. 33 is a view illustrating in detail a sealing face of a sealing member of the apparatus according to the fifth embodiment, in the electronic device according to various embodiments of the present disclosure.

FIG. 29 is a view illustrating the apparatus 300 according to the fifth embodiment in the disassembled state in the electronic device according to various embodiments of the present disclosure. FIG. 30 is a view illustrating the apparatus 300 according to the fifth embodiment in the assembled state in the electronic device according to various embodiments of the present disclosure. FIG. 31 is a plan view illustrating a state in which the sealing member 340 is fixed to the first circuit board 310 of the apparatus 300 according to the fifth embodiment in the electronic device according to various embodiments of the present disclosure. FIG. 32 is a cross-sectional view in a first direction in FIG. 31. FIG. 33 is a view illustrating in detail a sealing face of a sealing member of the apparatus 300 according to the fifth embodiment in the electronic device according to various embodiments of the present disclosure.

Referring to FIGS. 29 to 33, the apparatus 300 according to the fifth embodiment of the present disclosure may include the first circuit board 310 including the first connector 331, the second circuit board 320 including the second connector 332, the sealing member 340, the coupling member 350 (see FIGS. 34 and 35), and the reinforcing member 360, as described below.

As described above, the first circuit board 310 according to an embodiment of the present disclosure may be formed of a hard material, and the second circuit board 320 may be formed of a hard material or a flexible material. When the second circuit board 320 has a flexible substrate, one face of the second circuit board 320, specifically, the face opposite to the face where the second connector 332 is mounted may be connected to a reinforcing member 360.

The first circuit board 310 may be provided with the first connector 331, and the second circuit board 320 may be provided with the second connector 332 to be electrically connected to the first connector 331. The first connector 331 may be a female connector, and the second connector 332 may be a male connector. In the present embodiment, descriptions are made with reference to a case in which the first connector 331 is a female connector and the second connector 332 is a male connector, but the present disclosure is not limited thereto. On the contrary, the first connector 331 may be configured as a male connector, and the second connector 332 may be configured as a female connector.

The sealing member 340 according to an embodiment of the present disclosure may be coupled to a fixing member 390 provided on one of the first circuit board 310 and the second circuit board 320, and when the first circuit board 310 and the second circuit board 320 are assembled, the sealing member 340 may be positioned outside the male connector on which the female connector is seated so as to seal a gap between the first circuit board 310 and the second circuit board 320.

The sealing member 340 may be provided along the periphery of the apparatus 300 between the first circuit board 310 and the second circuit board 320. The apparatus 300 according to the fifth embodiment of the present disclosure is configured such that the second connector 332 configured as a male connector is provided to be seated in and connected to the first connector 331 configured as a female connector, and as a result, the sealing member 340 should be configured to be positioned outside the male connector. However, the sealing member 340 of the present disclosure may be provided with a fixing member 390 to be provided on a circuit board on which a female connector is mounted. For example, the female connector may be disposed inside the male connector, and the sealing member 340 may be disposed outside the male connector. Accordingly, when the sealing member 340 is mounted on the circuit board provided with a female connector, the fixing member 390 may be provided to fix the position of the sealing member 340 such that the sealing member 340 can be disposed around the outer periphery of the male connector that surrounds the female connector.

The fixing member 390 according to the fifth embodiment of the present disclosure may be provided on one of the first circuit board 310 and the second circuit board 320. Hereinafter, a description will be made with reference to a case where the first connector 331 is a female connector as an example, and thus it will be described that the fixing member 390 and the sealing member 340 are mounted on the first circuit board 310 on which the first connector 331 is mounted.

The fixing member 390 may be provided along the peripheral face of the first connector 331 on one surface of the first substrate unit 310 in a closed loop shape. The fixing member 390 may be disposed around the periphery of the first connector 331 to be spaced apart therefrom by the mounting space of the second connector 332 so that the second connector 332 may be seated.

The sealing member 340 according to an embodiment of the present disclosure may be provided so as to protrude toward the first connector 331 along the inner peripheral surface of the fixing member 390, and may be provided in a closed loop shape along the inner periphery of the fixing member 390.

A coupling groove 391 may be formed to be recessed on an inner peripheral face of the fixing member 390 such that one end of the sealing member 340 may be engaged with the coupling groove 391. The one end of the sealing member 340 can be fitted into and engaged with the coupling groove 391. Although it is described that one end of the sealing member 340 is fitted to and engaged with the coupling groove of the fixing member 390 in the embodiment of the present disclosure, the sealing member 340 may be provided to be hermetically coupled through a separate coupling member 350 (e.g., a sealable double-sided tape or resin material).

The other end of the sealing member 340 may protrude toward the first connector 331, and the second circuit board 320 may be seated on the first circuit board 310. That is, when the second connector 332 is engaged with the first connector 331, the other end of the sealing member 340 can come in closed contact with the outer peripheral face of the second connector 332. The surface of the other end of the sealing member 340, specifically the face facing the second circuit board 320 side, may be formed as an inclined sealing face 341. When the first circuit board 310 and the second circuit board 320 are mounted to face each other, the second connector 332 is pushed in the mounting direction by the elastic force of the sealing member 340 when the second connector 332 presses the sealing member 340 in the mounting direction since the sealing face 341 is provided on one face of the sealing member 340. However, the sealing member 340 is pushed by the second connector 332 so that the sealing member 340 and the second connector 332 are not engaged with each other, thereby resulting in the sealing member 340 and the second connector 332 separated, and not in closed contact with each other. Thus, the sealing member 340 has a sealing face 341 on one face of the sealing member 340 with which the second circuit board 320 is in contact so that, when the second connector 332 is seated on the first connector 331, the sealing member 340 may allow the second connector 332 to be moved along the sealing face 341 without being pushed by the second connector 332 and the sealing member 340 may come in closed contact with the outer peripheral face of the second connector 332.

The sealing member 340 according to an embodiment of the present disclosure is configured to be in closed contact with the outer face of the second connector 332 around the periphery of the first connector 331, and is different from the configuration that seals both the first circuit board 310 and the second circuit board 320 therebetween, like the sealing member of the first embodiment. That is, according to an embodiment of the present disclosure, since the sealing member 340 is configured to protrude to the outer face of the fixing member to be in closed contact with the outer face of the second connector in a state where the first circuit board 310 and the second circuit board 320 face each other while the first connector 331 and the second connector 332 are connected to each other, a space may be generated between the second circuit board 320 and the fixing member 390. Therefore, a contact member 345 may be provided so as to further seal the space between the second circuit board 320 and the fixing member 390. The contact member 345 may be made of a material, such as a resin.

The contact member 345 may be mounted along the periphery of the second connector 332 of the second circuit board 320, and the contact member 345 may be provided around the second connector 332 in the state where the second connector 332 is mounted on the second circuit board 320. The second circuit board 320 in the state where the contact member 345 is provided around the second connector 332 may be seated on the first circuit board 310 in the state where the fixing member 390 coupled with the sealing member 340 is provided around the first connector 331. when the second circuit board 320 faces the first circuit board 310, the first connector 331 is connected to the second connector 332 while being seated on the inside and the second connector 332, and the outer peripheral face of the second connector 332 comes in closed contact with the sealing member 340 so as to hermetically seal the inside of the first connector 331 and the second connector 332 in the connected state. Further, the contact member 345 may come in closed contact with and seal the space between the fixing member 390 and the second circuit board 320. Accordingly, in the state where the first circuit board 310 and the second circuit board 320 are connected to each other, the gap between the first circuit board 310 and the second circuit board 320 may be sealed from the outside by the sealing member 340 and the gap between the first circuit board 310 and the second circuit board 320 may be sealed from the outside by the contact member 345.

A coupling member 350 may be provided between the first circuit board 310 and the second circuit board 320 such that the connected state of the first connector 331 and the second connector 332 in the state where the first connector 331 and the second connector 332 are connected to each other.

The coupling structure of the apparatus 300 according to the fifth embodiment of the present disclosure may have the structure of one of the foregoing embodiments. For example, the apparatus may have the coupling structure as in the first embodiment or the coupling structure as in the third or fourth embodiment. Hereinafter, an embodiment of the coupling structure of the apparatus 300 according to the fifth embodiment will be described with reference to FIGS. 34A and 34B or FIGS. 35A and 35B.

Figure 34A:
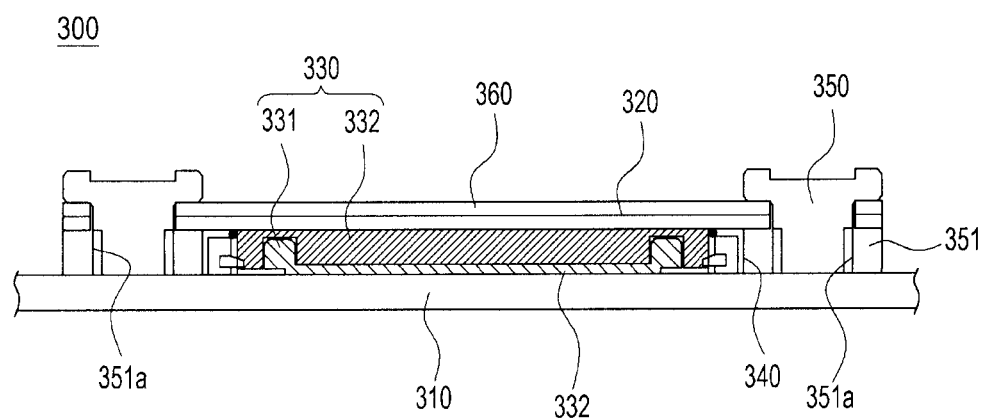
FIG. 34A and FIG. 34B are views illustrating an embodiment of a coupling structure of the apparatus according to the fifth embodiment, in the electronic device according to various embodiments of the present disclosure.
Figure 34B:
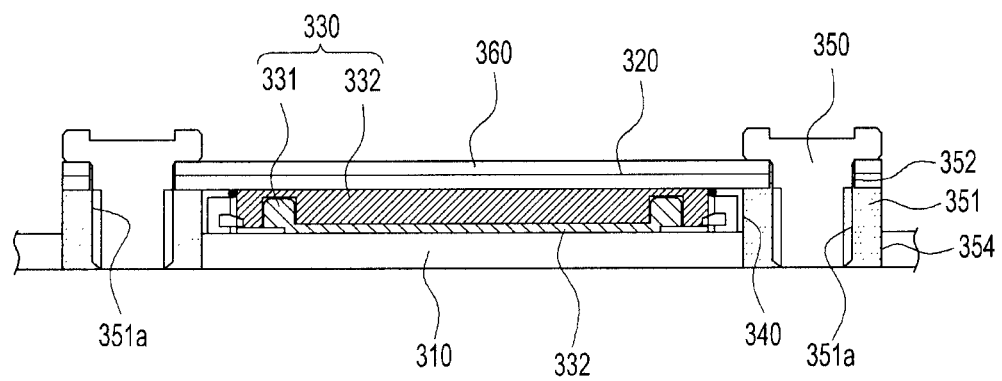

FIGS. 34A and 34B are views illustrating an embodiment of the coupling structure of the apparatus 300 according to the fifth embodiment in the electronic device according to various embodiments of the present disclosure.

The coupling member 350 according to the fifth embodiment of the present disclosure may have a structure similar to the coupling structure as described in the first embodiment. The coupling member 350 may include, for example, a coupling protrusion 351 including a coupling opening 351a provided in the first circuit board 310, a coupling hole 352 provided in the second circuit board 320, and a fastening member 353 fastened to the coupling opening 351a through the coupling hole 352.

Coupling protrusions 351 may be disposed on the opposite sides of the first connector 331, respectively, and a fixing member 390 including the sealing member 340 may be disposed between the coupling protrusions 351 disposed on the opposite sides of the first circuit board 310. The coupling hole 352 may be formed in the second circuit board 320, and the coupling hole 352 may be formed to be connected to the coupling protrusion in correspondence to the coupling opening 351a.

When the second connector 332 is connected to the first connector 331, the coupling hole 352 of the second circuit board 320 is connected to the coupling opening 351a of the first circuit board 310, and the fastening member 353 is fastened to the coupling opening 351a through the coupling hole 352 so that the second circuit board 320 may be fastened to the first circuit board 310 while being somewhat pressed against the first circuit board 310.

In addition, in the case where FIG. 34A, the fastening member 353 is configured to be seated in the coupling opening 351a through the coupling hole 352. In the case of FIG. 34B, an auxiliary fastening opening 354 may be further formed in the first circuit board 310 to be connected to the coupling opening 351a of the connector body 370. When the first circuit board 310 and the second circuit board 320 face each other in the state where the first connector 331 and the second connector 332 are connected to each other, the auxiliary fastening opening 354, the coupling opening 351a, and the coupling hole 352 may be connected to each other, and the fastening member 350 may be introduced into and coupled to the connection hole 355, the coupling opening 351a, and the auxiliary fastening opening 354 through the coupling hole 352.

The auxiliary fastening opening 354 may have a protrusion shape protruding as an opening is formed inward to extend from one face of the first circuit board 310 to the second circuit board 320 side. The auxiliary fastening opening 354 may protrude from one face of the first circuit board 310 and may be provided on the first circuit board 310 as a single body or separately. For example, the auxiliary fastening opening 354 may be provided in a form where a protrusion protrudes to the periphery of the opening formed in the first circuit board 310. Alternatively, the auxiliary fastening opening 354 may be provided to be seated separately from the openings formed in the first circuit board 310 and may be formed such that the peripheral portion thereof protrudes from one face of the first circuit board 310.

Figure 35A:
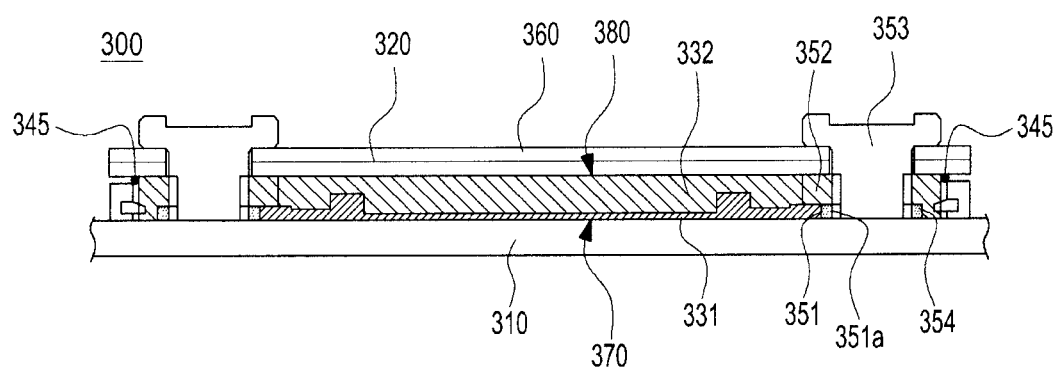
FIG. 35A and FIG. 35B are views illustrating another embodiment of the coupling structure of the apparatus according to the fifth embodiment, in the electronic device according to various embodiments of the present disclosure.
Figure 35B:
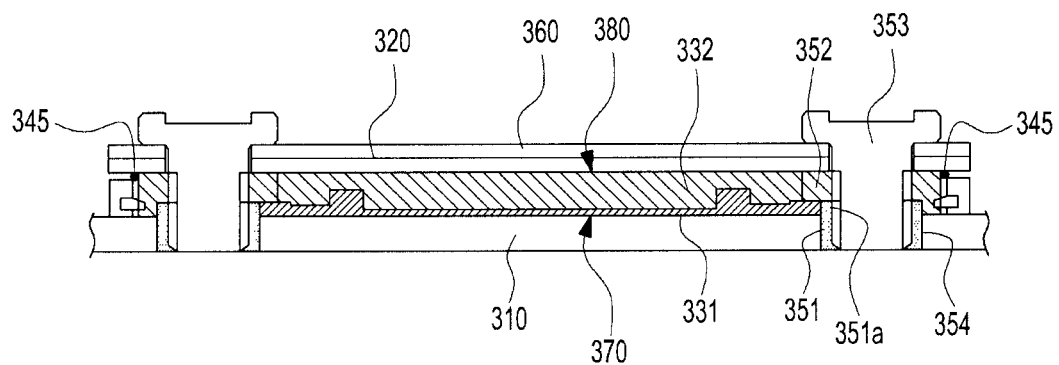

FIGS. 35A and 35B are views illustrating another embodiment of the coupling structure of the apparatus 300 according to the fifth embodiment in the electronic device according to various embodiments of the present disclosure.

Referring to FIGS. 35A and 35B, the apparatus 300 according to the fifth embodiment of the present disclosure may have a coupling structure similar to the coupling structure of the foregoing third embodiment.

For example, a coupling member 350 may be provided together with a connector 330 in the same member. That is, the first circuit board 310 may be provided with a first connector body 370 that includes a first connector 331 and a coupling protrusion 351, and the second substrate unit 320 may be provided with a second connector body 380 that includes a second connector 332 and a connection hole 355.

The first connector body 370 according to the fifth embodiment of the present disclosure may include, in the opposite end portions thereof, coupling protrusions 351, each having a coupling opening 351a, and a first connector 331 provided between the coupling openings 351a. That is, the first connectors 331 and the coupling opening 351a may be provided together in the first connector body 370.

In addition, the second connector body 380 may include, in the opposite end portions thereof, coupling openings 351a aligned with the coupling holes 352 of the second circuit board 320, and may include, between the coupling holes 352, a second connector 332 to be engaged with the first connector 331.

Here, when the first connector 331 is formed as a male connector, the second connector 332 may be formed as a female connector to be engaged with the male connector, and when the first connector 331 is formed as a female connector, the second connector 332 may be formed as a male connector. For example, the first connector body 370 according to the fifth embodiment of the present disclosure may be configured to be inserted into the inside of the second connector body 380. Alternatively, the second connector body 380 may be configured to be inserted into the first connector body 370.

In the fifth embodiment of the present disclosure, since the first connector body 370 is configured to be inserted into the second connector body 380, the fixing member 390 and the sealing member 340 mounted on the fixing member 390 may be provided on the first circuit board 310 along the outer peripheral face of the first connector body 380. However, when the second connector body 380 is configured to be inserted into the first connector body 370, the sealing member 340 is provided around the second circuit board 320 to be positioned along the outer peripheral face of the second connector body 380.

When the first connector body 370 is inserted into the second connector body 380, the first connector 331 and the second connector 332 may be coupled to be electrically connected to each other, and the coupling openings 351a of the first connector body 370 and the coupling holes 352 of the second connector body 380 may be aligned with each other. Due to this, the connection hole 355 and the coupling opening 351a may be aligned with each other from the coupling hole 352 of the second circuit board 320. The fastening members 353 can be fastened to the coupling openings 351a through the coupling holes 352, respectively, and can be fastened such that the second circuit board 320 is somewhat pressed against the first circuit board 310.

In addition, in the case where FIG. 35A, the fastening member 353 is configured to be seated in the coupling opening 351a through the coupling hole 352, and in the case of FIG. 35B, an auxiliary fastening opening 354 may be further formed in the first circuit board 310 to be connected to the coupling opening 351a of the connector body 370. When the first circuit board 310 and the second circuit board 320 face each other in the state where the first connector 331 and the second connector 332 are connected to each other, the auxiliary fastening opening 354, the coupling opening 351a, and the coupling hole 352 may be aligned with each other, and the fastening member 350 may be introduced into and coupled to the connection hole 355, the coupling opening 351a and the auxiliary fastening opening 354 through the coupling hole 352.

The auxiliary fastening opening 354 may have a protrusion shape protruding as an opening is formed inward to extend from one face of the first circuit board 310 to the second circuit board 320 side. The auxiliary fastening opening 354 may protrude from one face of the first circuit board 310 and may be provided on the first circuit board 310 as a single body or separately. For example, the auxiliary fastening opening 354 may be provided in a form where a protrusion protrudes to the periphery of the opening formed in the first circuit board 310. Alternatively, the auxiliary fastening opening 354 may be provided to be seated separately from the openings formed in the first circuit board 310 and may be formed such that the peripheral portion thereof protrudes from one face of the first circuit board 310.

Referring to the assembly order of the apparatus 300 according to the fifth embodiment of the present disclosure, as described above, the first connector 331 and the coupling opening 351 may be disposed on the first circuit board 310, and a fixing member 390 on which the sealing member 340 is seated may be disposed in the periphery of the first connector 331. In addition, on the second circuit board 320, a contact member may be disposed to be provided in the periphery of the second connector 332.

When the second circuit board 320 faces the first circuit board 310, the first connector 331 is connected to the second connector 332 while being seated on the inside and the second connector 332, and the outer peripheral face of the second connector 332 comes in closed contact with the sealing member 340 so as to hermetically seal the inside of the first connector 331 and the second connector 332 in the connected state. In this state, the coupling member 350 can couple the first circuit board 310 and the second circuit board 320 to each other. The coupling member 350 may have a structure as illustrated in in FIGS. 34A and 34B or FIGS. 35A and 35B described above.

For example, in the case where the connector 330 has the coupling structure as illustrated in FIGS. 34A and 34B, when the first connector 331 is seated on the second connector 332, the coupling openings 351a are connected to the coupling holes 352, and the fastening members 353 can be fastened to the coupling openings 351a through the coupling holes 352, respectively. Thus, a predetermined pressure may be generated between the first circuit board 310 and the second circuit board 320, and the sealing member 340 and the contact member may be more closely contacted between the first circuit board 310 and the second board 320.

In addition, for example, referring to the assembling order of the apparatus 300 in the case where the apparatus 300 has the coupling structure as illustrated in FIGS. 35A and 35B, the sealing member 340 may be provided on one face of the first circuit board 310 to be disposed around the periphery of the first connector body 380.

The fixing member 390 to which the sealing member 340 is coupled may be mounted on the first circuit board 310 around the first connector body 370, and may be provided to be spaced apart from the first connector body 370 by a predetermined space. The predetermined space may become a space in which the second connector body 380 provided on the second circuit board 320 may be seated while covering the first connector body 370. When the second circuit board 320 is superimposed on the first connector body 370, the second connector body 380 may enclose the first connector body 370, the first connector 331 and the second connector 332 may be connected to each other, the coupling opening 351a may be aligned with the coupling hole 352 and the connection hole 355, and the sealing member 340 may come in closed contact with the outer periphery of the second connector body 380 that encloses the first connector body 370. Further, the contact member 345 may come in closed contact with the space between the fixing member 390 and one face of the second circuit board 320.

Hereinafter, a sixth embodiment of the apparatus 300 for electric coupling between circuit boards according to various embodiments of the present disclosure will be described with reference to FIG. 36.

The apparatus 300 according to the sixth embodiment of the present disclosure includes a fixing member 390 on one of the circuit boards 310 or 320 holding a sealing member 341, such that the sealing member protrudes towards the other one of the circuit boards 310 or 320. In describing the sixth embodiment of the present disclosure below, the descriptions of the foregoing embodiments can be applied to the structure and configuration that are the same as those of the foregoing embodiments.

Figure 36:
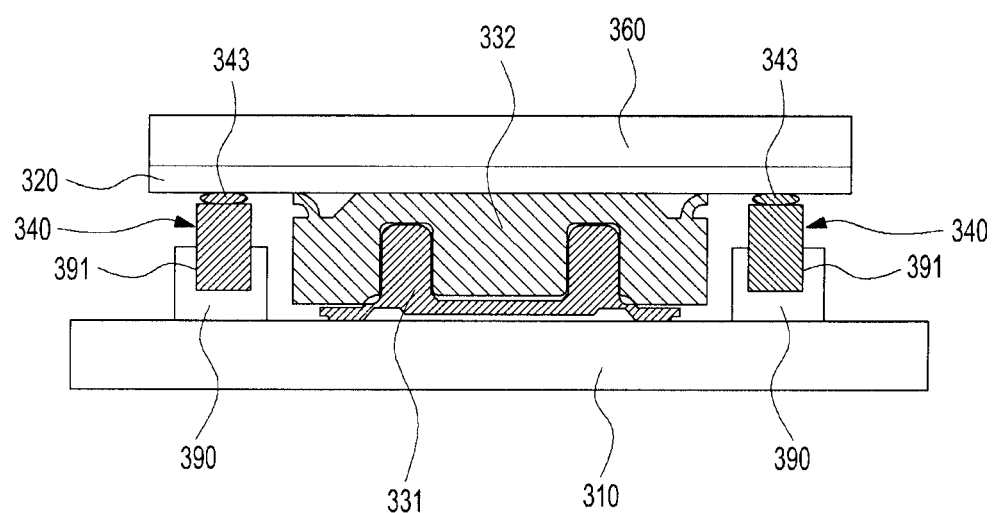
FIG. 36 is a view illustrating an apparatus according to a sixth embodiment in the assembled state, in the electronic device according to various embodiments of the present disclosure.

FIG. 36 is a view illustrating an apparatus 300 according to the sixth embodiment assembled in the electronic device of the present disclosure.

Referring to FIG. 36, in the apparatus 300 of the sixth embodiment, the sealing member 340 may be mounted in a recessed groove 391 formed along the periphery of the upper face of the fixing member 390. The sealing member 340 may protrude toward the first circuit board 310 (as shown in FIG. 36) or the second circuit board 320 side.

For example, when the fixing member 390 is disposed on the first circuit board 310, the fixing member 390 may be provided on first circuit board 310 in a closed loop shape around the first connector 331. The recessed groove 391 may be formed to be opened toward the second circuit board 320. The sealing member may be provided such that one end of the sealing member 340 is seated or in closed contact with the recessed groove 391 and the other end of the sealing member 340 protrudes toward one face of the second circuit board 320 to be in closed contact with the second circuit board 320. In addition, a pressing protrusion 343, which is pushed by the second circuit board 320, may be formed in a portion between the sealing member 340 and the second circuit board 320 side to come in contact with one face of the second circuit board 320.

Accordingly, the first connector 331 and the fixing member 390 spaced apart from the first connector 331 by a predetermined space around the first connector 331 may be provided on one face of the first circuit board 310, and the sealing member 340 may be provided to protrude from the fixing member 390 toward the second circuit board 320 side. In addition, the second connector 332 may be mounted on one face of the second circuit board 320. When one face of the second circuit board 320 faces one face of the first circuit board 310 and the first connector 331 is connected to the second connector 332, one end of the sealing member 340, which protrudes from the fixing member 390 provided on the first circuit board 310, specifically, the pressing protrusion 343 can seal the first connector 331 and the second connector 332 from the outside by coming in contact with the one face of the second circuit board 320 to be pressed.

Since the configuration of the coupling member according to the present embodiment of the present disclosure may have the same coupling structure as those of the foregoing first to fifth embodiments, and the descriptions of the foregoing embodiments can be applied to the coupling structure according to the present embodiment. That is, a fastening member 353 can be disposed inside a coupling opening provided in the first circuit board 310, and a coupling hole in the second circuit board 320.

Hereinafter, a seventh embodiment of the apparatus 300 for electric coupling between circuit boards according to various embodiments of the present disclosure will be described with reference to FIGS. 37 to 41.

The apparatus 300 according to the seventh embodiment of may have a fixing member 395 and sealing member 340 with a protruding portion 342 and inclined sealing face 342a where the inclined sealing face 342a presses against the fixing member 395. The seventh embodiment may have a structure in which the sealing member 340 and the fixing member 395 are mounted on different circuit boards. In describing the seventh embodiment of the present disclosure below, the certain portions of the descriptions of the foregoing first and fifth embodiments can be applied to the structure and configuration.

Figure 37:
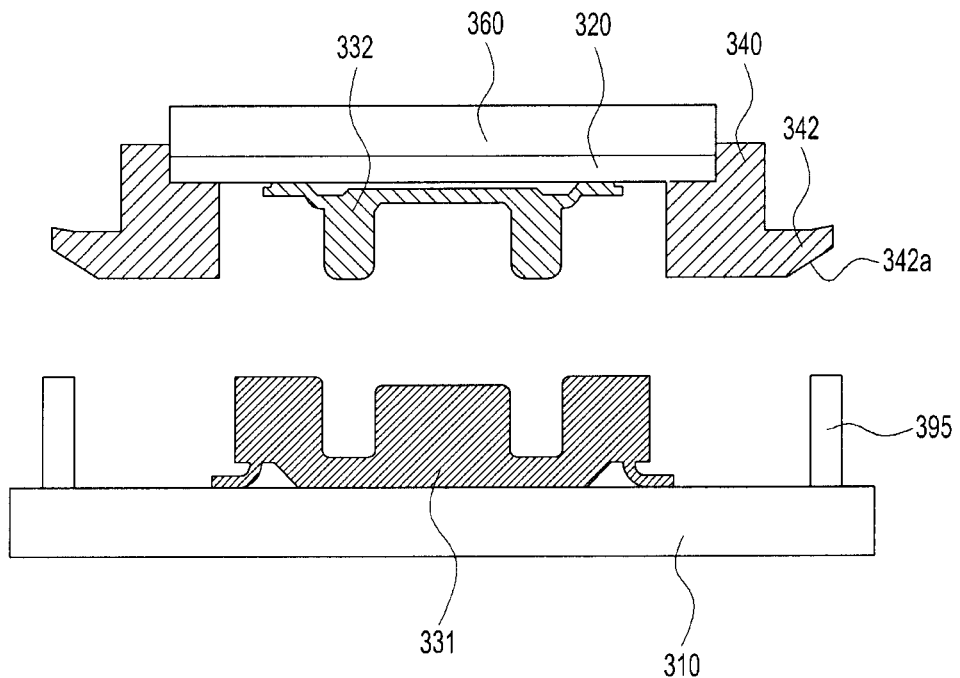
FIG. 37 is a view illustrating an apparatus according to a seventh embodiment in the disassembled state, in the electronic device according to various embodiments of the present disclosure.
Figure 38:
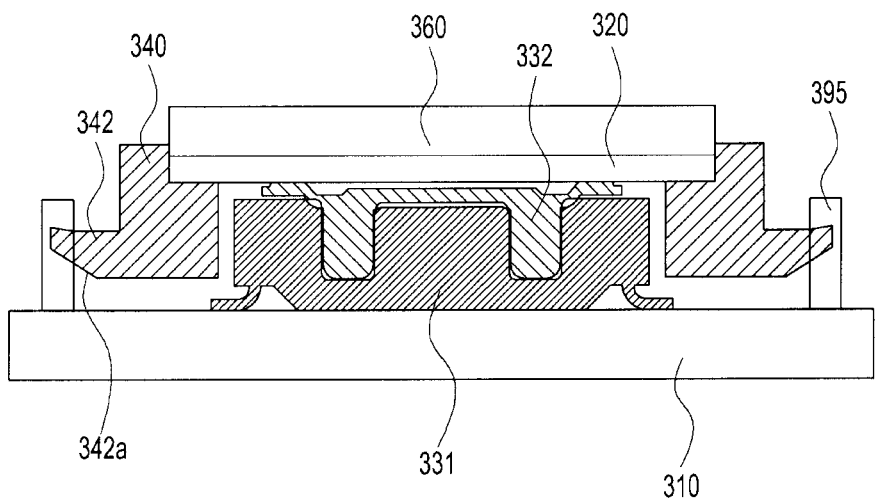
FIG. 38 is a view illustrating the apparatus according to the seventh embodiment in the assembled state, in the electronic device according to various embodiments of the present disclosure.
Figure 39:
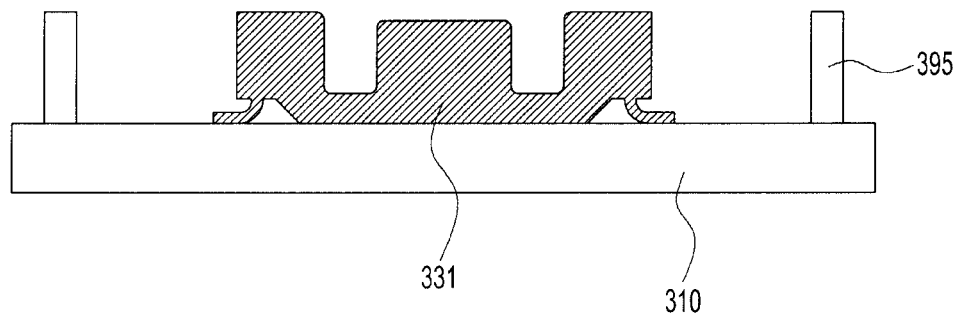
FIG. 39 is a cross-sectional view illustrating a first circuit board of the apparatus according to the seventh embodiment, in the electronic device according to various embodiments of the present disclosure.

FIG. 37 is a view illustrating the apparatus 300 according to the seventh embodiment in the disassembled state in the electronic device according to various embodiments of the present disclosure. FIG. 38 is a view illustrating the apparatus 300 according to the seventh embodiment in the assembled state in the electronic device according to various embodiments of the present disclosure. FIG. 39 is a cross-sectional view illustrating a first circuit board 310 of the apparatus 300 according to the seventh embodiment in the electronic device according to various embodiments of the present disclosure.

Referring to FIGS. 38 and 39, the apparatus 300 of the seventh embodiment of the present disclosure may include the first circuit board 310 including the first connector 331, the second circuit board 320 including the second connector 332, the sealing member 340, and the reinforcing member 360. The first circuit board 310 may be provided with the first connector 331, and the second circuit board 320 may be provided with the second connector 332 to be electrically connected to the first connector 331 of the first circuit board 310. The first connector 331 according to one embodiment may be a male connector, and the second connector 332 may a female connector. In the FIGS. 37 and 38, the first connector 331 is a male connector and the second connector 332 is a female connector, but the present disclosure is not limited thereto. Alternatively, the first connector 331 may be a female connector, and the second connector 332 may be a male connector.

By way of example, the fixing member 395 according to the seventh embodiment of the present disclosure may be provided on one of the first circuit board 310 and the second circuit board 320, and the sealing member 340 may be provided on the remaining one of the first circuit board 310 and the second circuit board 320.

The fixing member 395 may be provided on the peripheral face of the first connector 331 that is configured as a male connector on one surface of the first substrate unit 310 in a closed loop shape. The fixing member 395 may be disposed around the periphery of the first connector 331 to be spaced apart therefrom by a contact space between the width of the sealing member 340 and the combined width of the sealing member 340 and the protrusion 342, so that the sealing member 340 may be seated between the second connector 332 and the fixing member 395, allowing the inclined sealing face to apply lateral pressure against the fixing member 395.

The sealing member 340 according to an embodiment of the present disclosure may be provided on one of the first circuit board 310 and the second circuit board 320, and the fixing member 395 is mounted on the other one of the first circuit board 310 and the second circuit board 320. It may be described in FIGS. 38-39 that the fixing member 395 of the present disclosure is mounted on the first circuit board 310 around the first connector 331, and the sealing member 340 is mounted on the second circuit board 320 around the periphery of the second connector 332. The sealing member 340 of the present disclosure may be configured to be coupled to the second circuit board 320 along the outer periphery of the second connector 332 configured as a female connector, and the fixing member 395 may be provided on the first circuit board 310 around the periphery of the first connector 331 configured as a male connector such that the fixing member 395 can come in closed contact with the sealing member 340 according to the coupling of the first circuit board 310 and the second circuit board 320 to each other.

The sealing member 340 may be provided along the periphery of the apparatus 300 between the first circuit board 310 and the second circuit board 320. The apparatus 300 according to the seventh embodiment of the present disclosure is configured such that the second connector 332 is a female connector is provided to be seated in the first connector 331 configured as a male connector, and as a result, the sealing member 340 should be configured to be positioned outside the male connector. However, the sealing member 340 of the present disclosure may be provided such that, when the second circuit board 320 is seated on the first circuit board 310 in the state where the sealing member 340 of the present disclosure is coupled to the periphery of the second connector 332, the sealing member 340 comes in closed contact with the fixing member 395 around the periphery of the first circuit board 310 on which the female connector is mounted.

For example, the first substrate portion 310 may include a first connector 331 that is a female connector and a fixing member spaced apart from the periphery of the female connector by a predetermined space and protruding towards the second substrate portion 320. In addition, the second connector 332 configured as a male connector and the sealing member 340 around the male connector may be fixedly coupled to the second circuit board 320.

One end of the sealing member 340 according to an embodiment of the present disclosure may be coupled along the outer periphery of the second circuit board 320 and may be spaced apart from the second connector 332 by a predetermined distance, so that the outer (top-most surface) face of the first connector 331 may be provided to be disposed between the second circuit board 320 and the sealing member 340.

In addition, the outer surface of the sealing member 340 may be provided to protrude toward the fixing member 395 side so that the protruding portion 342 is in closed contact with the inner face of the fixing member 395 so as to seal the periphery of the first connector 331 and the second connector 332. An inclined sealing face 342a may be provided on a face of the protruding portion 342 of the sealing member 340 which is in contact with the fixing member 395, applying a lateral force, thereby hermitically sealing the first connector 331 and the second connector 332. The sealing face 342a may be provided such that when the second circuit board 320 is disposed on the first circuit board 310, the sealing face of the sealing member 340 is introduced into and comes into closed contact with the inside of the fixing member 395, and when the sealing member 340 is pressed, the sealing member 340 is prevented from being pushed or deformed, thereby preventing a situation in which the sealing member 340 and the fixing member do not completely closed contact with each other or are not engaged. That is, the inner surface of the fixing member 395 may be provided so as to be in closed contact with the sealing member 340 along the sealing surface 342a.

The coupling structure of the apparatus 300 according to the seventh embodiment of the present disclosure may have the structure of one of the foregoing embodiments. Hereinafter, an embodiment of the coupling structure of the apparatus 300 according to the seventh embodiment will be described with reference to FIGS. 40 and 41.

Figure 40:
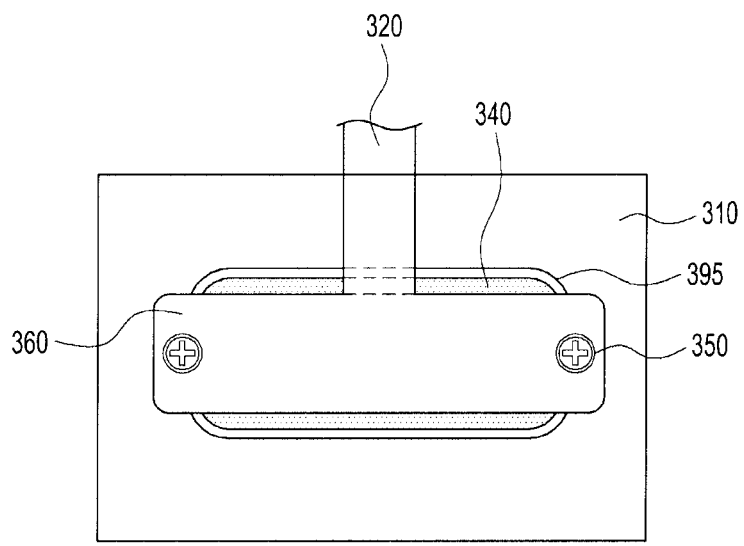
FIG. 40 is a view illustrating an embodiment of a coupling structure of the apparatus according to the seventh embodiment, in the electronic device according to various embodiments of the present disclosure.

FIG. 40 is a view illustrating an embodiment of a coupling structure of the apparatus 300 according to the seventh embodiment in the electronic device according to various embodiments of the present disclosure.

The coupling member 350 according to the seventh embodiment of the present disclosure may have a coupling structure described in the foregoing embodiments, for example, in the first embodiment (in the following description of the apparatus according to the seventh embodiment, FIGS. 10 and 17 may also be referred in describing the coupling structure according to an embodiment). That is, the coupling member 350 may include, for example, a coupling protrusion 351 including a coupling opening 351a provided in the first circuit board 310, a coupling hole 352 provided in the second circuit board 320, and a fastening member 353 fastened to the coupling opening 351a through the coupling hole 352. Coupling protrusions 351 may be disposed on the opposite sides of the first connector 331, respectively, and a fixing member 395 including the sealing member 340 may be disposed between the coupling protrusions 351 disposed on the opposite sides of the first circuit board 310. The coupling hole 352 may be formed in the second circuit board 320, and the coupling hole 352 may be formed to be aligned with the coupling opening 351a in correspondence to the coupling protrusion 351.

In the state where the second connector 332 is connected to the first connector 331, the coupling hole 352 of the second circuit board 320 is aligned with the coupling opening 351a of the first circuit board 310, and the fastening member 353 is fastened to the coupling opening 351a through the coupling hole 352 so that the second circuit board 320 may be fastened to the first circuit board 310 while being somewhat pressed against the first circuit board 310.

Thus, the second circuit board 320 can be maintained in the state of being coupled to the first circuit board 310, and the first connector 331 and the second connector 332 can maintain the connected state thereof.

Figure 41:
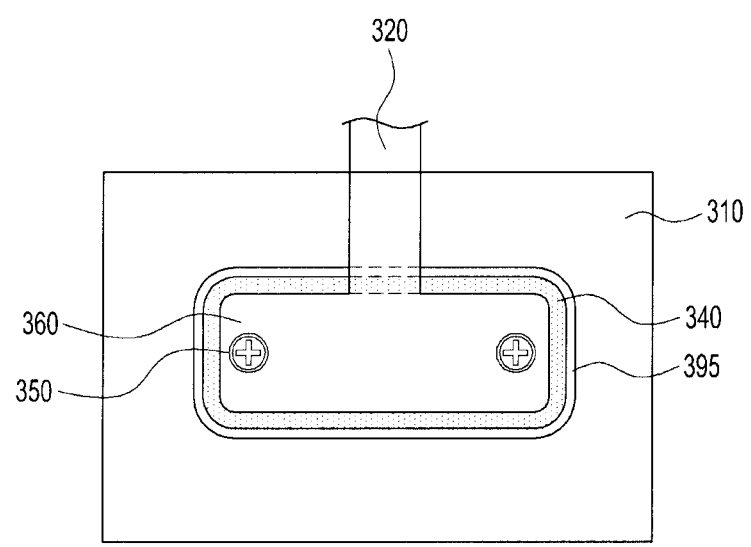
FIG. 41 is a view illustrating another embodiment of a coupling structure of the apparatus according to the sixth embodiment, in the electronic device according to various embodiments of the present disclosure.

FIG. 41 is a view illustrating an embodiment of the coupling structure of the apparatus 300 according to the seventh embodiment in the electronic device according to various embodiments of the present disclosure.

Referring to FIG. 41, the apparatus 300 according to the seventh embodiment of the present disclosure may have a coupling structure that is the same as that described in the foregoing third embodiment (in the following description of the connector according to the seventh embodiment, FIGS. 22A and 22B may also be referred in describing the coupling structure according to another embodiment). That is, the apparatus 300 may have a structure that includes both the coupling member 350 and the apparatus 300. In addition, due to this coupling structure, the sealing member 340 may be disposed outside the connector 330 that includes the coupling member 350.

The apparatus 300 including the coupling structure according to an embodiment of the present disclosure may have a structure as in the above-described third embodiment, in which the first circuit board 310 is provided with the first connector body 370 and the second circuit board 320 is provided with the second connector body 380.

The first connector body 370 may be provided with both the above-described first connector 331 and the coupling member 350, and the second connector body 380 may be formed with both the above-described second connector 332 and coupling member 350.

The first connector body 370 according to the seventh embodiment of the present disclosure may include, in the opposite end portions thereof, coupling protrusions 351, each having a coupling opening 351a, and a first connector 331 provided between the coupling openings 351a. In addition, the second connector body 380 may include, in the opposite end portions thereof, connection holes 355 aligned with the coupling openings 351a and the coupling holes 352, and may include, between the connection holes, a second connector 332 to be engaged with the first connector 331.

Here, when the first connector 331 is a male connector, the second connector 332 may be a female connector to be engaged with the male connector, and when the first connector 331 is a female connector, the second connector 332 may be a male connector. For example, that the second connector body of the second connector 332 according to the seventh embodiment of the present disclosure may be configured to be inserted into the inside of the first connector body of the first connector 331.

In the seventh embodiment of the present disclosure, the fixing member 395 may be disposed around the first connector body 370, and the fixing member 395 and the outer face of the first connector body 370 may be spaced apart from each other so as to form a sealable space in which the sealing member 340 can be seated.

The sealing member 340 may be provided along the outer periphery of the first connector body 370, and when the second connector body 380 is inserted into the first connector body 370, the sealing member 340 can seal a gap between the second circuit board 320 and the fixing member 395 so that the first connector body 370 and the second connector body 380 can be sealed from the outside.

In addition, when the first connector body 370 is inserted into the second connector body 380, the first connector 331 and the second connector 332 may be coupled to be electrically connected to each other, the coupling openings 351a of the first connector body 370 and the connection holes 355 and the coupling holes 352 of the second connector body 380 may be aligned with each other, and the fastening members 353 may be fastened to the coupling openings 351a through the coupling holes 352 so that the second circuit board 320 can be fastened to the first circuit board 310 while being somewhat pressed against the first circuit board 310. Thus, the second circuit board 320 can maintain the state being coupled to the first circuit board 310, and the second connector 332 can maintain the connected state in the state of being seated in the first connector 331

In addition, even in the coupling structure of the present disclosure, the first circuit board 310 may be provided with an auxiliary fastening opening 354 connected to the coupling opening 351a, and a fastening member may be introduced through the auxiliary fastening opening 354 to be coupled to the auxiliary fastening opening 354.

Referring to the assembly order of the apparatus 300 according to the seventh embodiment of the present disclosure, as described above, the fixing member 395 may be disposed to be spaced apart by a predetermined interval from the periphery of the mounted connector body of the first connector 331.

The second circuit board 320 in the state where the sealing member 340 is provided around the second connector 332 may be seated on the first circuit board 310 in the state where the fixing member 390 coupled with the sealing member 340 is provided around the first connector 331. When the second circuit board 320 faces the first circuit board 310, the second connector 332 may be connected to the first connector 331 while being seated in the inside of the first connector 331, and the sealing member 340 may come in closed contact with the inner face of the fixing member 395. In this state, the coupling force between the first circuit board 310 and the second circuit board 320 can be maintained due to the coupling member 350. For example, in the case where the coupling structure has the structure as illustrated in FIG. 40, when the first connector 331 is seated on the second connector 332, the coupling openings 351a are aligned with the coupling holes 352, and the fastening members 353 can be fastened to the coupling openings 351a through the coupling holes 352, respectively. Thus, a predetermined pressure may be generated between the first circuit board 310 and the second circuit board 320, and the sealing member 340 and the contact member 345 may form a better closed contact between the first circuit board 310 and the second board 320.

In addition, for example, when the coupling structure has the structure as illustrated in FIG. 41, the coupling members 350 may be disposed through the sealing member 340 and the fixing member 395.

That is, when the sealing member 340 comes in closed contact with the inside of the fixing member 395, the first connector body 370 and the second connector body 380 are provided in the inside thereof so that the coupling member 350 will be positioned inside the sealing member 340. In this state, the fastening members 353 can be fastened to the coupling openings 351a through the coupling holes 352, respectively, so as to couple the first circuit board 310 and the second circuit board 320 to each other.

Hereinafter, an eighth embodiment of the apparatus 300 for electric coupling between circuit boards according to various embodiments of the present disclosure will be described with reference to FIGS. 42 to 46.

In the apparatus 300 according to the eighth embodiment of the present disclosure at least one of the first circuit board 310 and the second circuit board 320 include a seating opening 315 inwardly recessed from the surface thereof, and one of the first connector 331 and the second connector 332 is mounted in the seating opening 315.

In describing the eighth embodiment of the present disclosure, the descriptions of the foregoing embodiments can be applied to the structure and configuration that are the same as those of the foregoing embodiments, and only the different configurations can be described.

Figure 42:
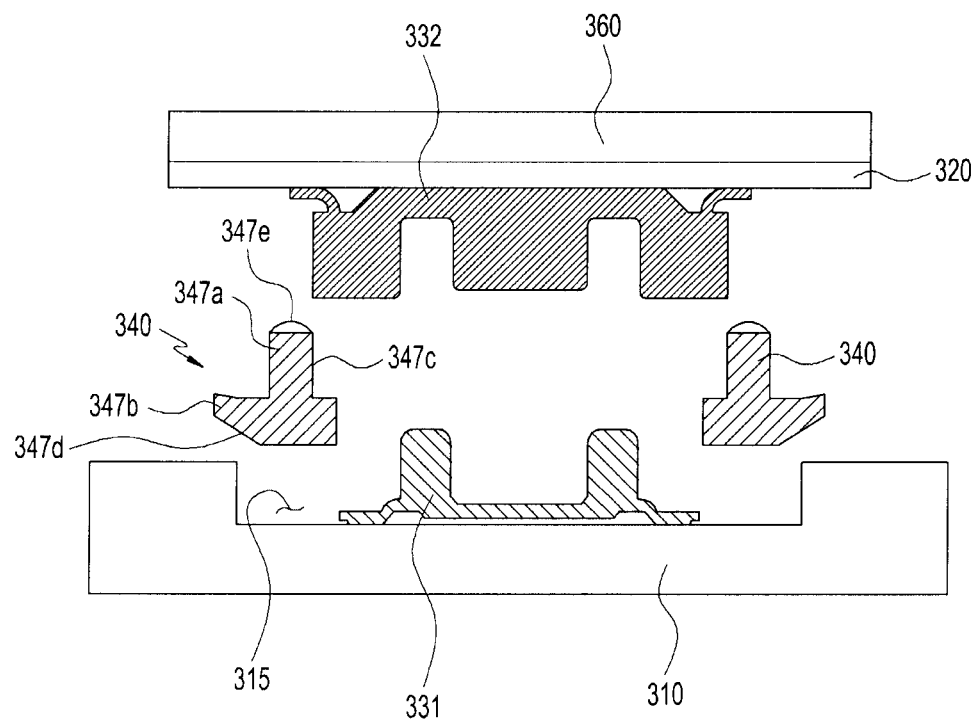
FIG. 42 is a view illustrating an apparatus according to an eighth embodiment in the disassembled state, in the electronic device according to various embodiments of the present disclosure.
Figure 43:
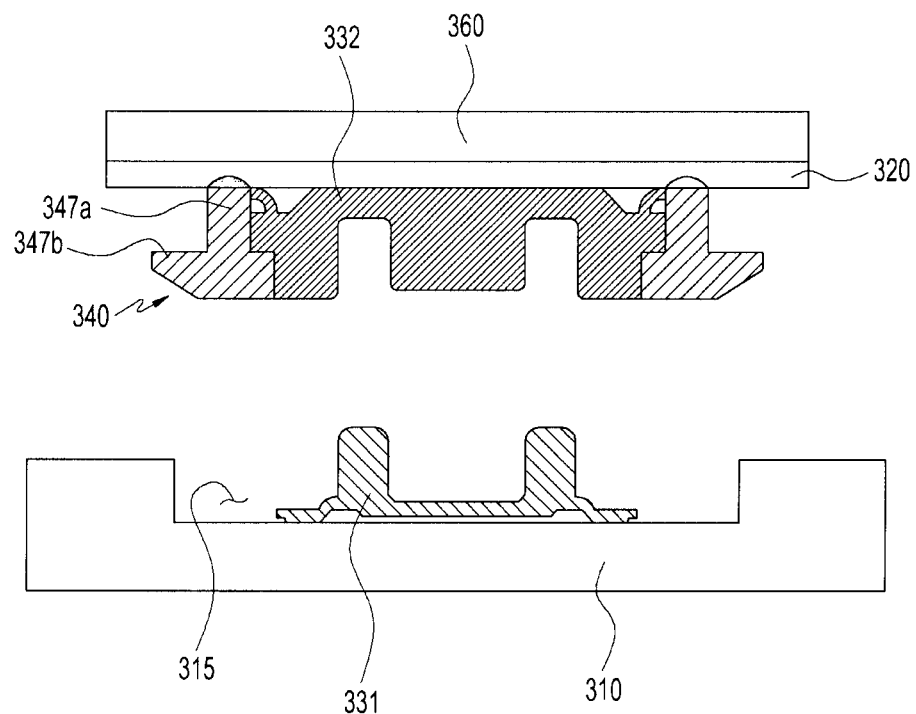
FIG. 43 is a view illustrating a first circuit board and a second circuit board to which a sealing member of the apparatus according to the eight embodiment is coupled, in the disassembled state, in the electronic device according to various embodiments of the present disclosure.
Figure 44:
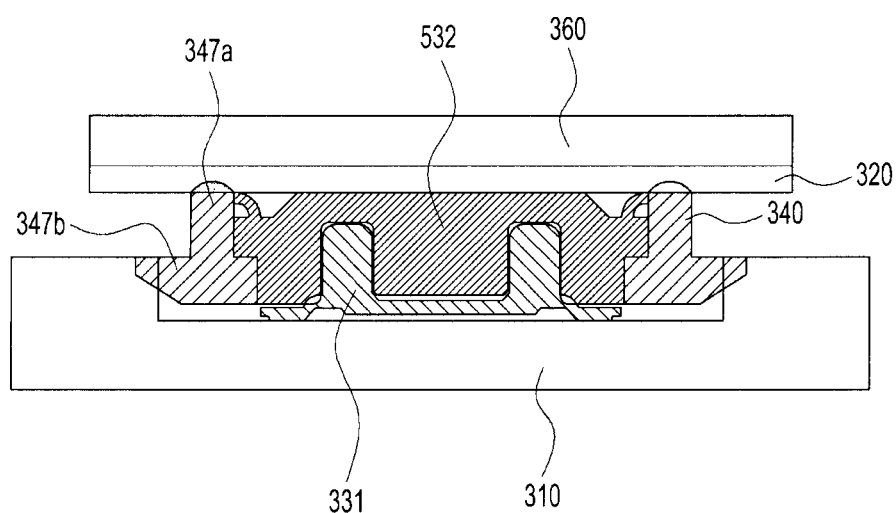
FIG. 44 is a view illustrating the apparatus according to the eighth embodiment in the assembled state, in the electronic device according to various embodiments of the present disclosure.
Figure 45:
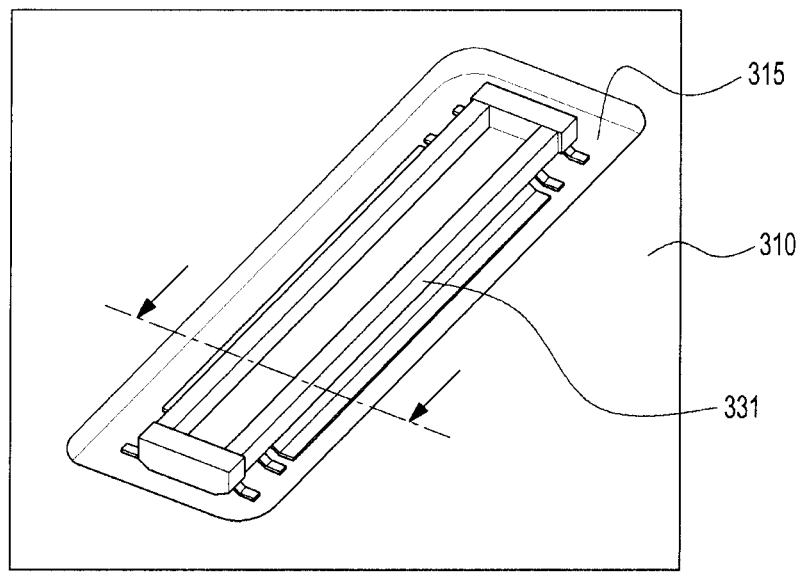
FIG. 45 is a cross-sectional view illustrating a first circuit board of the apparatus according to the eighth embodiment, in the electronic device according to various embodiments of the present disclosure.
Figure 46:
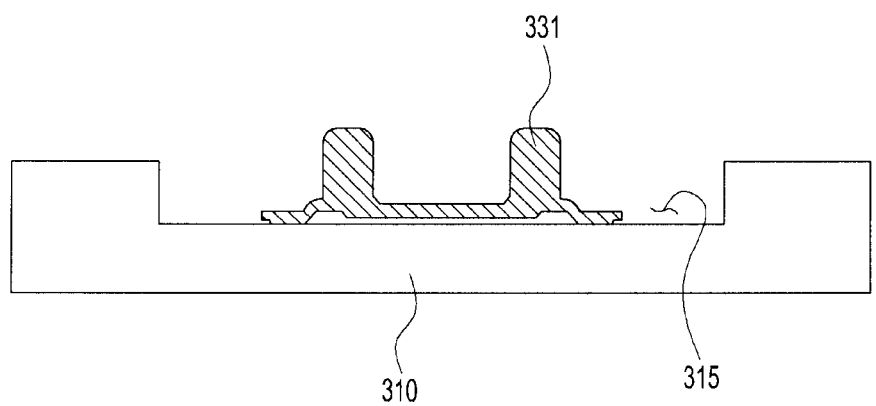
FIG. 46 is a cross-sectional view illustrating the first circuit board of the apparatus according to the eighth embodiment, when viewed in a first direction, in the electronic device according to various embodiments of the present disclosure.

FIG. 42 is a view illustrating the apparatus 300 according to the eighth embodiment in the disassembled state in the electronic device according to various embodiments of the present disclosure. FIG. 43 is a view illustrating the first circuit board 310 and the second circuit board 320 to which a sealing member of the connector 340 of the apparatus 300 according to the eighth embodiment is coupled, in the disassembled state, in the electronic device according to various embodiments of the present disclosure. FIG. 44 is a view illustrating the apparatus 300 according to the eighth embodiment in the assembled state in the electronic device according to various embodiments of the present disclosure. FIG. 45 is a cross-sectional view illustrating the first circuit board 310 of the apparatus 300 according to the eighth embodiment in the electronic device according to various embodiments of the present disclosure. FIG. 46 is a cross-sectional view illustrating the first circuit board 310 of the apparatus 300 according to the eighth embodiment, when viewed in a first direction, in the electronic device according to various embodiments of the present disclosure.

Referring to FIGS. 42 to 46, the apparatus 300 of the eighth embodiment of the present disclosure may include the first circuit board 310 including the first connector 331, the second circuit board 320 including the second connector 332, the sealing member 340, the coupling member 350, and the reinforcing member 360, as described above. At least one of the first circuit board 310 and the second circuit board 320 of the present disclosure may be provided with a seating opening 315 in which the first connector 331 or the second connector 332 to be mounted on the first circuit board 310 or the second circuit board 320 can be seated.

Hereinafter, it may be described, as an example, that the seating opening 315 may be provided on the first circuit board 310 and the second circuit board 320 is provided with the reinforcing member 360, as an example, but the present disclosure is not limited thereto. For example, the seating opening 315 may be provided on the first circuit board 310 and the second circuit board 320 may be made of a hard material such that no reinforcing member 360 is provided. Further, various changes and modifications can be made. For example, the seating opening 315 may be formed in the second circuit board 320, and the first circuit board 310 may be made of a flexible or hard board.

The seating opening 315 may be formed in the first circuit board 310 in the form of being inwardly recessed from the surface of the first circuit board 310, and the first connector 331 may be provided to the seating opening 315.

The second connector 332 may be provided on one face of the second circuit board 320 to be electrically connected to the first connector 331 of the first circuit board 310. The first connector 331 according to an embodiment of the present disclosure may be a male connector, and the second connector 332 may be a female connector. In the present embodiment, descriptions are made with reference to a case in which the first connector 331 is a male connector and the second connector 332 is a female connector, but the present disclosure is not limited thereto. Alternatively, the first connector 331 may be configured as a female connector, and the second connector 332 may be configured as a male connector.

According to an embodiment of the present disclosure, the sealing member 340 may have a structure that comes in closed contact with the inner face of the seating opening 315 and one face of the second circuit board 320 to seal the first connector 331 and the second connector 332 so as not to be exposed to the outside.

The sealing member 340 may be provided to protrude toward the inner face of the seating opening 315 such that the inner face 347c is capable of coming in closed contact with the outer face of the second connector 332 configured by a male connector and outer face 347b of the sealing member 340 is capable of coming in closed contact with the inner periphery of the seating opening 315 so as to provide a seal effect. The face of the protruding portion of the sealing member 340, which faces the seating opening 315, may form an inclined sealing face 347d.

The inner face 347c of the sealing member 340 comes in closed contact with the outer face of the second connector 332 configured as a male connector, and one face 347e (the top face with reference to FIG. 44) of the sealing member 340 can be closely coupled to one face of the second circuit board 320. The sealing member 340 of the present disclosure may be provided such that as the second circuit board 320 is coupled to the first circuit board 310 in the state where the sealing member 340 is mounted on the second circuit board 320 around the second connector 332, the protruding outer face 347b of the sealing member 340 can be closely coupled to the inner face of the seating opening 315.

Referring to the assembly process of the apparatus 300 provided as described above, the sealing member 340 may be provided such that a circuit board provided with a female connector is coupled in a state of being seated on a circuit board on which a male connector is mounted. For example, the sealing member 340 may be provided such that, when the second circuit board 320 provided with the second connector 332, which is a male connector, faces the first circuit board 310 provided with the first connector 331, which is a female connector, in a state where the sealing member 340 is coupled to the second circuit board 320, so that the first connector 331 and the second connector 332 are coupled to each other, the first connector 331 and the second connector 332 may be blocked from the outside by the sealing member 340.

The coupling structure of the apparatus 300 according to the eighth embodiment of the present disclosure may have the structure of one of the foregoing embodiments. For example, the connector may have the coupling structure as in the first embodiment, the coupling structure as in the third, or the coupling structure as in the fourth embodiment. Accordingly, the descriptions of the foregoing embodiments can be applied to the description of the coupling member of the eighth embodiment.

Hereinafter, a ninth embodiment of the apparatus 300 for electric coupling between circuit boards according to various embodiments of the present disclosure will be described with reference to FIGS. 47 to 51.

Figure 47:
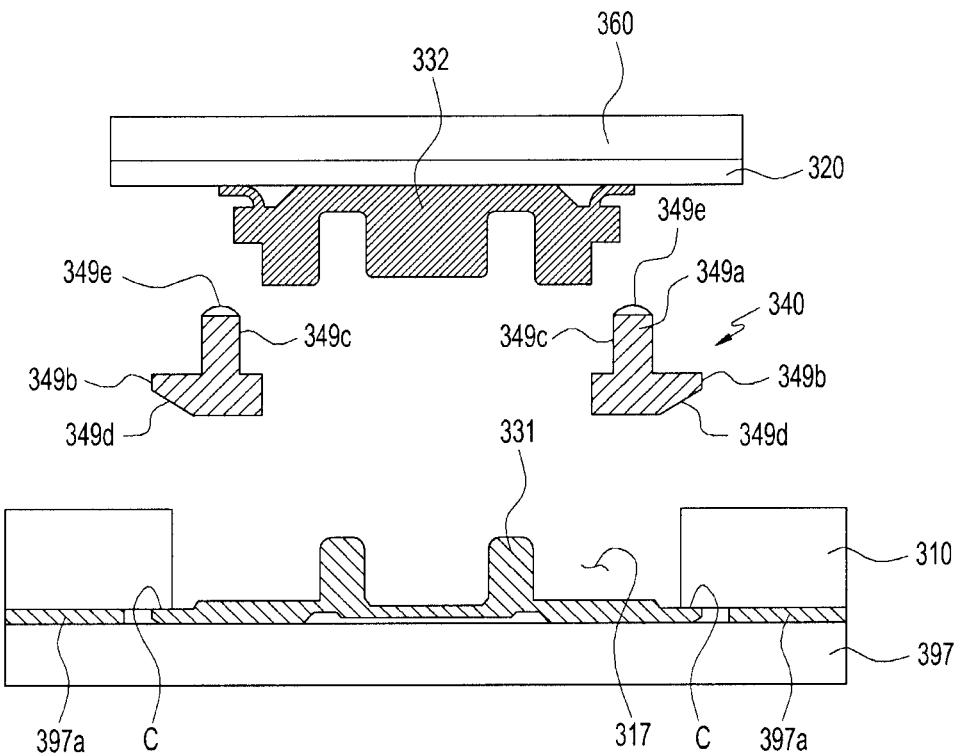
FIG. 47 is a view illustrating an apparatus according to a ninth embodiment in the disassembled state, in the electronic device according to various embodiments of the present disclosure.
Figure 48:
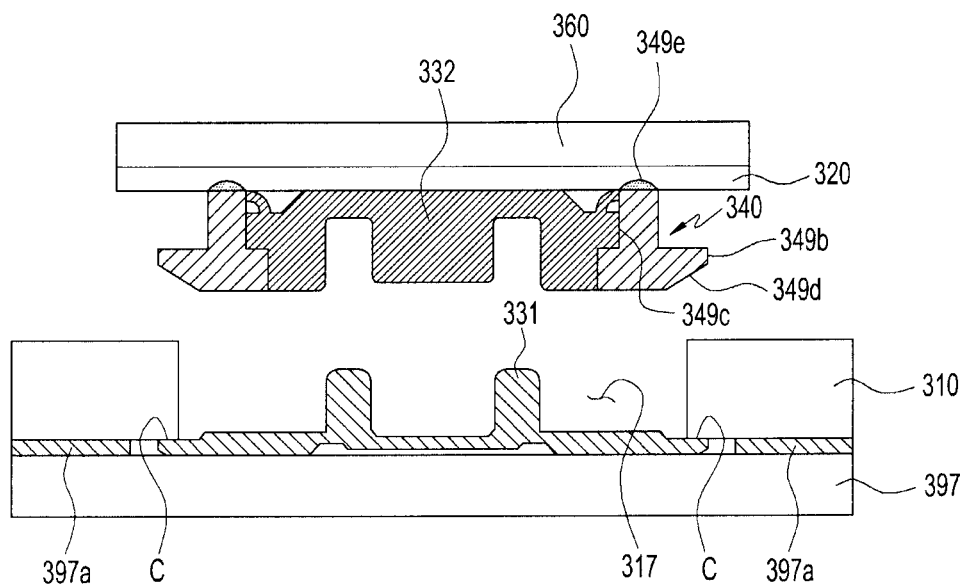
FIG. 48 is a view illustrating a first circuit board and a second circuit board to which a sealing member of the apparatus according to the ninth embodiment is coupled, in the disassembled state, in the electronic device according to various embodiments of the present disclosure.
Figure 49:
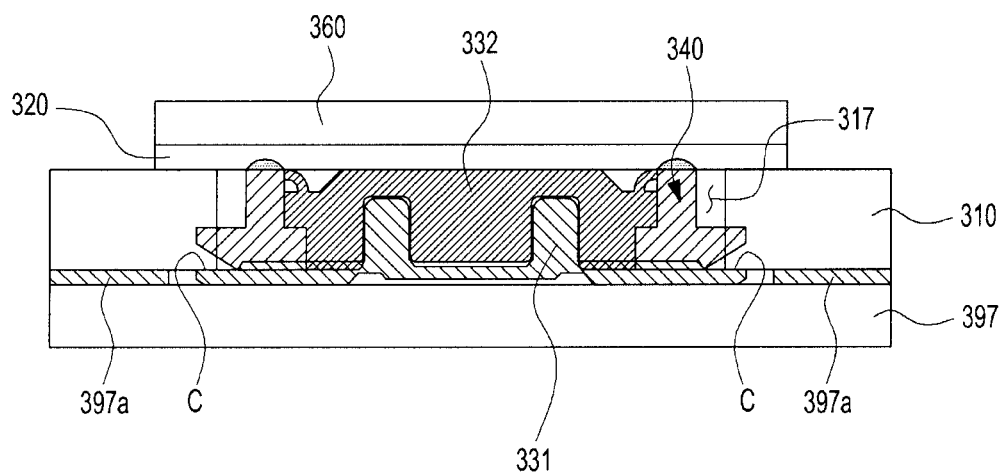
FIG. 49 is a view illustrating the connector according to the ninth embodiment in the assembled state, in the electronic device according to various embodiments of the present disclosure.
Figure 50:
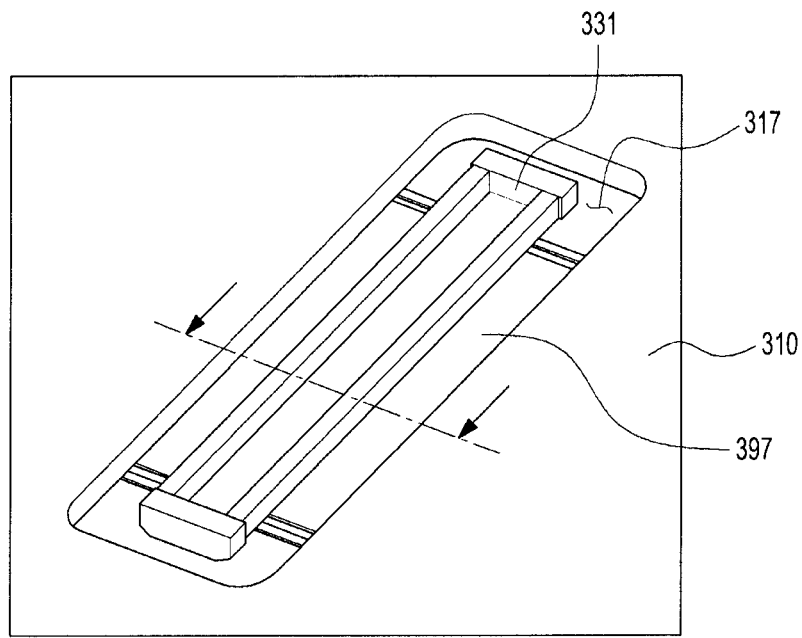
FIG. 50 is a cross-sectional view illustrating a first circuit board of the connector according to the ninth embodiment, in the electronic device according to various embodiments of the present disclosure.
Figure 51:
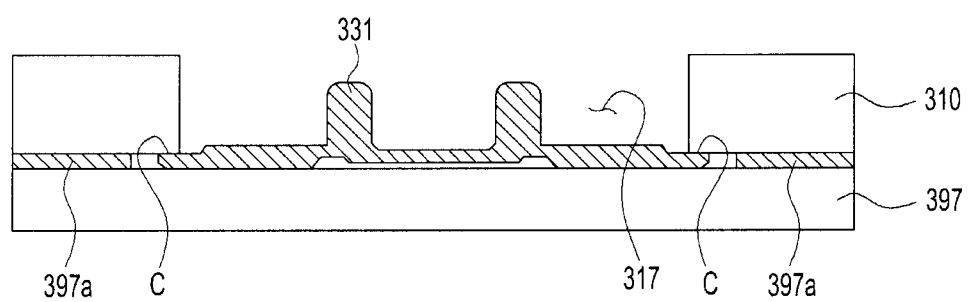
FIG. 51 is a cross-sectional view illustrating the first circuit board of the apparatus according to the ninth embodiment, when viewed in a first direction, in the electronic device according to various embodiments of the present disclosure.

FIG. 47 is a view illustrating the apparatus 300 according to the ninth embodiment in the disassembled state in the electronic device according to various embodiments of the present disclosure. FIG. 48 is a view illustrating the first circuit board 310 and the second circuit board 320 to which a sealing member of the connector 340 of the apparatus 300 according to the ninth embodiment is coupled, in the disassembled state, in the electronic device according to various embodiments of the present disclosure. FIG. 49 is a view illustrating the apparatus 300 according to the ninth embodiment in the assembled state in the electronic device according to various embodiments of the present disclosure. FIG. 50 is a cross-sectional view illustrating the first circuit board 310 of the apparatus 300 according to the ninth embodiment in the electronic device according to various embodiments of the present disclosure. FIG. 51 is a cross-sectional view illustrating the first circuit board 310 of the apparatus 300 according to the ninth embodiment, when viewed in a first direction, in the electronic device according to various embodiments of the present disclosure.

The apparatus 300 of the ninth embodiment of the present disclosure may have a structure similar to those of the foregoing first to eighth embodiments, and may be different from the foregoing embodiments in that at least one of the first circuit board 310 and the second circuit board 320 may be provided with an opening 317 that penetrates the first circuit board 310 or the second circuit board 320 and the first connector 331 or the second connector 332 may be mounted on the opening. In the embodiments of the present disclosure, for example, that the opening 317 is formed in the first circuit board 310, and the second circuit board 320 is made of a hard or flexible board. When the second circuit board 320 is made of a flexible board, a reinforcing member 360 may be further included in order to reinforce and support the second circuit board 320 as in the structures described above. In an embodiment of the present disclosure, descriptions are made with reference to a case where the first circuit board 310 and the second circuit board 320 have the above-described structures, as an example, but the present disclosure is not limited thereto. The opening 317 may be provided in the second circuit board 320 and the first circuit board 310 may be made of a hard or flexible material, or each of the first circuit board 310 and the second circuit board 320 is provided with the opening 317 and the connectors 331, 332 may be mounted in the openings 317, respectively.

Referring to FIGS. 47 to 51, the apparatus 300 of the ninth embodiment of the present disclosure may include the first circuit board 310 including the first connector 331, the second circuit board 320 including the second connector 332, the sealing member 340, and the reinforcing member 360, as described above. At least one of the first circuit board 310 and the second circuit board 320 of the present disclosure may be provided with an opening (hereinafter, referred to as a "through opening 317") in which a support member 397 provided with the first connector 331 or the second connector 332 to be mounted on the first circuit board 310 or the second circuit board 320 can be seated.

As described above, in an embodiment of the present disclosure, for example, the through opening 317 may be provided in the first circuit board 310, and the second circuit board 320 is a flexible member and includes a flexible member 360 provided on the other face of the second circuit board 320 that is provided with the second connector 332.

In the first circuit board 310, the through opening 317 is formed to penetrate one face of the first circuit board 310 and the other face, which is opposite to the one face. A support member 397, on which the first circuit board 310 is mounted, may be seated under the through opening 317.

The support member 397 may be fixed to one face of the first circuit board 310 at the through opening 317 side in order to block the first connector 331 from moving by being pushed while supporting the first connector 331 (if the through opening 317 is formed in the second circuit board 320, the support member 397 may be fixed to the second circuit board 320 in order to block the second connector 332 from moving by being pushed while supporting the second connector 332). That is, when the second connector 332 is coupled to the first connector 331 in the state where the first connector 331 is positioned in the through opening 317, the first connector 331 is pushed in the pressing direction of the second connector 332. However, the support member 397 may support the first connector 331 to suppress the first connector 331 from being pushed in the fastening direction while maintaining the state of the first connector 331 coupled to the first circuit board 310.

The periphery of one face of the first connector 331 is coupled to the rear face of the first circuit board 310 at points C formed with the through opening 317 to be electrically connected. The support member 397 is disposed on the through opening 317 and is provided to support the first connector 331 coupled to the rear face of the first circuit board 310 such that the first connector 331 can be maintained in the state of being coupled to the first circuit board 310. More specifically, the support member 397 is a constituent element that supports the first connector 331 in order to prevent the first connector 331 from being separated from the through opening 317 by being pushed in a coupling direction by a coupling force when the first connector 331 and the second connector 332 are coupled to each other.

The support member 397 may be provided in a plate shape, and may be coupled to one face of the first circuit board 310, more specifically, the opposite face of the first circuit board 310 to the second board 320 (hereinafter, referred to as the "rear face of the first circuit board 310").

That is, in the state where the first connector 331 is coupled to the rear face of the first circuit board 310 around the through opening 317, the support member 397 may be mounted on the rear face of the first circuit board 310. The periphery of one face of the support member 397 is coupled to the rear face of the first circuit board 310 around the through opening 317, and the first connector 331 is supported by the support member 397 in the state of being disposed inside the through opening 317 of the support member 397 so that the first connector 331 can maintain the electric coupling state in relation to the first circuit board 310.

In addition, around the periphery of the support member 397, an adhesive member 397a may be further included to be coupled to the rear face of the first circuit board 310.

The second connector 332 may be provided on one face of the second circuit board 320 to be electrically connected to the first connector 331 of the first circuit board 310. When the second circuit board 320 is formed of a flexible material, the reinforcing member 360 may be provided on one face of the second circuit board 320 (which corresponds to the top face of the second circuit board 320 with reference to FIG. 47).

The first connector 331 according to an embodiment of the present disclosure may be configured as a female connector, and the second connector 332 may be configured as a male connector. In the present embodiment, descriptions are made with reference to a case in which the first connector 331 is a female connector and the second connector 332 is a male connector, but the present disclosure is not limited thereto. Alternatively, the first connector 331 may be configured as a male connector, and the second connector 332 may be configured as a female connector.

According to an embodiment of the present disclosure, the sealing member 340 may have a structure that comes in closed contact with the inner face of the through opening 317 and one face of the second circuit board 320 to seal the first connector 331 and the second connector 332 so as not to be exposed to the outside.

The sealing member 340 may be provided to protrude toward the inner face of the through opening 317 such that the inner face 349c is capable of coming in closed contact with the outer face of the second connector 332 and outer face 349b of the sealing member 340 capable of coming in closed contact with the inner periphery of the through opening 317 so as to provide sealing. The face of the protruding outer face 349b of the sealing member 340, which faces the through opening 317, may form an inclined sealing face 349d.

The inner face 349c of the sealing member 340 may come in closed contact with the outer face of the second connector 332 configured as a male connector, and one face 349e (the top face with reference to FIG. 47) of the sealing member 340 may be coupled to be in closed contact with one face of the second circuit board 320. The sealing member 340 of the present disclosure may be provided such that as the second circuit board 320 is coupled to the first circuit board 310 in the state where the sealing member 340 is mounted on the second circuit board 320 around the second connector 332, the sealing member 340 may be coupled to be in closed contact with the inner face of the through opening 317.

Referring to the assembly process of the apparatus 300 provided as described above, the sealing member 340 may be provided such that a circuit board provided with a female connector is coupled in a state of being seated on a circuit board on which a male connector is mounted. For example, the sealing member 340 may be provided such that, when the second circuit board 320 provided with the second connector 332, which is a male connector, faces the first circuit board 310 provided with the first connector 331, which is a female connector, in a state where the sealing member 340 is coupled to the second circuit board 320, so that the first connector 331 and the second connector 332 are coupled to each other, the first connector 331 and the second connector 332 may be blocked from the outside by the sealing member 340.

The coupling structure of the apparatus 300 according to the ninth embodiment of the present disclosure may have the structure of one of the foregoing embodiments. For example, the connector may have the coupling structure as in the first embodiment, the coupling structure as in the third, or the coupling structure as in the fourth embodiment. Thus, the specific descriptions of the foregoing embodiments can be applied to the description of the coupling member of the ninth embodiment.

Hereinafter, a tenth embodiment of the apparatus 300 for electric coupling between circuit boards according to various embodiments of the present disclosure will be described with reference to FIGS. 52 and 53.

The apparatus 300 according to the eighth embodiment of the present disclosure may have a structure that is similar to those of the foregoing first to eighth embodiments. Accordingly, the descriptions of the foregoing first to ninth embodiments can be applied to a structure, a shape, and a coupling relationship in the tenth embodiment, which are the same as those of the foregoing first to ninth embodiments.

Figure 52:
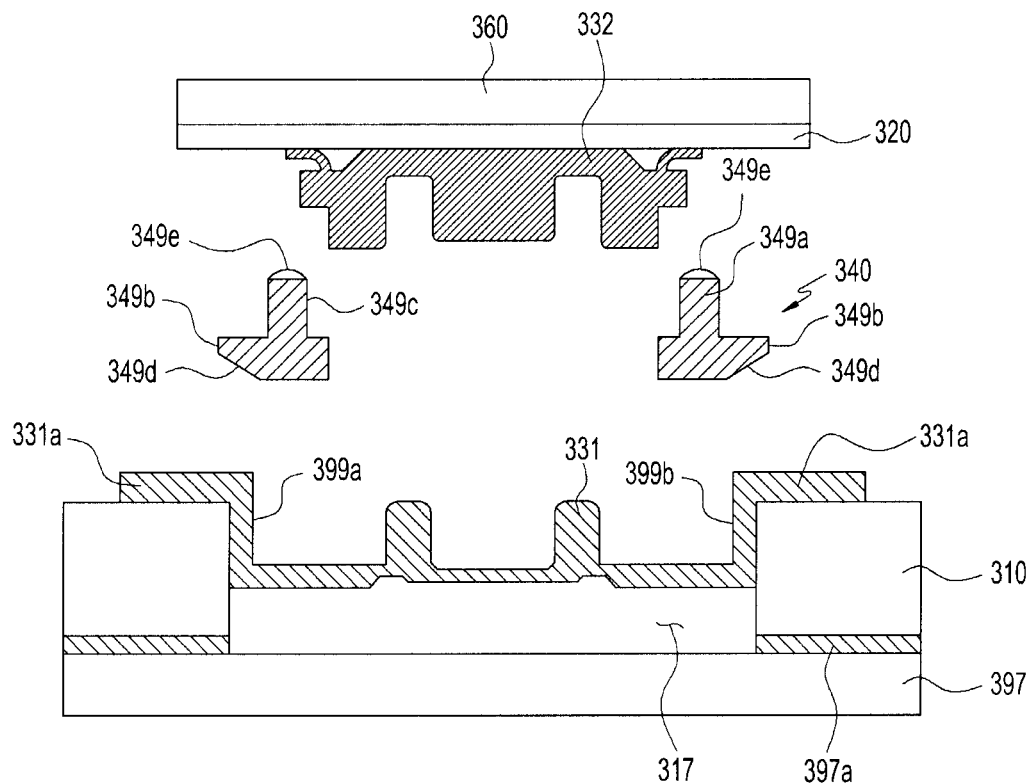
FIG. 52 is a view illustrating an apparatus according to a tenth embodiment in the disassembled state, in the electronic device according to various embodiments of the present disclosure.

FIG. 52 is a view illustrating the apparatus 300 according to the tenth embodiment in the disassembled state in the electronic device according to various embodiments of the present disclosure. FIG. 53 is a view illustrating the apparatus 300 according to the tenth embodiment in the assembled state in the electronic device according to various embodiments of the present disclosure.

Figure 53:
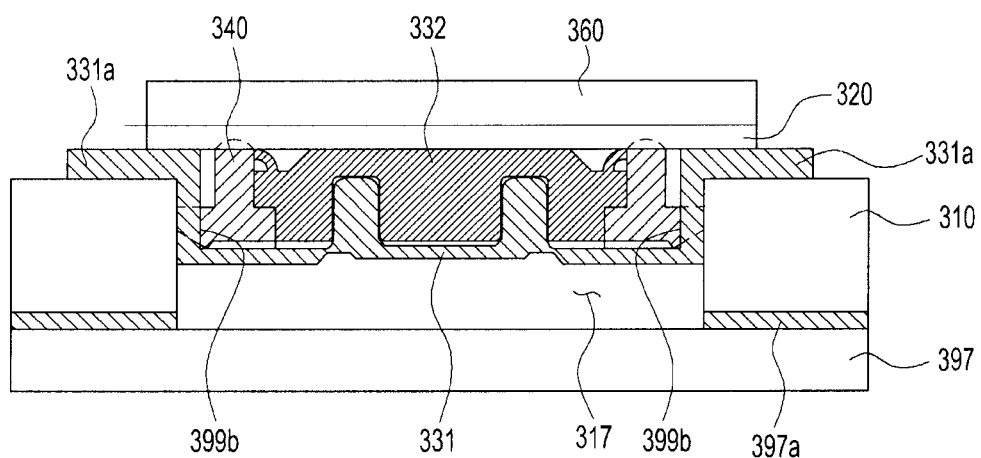
FIG. 53 is a view illustrating the apparatus according to the tenth embodiment in the assembled state, in the electronic device according to various embodiments of the present disclosure.

Referring to FIGS. 52 and 53, the embodiment of the present disclosure may have a structure in which the opening 317 (hereinafter, referred to as a "through opening") may also be provided on at least one of the first circuit board 310 and the second circuit board 320, and the first connector 331 or the second connector 332 may be mounted on the through opening 317. In the embodiments of the present disclosure, it may be described, as an example, that the through opening 317 is formed in the first circuit board 310, and the second circuit board 320 is made of a hard or flexible board. When the second circuit board 320 is made of a flexible board, a reinforcing member 360 may be further included in order to reinforce and support the second circuit board 320 as in the structures described above. In an embodiment of the present disclosure, descriptions are made with reference to a case where the first circuit board 310 and the second circuit board 320 have the above-described structures, as an example, but the present disclosure is not limited thereto. The through opening 317 may be provided in the second circuit board 320 and the first circuit board 310 may be made of a hard or flexible material, or each of the first circuit board 310 and the second circuit board 320 is provided with the through opening 317 and the connectors may be mounted in the through openings 317, respectively.

The apparatus 300 of the tenth embodiment of the present disclosure may include the first circuit board 310 including the first connector 331, the second circuit board 320 including the second connector 332, the sealing member 340, and the reinforcing member 360, as described above. In certain embodiments, the apparatus 300 can also include a coupling member, such as coupling member 350 described above. According to an embodiment of the present disclosure, at least one of the first circuit board 310 and the second circuit board 320 may be provided with the through opening 317, and at least one of the first circuit board 310 and the second circuit board 320, which is provided with the through opening 317, may be mounted with a support member 397 that supports the first connector 331 or the second connector 332 mounted at the through opening 317 side and suppresses the first connector 331 or the second connector 332 from being pushed to the rear side of the through opening 317.

As described above, in an embodiment of the present disclosure, for example, the through opening 317 may be provided in the first circuit board 310, and the second circuit board 320 is a flexible member and includes a flexible member 360 provided on the other face of the second circuit board 320 that is provided with the second connector 332.

In the first circuit board 310, the through opening 317 is formed to penetrate one face of the first circuit board 310 and the other face, which is opposite to the one face, and a support member 397 may be seated in the through opening 317.

Descriptions have been made with reference to a case where the first connector 331 is formed in a plate shape, and the peripheral portion of one face of the first connector 331 is coupled to the rear face of the first circuit board 310 around the through opening 317, as an example. Alternatively, the first connector 331 of the present disclosure may be configured such that engagement portions 331a engaged with the periphery of the through opening 317 are provided at the opposite ends of the first connector 331, respectively, and the first connector 331 is formed in a "U" shape bent at the engagement portions 331a such that the first connector 331 is disposed inside the through opening 317.

That is, according to an embodiment, the first connector 331 includes engagement portions 331a therearound, which are engaged with one face of the first circuit board 310 (more specifically, the face of the first circuit board 310 facing the second circuit board 320), and the first connector 331 is bent at the engagement portions 331a such that the first connector 331 can be positioned inside the through opening 317. The engagement portions 331a may be provided such that the first connector 331 is electrically coupled to the first circuit board 310 as the engagement portion 331a is coupled to the one face of the first circuit board 310. The support member 397 may be provided such that the support member 397 is coupled to the rear face of the first circuit board 310, which is provided with the through opening 317, to support the first circuit board 310 positioned in the through opening 317. More specifically, the support member 397 is a constituent element that blocks the first connector 331 in order to prevent the first connector 331 from being separated from the through opening 317 by being pushed in a coupling direction by a coupling force when the first connector 331 and the second connector 332 are coupled to each other.

The support member 397 may be provided in a plate shape, and may be coupled to one face of the first circuit board 310, more specifically, the opposite face of the first circuit board 310 to the second circuit board 320 (hereinafter, referred to as the "rear face of the first circuit board 310").

When the engagement portions 331a of the first connector 331 are coupled to one face of the first circuit board 310 to be electrically connected, the connector 331 may be positioned inside the through opening 317. The support member 397 may be mounted to cover the through opening 317 on the rear face of the first circuit board 310, and an adhesive member 397a may be further included to be coupled to the rear face of the first circuit board 310 around the periphery of the support member 397.

One face of the second circuit board 320 may be provided with the second connector 332 to be connected to the first connector 331 of the first circuit board 310 to be electrically connected, and when the second circuit board 320 is formed of a flexible material, a reinforcing member 360 may be provided on one face of the second circuit board 320 (corresponding to the top face of the second circuit board 320 with reference to FIG. 52).

The first connector 331 according to an embodiment of the present disclosure may be configured as a female connector, and the second connector 332 may be configured as a male connector. In the present embodiment, descriptions are made with reference to a case in which the first connector 331 is a female connector and the second connector 332 is a male connector, but the present disclosure is not limited thereto. Alternatively, the first connector 331 may be configured as a male connector, and the second connector 332 may be configured as a female connector.

According to an embodiment of the present disclosure, the sealing member 340 may have a structure that comes in closed contact with the inner face of a stepped portion 399b seated on the inner face of the through opening 317 and one face of the second circuit board 320 to seal the first connector 331 and the second connector 332 so as not to be exposed to the outside.

For example, the inner face 349c of the sealing member 340 may be coupled to be in closed contact with the outer face of the second connector 332 configured as a male connector, and one face 349e of the sealing member 340 may be in closed contact with one face of the second circuit board 320 around the second connector 332. The outer face 349b of the sealing member 340 may be provided to protrude toward the inner face of the stepped portion 399b such that the outer face 349b come in closed contact with the inner peripheral face of the stepped portion 399b recessed in the through opening 317 so as to provide sealing. The face of the protruding outer face 349b of the sealing member 340, which is engaged with and comes in closed contact with the inner face of the stepped portion 399b, may form an inclined sealing face 349d.

The sealing member 340 of the present disclosure may be provided such that as the sealing member is introduced into the stepped portion 399b side where the first connector 331 is mounted in the state where the sealing member 340 is mounted on the second circuit board 320 around the second connector 332, the sealing member 340 may be coupled to be in closed contact with the inner face of the through opening 317.

Although not illustrated, the sealing member 340 may be provided to seal a gap between the first circuit board 310 and the second circuit board 320 around the periphery of the through opening 317 so as to seal the periphery of the connector.

Referring to the assembly process of the apparatus 300 provided as described above, the sealing member 340 may be provided such that a circuit board provided with a female connector is coupled in a state of being seated on a circuit board on which a male connector is mounted. For example, the sealing member 340 may be provided such that, when the second circuit board 320 provided with the second connector 332, which is a male connector, faces the first circuit board 310 provided with the first connector 331, which is a female connector, in a state where the sealing member 340 is coupled to the second circuit board 320, so that the first connector 331 and the second connector 332 are coupled to each other, the first connector 331 and the second connector 332 may be blocked from the outside by the sealing member 340.

The coupling structure of the apparatus 300 according to the ninth embodiment of the present disclosure may have the structure of one of the foregoing embodiments. For example, the connector may have the coupling structure as in the first embodiment, the coupling structure as in the third, or the coupling structure as in the fourth embodiment. Accordingly, the foregoing descriptions can be applied to the coupling structure.

Hereinafter, an eleventh embodiment of the apparatus 300 for electric coupling between circuit boards according to various embodiments of the present disclosure will be described with reference to FIGS. 54 to 57.

The apparatus 300 according to the eleventh embodiment of the present disclosure may have a structure that is similar to those of the foregoing first to tenth embodiments. In particular, the apparatus 300 according to the tenth embodiment may have a structure that is similar to that of the foregoing fifth or sixth embodiment. However, the eleventh embodiment of the present disclosure may be different from the foregoing embodiments in terms of the shape of the sealing member 340 and a structure, a sealing shape, or the like in connection with the shape of the sealing member 340. Accordingly, the descriptions of the foregoing first to tenth embodiments can be applied to a structure, a configuration, and the like in the eleventh embodiment, which are the same as those of the foregoing first to tenth embodiments.

Figure 54:
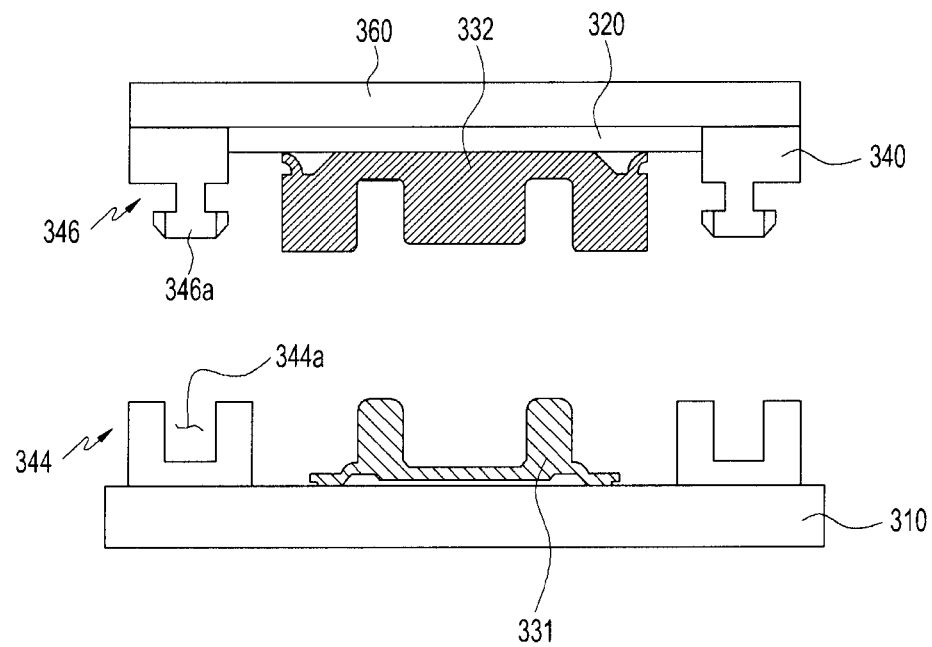
FIG. 54 is a view illustrating an apparatus according to an eleventh embodiment in the disassembled state, in the electronic device according to various embodiments of the present disclosure.
Figure 55:
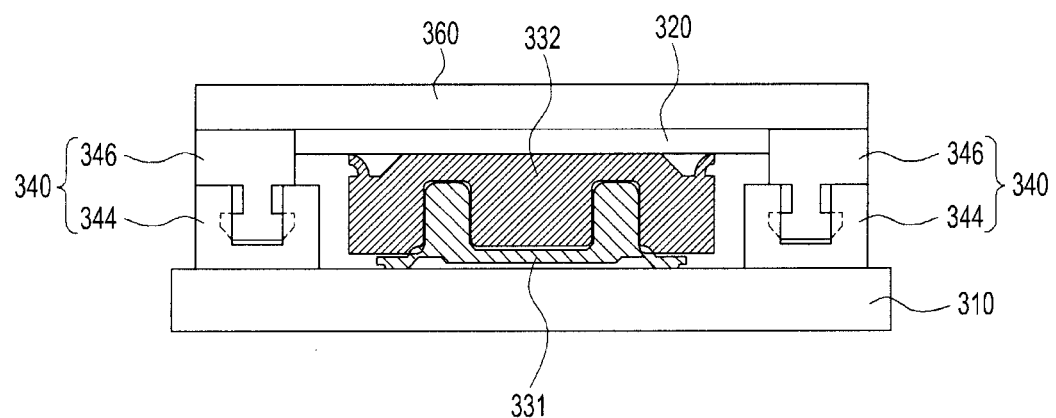
FIG. 55 is a view illustrating the apparatus according to the eleventh embodiment in the assembled state, in the electronic device according to various embodiments of the present disclosure.
Figure 56:
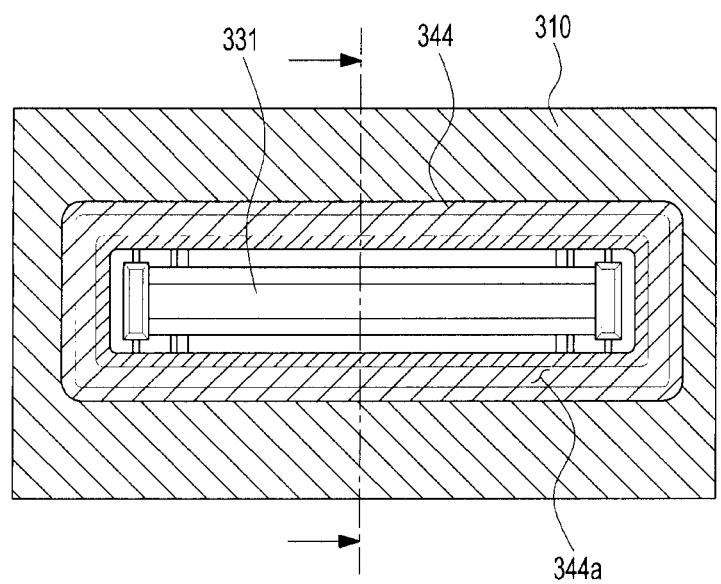
FIG. 56 is a plan view illustrating a first circuit board according to the eleventh embodiment, in the electronic device according to various embodiments of the present disclosure.
Figure 57:
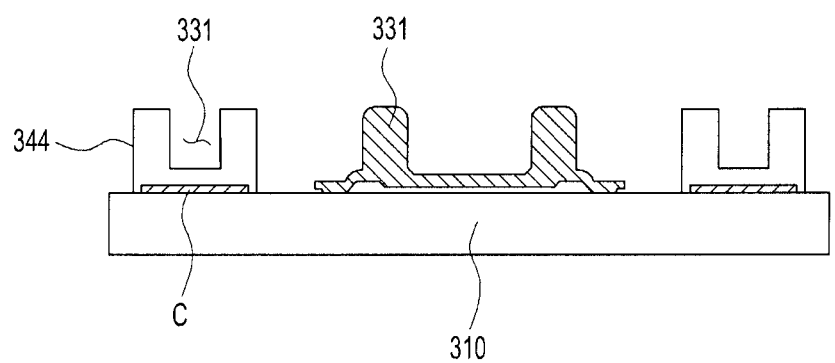
FIG. 57 is a cross-sectional view illustrating the first circuit board according to the eleventh embodiment, when viewed in a first direction, in the electronic device according to various embodiments of the present disclosure.

FIG. 54 is a view illustrating the apparatus 300 according to the eleventh embodiment in the disassembled state in the electronic device according to various embodiments of the present disclosure. FIG. 55 is a view illustrating the apparatus 300 according to the eleventh embodiment in the assembled state in the electronic device according to various embodiments of the present disclosure. FIG. 56 is a plan view illustrating a first circuit board 310 according to the eleventh embodiment in the electronic device according to various embodiments of the present disclosure. FIG. 57 is a cross-sectional view illustrating the first circuit board 310 according to the eleventh embodiment, when viewed in a first direction, in the electronic device according to various embodiments of the present disclosure.

Referring to FIGS. 54 to 57, the apparatus 300 of the eleventh embodiment of the present disclosure may include the first circuit board 310 including the first connector 331, the second circuit board 320 including the second connector 332, the sealing member 340, and the reinforcing member 360, as described above. In certain embodiments, the apparatus can also include coupling member (not shown), such coupling member 350 shown above.

The first connector 331 may be provided on one face of the first circuit board 310, and one face of the second circuit board 320 may be provided with the second connector 332 to be electrically connected to the first connector 331. When the second circuit board 320 is formed of a flexible material, a reinforcing member 360 may be provided on one face of the second circuit board 320 (corresponding to the top face of the second circuit board 320 with reference to FIG. 54).

The first connector 331 according to an embodiment of the present disclosure may be configured as a female connector, and the second connector 332 may be configured as a male connector. In the present embodiment, descriptions are made with reference to a case in which the first connector 331 is a female connector and the second connector 332 is a male connector, but the present disclosure is not limited thereto. On the contrary, the first connector 331 may be configured as a male connector, and the second connector 332 may be configured as a female connector.

According to an embodiment of the present disclosure, the sealing member 340 may include a first member 344 and a second member 346.

The first member 344 may be provided on the first circuit board 310 to be spaced apart from the first connector 331 by a predetermined interval around the first connector 331. The first member 344 may be provided to be engaged with and coupled to the second member 346 to be described later, and the first member may be provided in a shape protruding toward the second circuit board 320 side from the first circuit board 310. In addition, the end of the portion of the first member 344, which protrudes to the second circuit board 320 side may be provided in a shape that can be coupled to be in closed contact with one face of the second member 346 to be described later, for example, in a shape of a protruding portion or a recessed portion. The second member 346 may be provided on the second circuit board 320 to be spaced apart from the second connector 332 by a predetermined interval around the second connector 332. The second member 346 may be provided in a shape protruding toward the first circuit board 310 side from the second circuit board 320, and the end of the portion of the second member 346, which protrudes toward the first circuit board 310 side, may be provided in a shape that is capable of being coupled to be closed contact with the end of the first member 344. For example, when a protrusion 344a is provided on the end of the first member 344, a protrusion 344a and a pair of recessed portions 346a may be provided on the end of the second member 346. When a recessed portion is provided on the end of the first member 344, a recessed portion and a pair of protrusions may be provided on the end of the second member 346.

It may be described, as an example, that a recessed portion 344a according to an embodiment of the present disclosure, which is inwardly recessed by a predetermined depth, may be provided on the end of the first member 344, and a protrusion 346a may be provided on the end of the second member 346 to be engaged in and coupled to be in closed contact with the inside of the recessed portion 344a, as an example. As the first member 344 provided on the first circuit board 310 and the second member 346 provided on the second circuit board 320 are coupled to each other, the periphery of the first connector 331 and the second connector 332 may be blocked from the outside.

It may be described, as an example, that the first connector 331 is configured as a female connector, and the second connector 332 is configured as a male connector to be engaged with the first connector 331 configured as the female connector.

According to an embodiment of the present disclosure, the first connector 331 and the first member 344 having the recessed portion 344a around the first connector 331 may be provided on one face of the first circuit board 310 (the face corresponding to the second circuit board 320). In addition, the second connector 332 configured as a male connector and the second member 346 having the protrusion 346a around the second connector 332 may be provided on one face of the second circuit board 320 (the face corresponding to the first circuit board 310).

When the one face of the first circuit board 310 and the one face of the second circuit board 320 are engaged to face each other in the above-described state, the first connector 331 may be engaged with and connected to the second connector 332 and the protrusion of the second member 346 may be coupled to be in contact with the first member 344 by being inserted into the recessed portion of the first member 344. As the first member 344 and the second member 346 are coupled to be in closed contact with each other, the first connector 331 and the second connector 332, which are connected to each other, may be blocked from the outside by the sealing member 340.

The structure of the sealing member 340 according an embodiment of the present disclosure may also be applied to the structures of the connectors 300 of the foregoing first to tenth embodiments.

In addition, the coupling structure of the apparatus 300 according to the eleventh embodiment of the present disclosure may have the structure of one of the foregoing embodiments. For example, the connector may have the coupling structure as in the first embodiment, the coupling structure as in the third embodiment, or the coupling structure as in the fourth embodiment. Accordingly, the descriptions of the foregoing embodiments can be applied to the description of the coupling member of the eighth embodiment.

Figure 58:
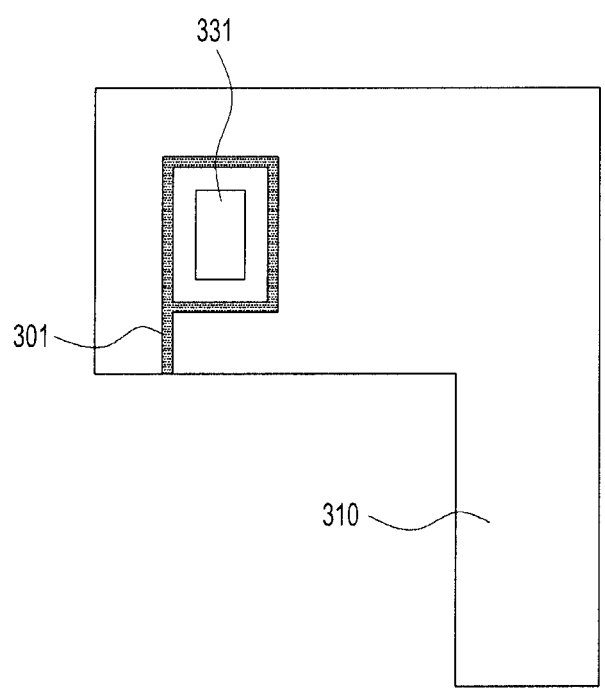
FIG. 58 is a view illustrating a foreign matter guide that is provided to a peripheral portion of an apparatus, in the electronic device according to various embodiments of the present disclosure.

FIG. 58 is a view illustrating an aspect in which a water inflow prevention guide 301 is provided in a peripheral portion of the apparatus 300 in the electronic device according to various embodiments of the present disclosure.

Referring to FIG. 58, on at least one of the periphery of the first circuit board 310 on which the first connector 331 is mounted and the periphery of the second circuit board 320 on which the second connector is mounted, a water inflow prevention guide 301 may be further formed on the surface of the first circuit board 310 or the second circuit board 320 to be connected to a peripheral end of the first circuit board 310 or the second circuit board 320 so as to accumulate water or to guide the movement of the water to be discharged to the outside of the circuit board.

It may be described, as an example, that the water inflow prevention guide 301 according to an embodiment of the present disclosure may be provided on the surface of the first circuit board 310. That is, the water inflow prevention guide 301 may have a closed loop shape on the surface of the first circuit board 310 along the periphery of the first connector 331, and the closed loop shape may be formed by a groove having a predetermined depth from the surface of the first circuit board 310. One end of the water inflow prevention guide 301 is connected to the end of the peripheral end of the first circuit board 310 such that, when water is introduced into the apparatus 300 side from the outside of the connector 330, the water may be accumulated in the water inflow prevention guide 301 or may be introduced into the water inflow prevention guide 301 to be moved to the end of the water inflow prevention guide 301 and further to the peripheral end of the first circuit board 310, thereby being primarily discharged from the first circuit board 310.

It may be described, as an example, that the water inflow prevention guide 301 according to an embodiment of the present disclosure may be provided on the surface of the first circuit board 310. That is, the water inflow prevention guide 301 may have a closed loop shape on the surface of the first circuit board 310 along the periphery of the first apparatus 300, and the closed loop shape may be formed by a hydrophilic coating layer or a water repellent coating layer on the surface of the first circuit board 310. One end of the water inflow prevention guide 301 may be connected to the peripheral end of the first circuit board 310.

In the case where the water inflow prevention guide 301 is provided by the hydrophilic coating, when water is introduced into the apparatus 300 side from the outside of the connector 330, the water introduced from the outside may first be accumulated in the water inflow prevention guide 301 to be moved to the end of the water inflow prevention guide 301 and further to the peripheral end of the first circuit board 310, thereby being primarily discharged from the first circuit board 310.

In the case where the water inflow prevention guide 301 is provided by the water repellent coating, when water is introduced into the apparatus 300 side from the outside of the connector 330, the water introduced from the outside may be moved to the end of the water inflow prevention guide 301 without being introduced into the inside of the water inflow prevention guide 301 having the closed-loop shape and may be further moved to the peripheral end of the first circuit board 310, thereby being primarily discharged from the first circuit board 310. In addition, the structure of the water inflow prevention guide 301 may be additionally provided to all the connectors of the foregoing first to eleventh embodiments.

While the present disclosure has been shown and described with reference to certain embodiments thereof, it will be understood by those skilled in the art that various changes in form and details may be made therein without departing from the spirit and scope of the present disclosure as defined by the appended claims.

What is claimed is:
1. An apparatus comprising:
a first circuit board;
a first connector provided on one face of the first circuit board;
a second circuit board disposed on the one face of the first circuit board, and electrically connected to the first circuit board;
a second connector provided on one face of the second circuit board, and engaged with the first connector to electrically connect the second circuit board to the first circuit board;
a sealing member disposed between the first circuit board and the second circuit board to seal a space between the first connector and the second connector; and
a coupling member coupling the first circuit board and the second circuit board to each other,
wherein at least one of the first circuit board and the second circuit board is a flexible board, and
wherein the first circuit board or the second circuit board, which is the flexible board, further includes a reinforcing member provided on the other face of the second circuit board to support the flexible board, wherein the reinforcing member is disposed opposite to the second connector with the second circuit board therebetween, and wherein the coupling member comprises: at least one coupling protrusion provided on the first circuit board to protrude from one face to be spaced apart from the first connector by a predetermined interval; a coupling hole provided in the second circuit board, and penetrating the second circuit board to be connected to the at least one coupling protrusion; and a fastening member couple to the at least one coupling protrusion through the coupling hole.

2. The apparatus of claim 1, wherein the second connector is connected to the first connector while enclosing an outside portion of the first connector, and the sealing member is disposed around a periphery of the second connector.

3. The apparatus of claim 1, wherein the first connector is connected to the second connector while enclosing an outside portion of the second connector, and the sealing member is disposed around a periphery of the first connector.

4. The apparatus of claim 1, wherein the sealing member includes protruding portions protruding toward the first circuit board and the second circuit board, to be coupled in closed contact with the first circuit board and the second circuit board.

5. The apparatus of claim 1, wherein at least one of the first circuit board and the second circuit board includes a first connector body, and a remaining one of the first circuit board and the second circuit board includes a second connector body such that the first connector body is seated on the second connector body or the second connector body is seated on the first connector body.

6. The apparatus of claim 5, wherein the first connector body includes the first connector and a coupling opening of the coupling member adjacent to the first connector, and the second connector body includes the second connector and a coupling hole of the coupling member adjacent to the second connector.

7. The apparatus of claim 5, wherein the sealing member is disposed along a periphery of one of an outer peripheral face of the first connector body and an outer peripheral face of the second connector body.

8. The apparatus of claim 6, wherein the coupling opening and another coupling opening are disposed in the first connector body at each of opposite sides of the first connector, and the coupling hole and another coupling hole are disposed in the second connector body at each of opposite sides of the second connector.

9. The apparatus of claim 6, wherein the first connector and a third connector are disposed on the first connector body at each of opposite sides of the coupling opening, and the second connector and a fourth connector are disposed on the second connector body at each of opposite sides of the coupling hole.

10. The apparatus of claim 1, wherein at least one of the first circuit board and the second circuit board includes a fixing member to fix the sealing member.

11. The apparatus of claim 10, wherein the sealing member is between the fixing member and a remaining one of the first circuit board and the second circuit board.

12. The apparatus of claim 10, wherein the fixing member is provided in a closed loop shape along a periphery of the first connector of the first circuit board and the second connector of the second circuit board, and the sealing member is provided to be coupled to an upper peripheral face of the fixing member, and to protrude toward one of the first circuit board and the second circuit board.

13. The apparatus of claim 10, wherein the fixing member is provided in a closed loop shape along a periphery of the first connector of the first circuit board and the second connector of the second circuit board, and the sealing member is provided to be coupled to an inner peripheral face of the fixing member, and to protrude toward the first connector or the second connector.

14. The apparatus of claim 13, wherein the sealing member includes an inclined sealing face formed in a protruding portion.

15. The apparatus of claim 13, further comprising:

a pressing protrusion formed on an end of the sealing member to be pressed by the first circuit board or the second circuit board.

16. An apparatus comprising:

a first circuit board;

a first connector provided on one face of the first circuit board;

a second circuit board disposed on the one face of the first circuit board, and electrically connected to the first circuit board;

a second connector provided on one face of the second circuit board, and engaged with the first connector to electrically connect the second circuit board to the first circuit board;

a sealing member disposed between the first circuit board and the second circuit board to seal a space between the first connector and the second connector; and a coupling member coupling the first circuit board and the second circuit board to each other, wherein at least one of the first circuit board and the second circuit board is a flexible board, wherein the first circuit board or the second circuit board, which is the flexible board, further includes a reinforcing member provided on the other face of the second circuit board to support the flexible board, wherein the reinforcing member is disposed opposite to the second connector with the second circuit board therebetween, and wherein one of the first circuit board and the second circuit board includes a fixing member protruding in a closed loop shape around the first connector or the second connector, the sealing member is coupled to a remaining one of the first circuit board and the second circuit board around the first connector or the second connector, and the sealing member seals a gap between the one of the first circuit board and the second circuit board and the fixing member.

17. The apparatus of claim 16, wherein the sealing member includes an inclined sealing face to come in contact with the fixing member.

18. An apparatus comprising:

a first circuit board;

a first connector provided on one face of the first circuit board;

a second circuit board disposed on the one face of the first circuit board, and electrically connected to the first circuit board;

a second connector provided on one face of the second circuit board, and engaged with the first connector to electrically connect the second circuit board to the first circuit board;

a sealing member disposed between the first circuit board and the second circuit board to seal a space between the first connector and the second connector; and a coupling member coupling the first circuit board and the second circuit board to each other, wherein at least one of the first circuit board and the second circuit board, which is the flexible board, further includes a reinforcing member provided on the other face of the second circuit board to support the flexible board, wherein the reinforcing member is disposed opposite to the second connector with the second circuit board therebetween, and wherein at least one of the first circuit board and the second circuit board includes a opening inwardly recessed from a surface of the at least one of the first circuit board and the second circuit board, and at least one of the first connector and the second connector is mounted in the opening.

19. The apparatus of claim 18, wherein the sealing member is disposed between the opening and the first circuit board or the second circuit board, and at least one face of the sealing member makes closed contact with the first circuit board or the second circuit board, and at least another face of the sealing member is provided to make closed contact with the opening.

20. The apparatus of claim 18, wherein at least one of the first circuit board and the second circuit board includes the opening that penetrates the first circuit board or the second circuit board, at least one of the first connector and the second connector is positioned in the opening to be coupled to the first circuit board or the second circuit board, and a support member is coupled to the opening to support the at least one of the first connector and the second connector positioned in the opening while blocking movement of the at least one of the first connector or the second connector.

21. The apparatus of claim 20, wherein the at least one of the first connector or the second connector seated inside the opening is mounted on one face of the support member, and a periphery of one face of the support member is coupled to a rear face of the first circuit board or a rear face of the second circuit board.

22. The apparatus of claim 20, wherein the first connector or the second connector includes an engagement portion at a periphery of the first connector or the second connector to be engaged with the first circuit board or the second circuit board and to be electrically coupled to the first circuit board or the second circuit board.

23. The apparatus of claim 18, wherein the sealing member includes:

a first member provided on the first circuit board around the first connector; and a second member coupled to be in closed contact with the first member, and provided on the second circuit board around the second connector.

24. The apparatus of claim 23, wherein one of the first member and the second member includes a protruding portion, and a remaining one of the first member and the second member includes a recessed portion, the protruding portion being in closed contact with the recessed portion.

25. The apparatus of claim 18, further comprising:

a water inflow prevention guide formed in one of a periphery of the first circuit board on which the first connector is mounted and a periphery of the second circuit board on which the second connector is mounted, and being connected to a peripheral end of the first circuit board or the second circuit board from a surface of the first circuit board or the second circuit board so as to accumulate water or guide movement of the water.

* * * * *